United States Patent [19]

Phillips et al.

[11] Patent Number: 4,894,709
[45] Date of Patent: Jan. 16, 1990

[54] FORCED-CONVECTION, LIQUID-COOLED, MICROCHANNEL HEAT SINKS

[75] Inventors: Richard J. Phillips, Billerica; Leon R. Glicksman, Lynnfield; Ralph Larson, Bolton, all of Mass.

[73] Assignee: Massachusetts Institute of Technology, Cambridge, Mass.

[21] Appl. No.: 166,512

[22] Filed: Mar. 9, 1988

[51] Int. Cl.$^4$ .............................................. H01L 25/04
[52] U.S. Cl. ........................................ 357/82; 357/55; 357/81
[58] Field of Search ............................ 357/82, 55, 81

[56] References Cited

U.S. PATENT DOCUMENTS

| | | | |
|---|---|---|---|
| 4,312,012 | 1/1982 | Frieser et al. | 357/82 |
| 4,450,472 | 5/1984 | Tuckerman et al. | 357/82 |
| 4,516,632 | 5/1985 | Swift et al. | 165/167 |
| 4,567,505 | 1/1986 | Pease et al. | 357/81 |
| 4,573,067 | 2/1986 | Tuckerman et al. | 357/82 |

FOREIGN PATENT DOCUMENTS 61-104646  5/1986  Japan .............................. 357/82 X

OTHER PUBLICATIONS

Fields, "Grooved Substrate Boosts IC Cooling", *Electronics Review*, vol. 55, No. 17, Aug. 25, 1982, pp. 46–47.
Tuckerman et al, "IEEE Electron Device Letters", vol. EDL-2, No. 5, May 1981, pp. 126–129.
Adams et al, "Unique Liquid Solid-State Power Device Development", Conference: Industry Applications Society III-IAS Annual Meeting, Cleveland, Ohio, U.S.A. (30 Sep.–4 Oct. 1974), IAS79:36A, pp. 1071–1078.
Golden, "Liquid Cooling of Power Thyristors," IEEE Transactions on Industry Applications, vol. 1A-8, No. 5, (Sep./Oct. 1972), pp. 601–606.
Tuckerman et al, "Micro-Capillary Thermal Interface Technology for VLSI Packaging," Symposium on VLSI Technology, Digest of Technical Papers, 1983, pp. 60–61.
Tuckerman et al., "Ultra High Thermal Conductance Micro-Structures for Cooling Integrated Circuits," 32nd *Electronics Components Conference, Proc.*, IEEE, May 1982, pp. 145–149.
Tuckerman et al., "Optimized Convective Cooling Using Micromachined Structures," *Electro-Chemical Society Extended Abstract No.* 125:82, May 7–14, 1982, pp. 197–198.

*Primary Examiner*—William A. Mintel
*Attorney, Agent, or Firm*—Fish & Richardson

[57] ABSTRACT

A microchannel heat sink used to cool a high power electronic device such as an integrated circuit comprising a plurality of channels in close thermal contact to the integrated circuit and through which a liquid is passed to create either a developing laminar flow or a turbulent flow. The turbulent flow may be either developing or fully developed. The heat sink features a compensation heater surrounding the integrated circuit and heated at the same rate as the integrated circuit to thereby provide a more uniform temperature at the perimeter of the integrated circuit.

10 Claims, 8 Drawing Sheets

FORCED-CONVECTION, LIQUID-COOLED, MICROCHANNEL HEAT SINKS

The Government has rights in this invention pursuant to Grant Number AF19628-85-C-0002 awarded by the Air Force.

BACKGROUND OF THE INVENTION

This invention relates to an improved method and apparatus for cooling high power microcircuits.

Since the invention of the silicon integrated circuit, there has been in excess of a five orders of magnitude increase in circuit integration (the total number of components on a chip). Part of this increase can be traced to growth in chip size, where the characteristic dimensions have gone from about 1 mm in 1965 to about 4 mm to 8 mm in 1985. The remainder of the increase in circuit integration can be primarily traced to the reduction in the intgrated circuit feature size, which is today generally less than 1.0 $\mu$m and rapidly approaching the size of 0.1 $\mu$m. In fact, silicon MOSFETs have been made with features as small as 0.025 $\mu$m, which is on the order of one hundred atoms across.

The increase in circuit integration continues to be driven by the need for increased processing speed. Processing speed is dependent upon the signal delay times which are directly proportional to the physical length of interconnections between circuit components. A measure of the processing speed is how many millions of instructions per second (MIPS) can be executed. The number of MIPS and the total power dissipation of a chip are both directly proportional to the packaging density. At the component level, the chip power dissipation has been rapidly increasing due to the tremendous increase in the MIPS/chip.

The increase in the chip power dissipation has greatly complicated thermal management of microelectronics. Chips usually must operate at temperatures lower than 120° C. Such a low temperature is dictated by stringent reliability constraints. The failure rate of microelectronic circuitry decreases exponentially with decreasing component temperature. In fact, a commonly used rule of thumb for microelectronic reliability is that a 20° C. decrease in component temperature will typically result in a 50-percent reduction in the failure rate.. Continued pressure to enhance reliability will therefore demand reduction in the component temperatures, as well as more uniform component temperatures.

Forced-convection, liquid cooled, microchannel heat sinks have been recently developed to dissipate heat in modern microcircuitry. The first technical publications on this appeared in the early 1980's as the result of a study done by Tuckerman and Pease at Stanford University, and have caused considerable interest in the heat transfer community.

The configuration of a typical microchannel heat sink is shown in FIG. 1. Heat sink 10 is a finned structure which is cooled by forced convection. The coolant flows from inlet plenum 12 through rectangular microchannels 14, and out into the discharge plenum 16. Power is dissipated by microcircuit 20, and the heat is conducted through the substrate to fins 15 (shown in FIG. 2) where it is conducted to the coolant. The coolant can be either a liquid or a gas, but the pumping power requirements for gases are much larger for the same thermal performance. Also shown in FIG. 1 is cover plate 30 and manifold block 32.

FIG. 2 is a sectional view of the prior art device of FIG. 1 taken along line A—A, and fins 15 can be seen to create microchannels 14 through which the coolant flows. The width of each microchannel is shown as $W_c$ and the width of each fin is shown as $W_w$. FIG. 3 shows a sectional view of the device of FIG. 1 taken along line B—B. The height of each microchannel is indicated by b, while the distance from circuit 20 and the microchannel is indicated by t. The channel length (or fin length) is indicated in FIG. 1 as L.

The microchannels can be fabricated in silicon substrates by precision sawing or orientation-dependent etching, and usually have a larger height b than width $W_c$ This ratio is called the aspect ratio. The channel width $W_c$ is typically about 55 $\mu$m, and the fin thickness $W_w$ is typically about 40 to 45 $\mu$m. The substrate height t is typically about 100 to 200 $\mu$m, and the fin height b about 300 to 400 $\mu$m. The channel length is typically 1.4 to 2.0 cm.

The hydrodynamic and heat transfer properties of flow through the rectangular microchannels depends on the flow regime, which can be laminar, turbulent, or a transitional stage between the two. The parameter used to define the flow regime is the Reynolds number which is given by $$Re = \frac{\rho_f V_c D_e}{\mu_f}$$

where Re is the Reynolds number, $\rho_f$ the coolant density, $\mu_f$ the coolant dynamic viscosity, $V_c$ the average coolant velocity in the duct, and $D_e$ the hydraulic diameter.

The transition between laminar and turbulent flow occurs over a range of Reynolds numbers. This range is large if the tube entrance is "bell-mouthed" and much smaller if there is an "abrupt" reduction in the flow cross-sectional area at the entrance. In the latter, the flow tends to "trip" at a "critical" Reynolds number, for which the flow is laminar if $Re < Re_{crit}$, and the flow is turbulent if $Re > Re_{crit}$.

In order to fully understand the design and operation of microchannel heat sinks, the thermal performance of these devices will be analyzed in detail. The thermal performance of a device is often specified in terms of its thermal resistance. The total thermal resistance R is given by $R = \Delta T/Q$, where $\Delta T$ is the peak temperature rise above an ambient reference temperature, and Q is the total heating rate. In analyzing microchannel heat sinks, a modified thermal resistance $R_{tot}$ is used. It is given by $$R_{tot} = R_{tot} A_{cross} = \frac{\Delta T}{Q} A_{cross} = \frac{\Delta T}{q}$$

where $A_{cross}$ is the surface area over which the heat input Q occurs, and q is the heating rate per unit surface area which is assumed to be uniform over $A_{cross}$. Using the modified thermal resistance makes it possible to formulate the thermal analysis based on a single channel and an adjacent fin. This is allowed since neighboring channels and fins are symmetrical in thermal response (assuming that the heat source is large enough). Therefore, $R_{tot}$ will be based on $A_{cross} = L(W_w + W_c)$.

The total thermal resistance can be thought of as being made up of several components. The arrangement of these thermal resistances is similar to an electrical network of resistors in series and/or parallel. The network will be slightly different depending on the aspect ratio. Six main types of thermal resistance will be discussed next.

The first thermal resistance is $R_{spread}$, which is the "constriction resistance" due to thermal spreading from each discrete heat source (e.g., integrated circuit feature or gate) on the surface of the chip. This so-called spreading thermal resistance has been said to be the limiting indicator of transistor speed improvement. This is because the speed of some types of transistors (e.g, bipolar devices) goes up as the supplied power goes up (which is mostly dissipated as heat). Therefore, the transistor speed can be increased only so much because the high heating rate will eventually drive the device temperature too high.

The thermal-spreading resistance will be a function of the size and shape of the heat source. For a circular heat source the following equation can be used:

$$R_{spread} = \Delta T_c/q = 1/(2 k_w a \sqrt{\pi})$$

where a is the radius of the heat source, $\Delta T_c$ is the constriction effect, and $K_w$ is the thermal conductivity. For a square heat source the following equation is used:

$$R_{spread} \sim \frac{1}{4 k_w a}$$

where $k_w$ is the thermal conductivity of the material evaluated at the device temperature, and a is the characteristic length.

Currently, thermal spreading accounts for on the order of 10° C. of the total temperature rise of about 100° C. in typical silicon chips. However, as the level of circuit integration continues to increase, the temperature rise due to thermal spreading should decrease making this resistance much less significant. Therefore, the effect of thermal spreading will not be included in the thermal resistance models, discussed below.

The second type of thermal resistance is $R_{solid}$, which is due to the conduction of heat through the solid material between the heating surface (e.g., integrated circuit) and the fin base and channel base plane. The modified thermal resistance is given by:

$$R_{solid} = \frac{t}{k_w}$$

where $k_w$ is the wall thermal conductivity evaluated at the average substrate temperature, and t is the substrate thickness. Note that if there is a thermal interface then $R_{solid}$ will be the sum of the contributions between the heating surface and the interface, and between the interface and the fin base and channel base plane.

The third type of thermal resistance is $R_{int}$, which is due to the thermal interface (if any) between the microchannel heat sink and the heat source (e.g., an integrated circuit chip). If there is an interface, then the microchannel heat sink may be considered a "cold plate". Attachment of the heat source can be done using various types of bonding (solder, epoxy, etc), thermal grease, gas layers, etc. The thermal resistance models discussed below assume that the microchannel heat sink is manufactured directly into the substrate of the heat source, and therefore do not include $R_{int}$.

The fourth type of thermal resistance is $R_{cont}$, which is due to the "constriction effect" at the base of the fin (if there is a fin). If fins are used, it is intended that they transfer more heat than if the fin base surface area were exposed directly to the fluid. This necessitates that the heat flow be "funneled" into the base of the fin. The fins act as a long-strip heat sink for which the constriction thermal resistance may be obtained from the following equation:

$$R_{cont} = \frac{(w_w + w_c)}{\pi k_w} \ln\left[\frac{1}{\sin\{\pi w_w/[2(w_w + w_c)]\}}\right]$$

where $k_w$ is the material thermal conductivity which is evaluated at the average substrate temperature. This equation applies for large aspect-ratio channels. For moderate aspect-ratio channels, some heat is convected from the channel base thereby making the constriction thermal resistance somewhat smaller. Compared to the overall thermal resistance, this reduction is small and therefore will be ignored for simplicity and conservatism. The constriction thermal resistance is zero for small aspect-ratio channels because the fins are used for structural purposes and are assumed to transfer no heat. The fin thickness is assumed to be much smaller than the channel width, and therefore there is also no constriction thermal resistance for the heat flow into the channel base.

The fifth type of thermal resistance is $R_{conv}$, which is due to the convection of heat from the channel base and/or the fin. If there is a fin, $R_{conv}$ also includes the thermal resistance of heat conduction in the fin. Therefore the convective thermal resistance is given by:

$$R_{conv} = R_{conv}[L(w_c + w_c)] = \frac{[L(w_w + w_c)]}{hA_{bc} + k_w m A_{bf} \tanh(mb)}$$

where $M = (2h/K_w W_w)^{0.5}$, $A_{bc}$ is the area of the channel base ($LW_c$), $A_{bf}$ is the area of the fin base ($LW_w$), h is the average heat transfer coefficient, and b is the height of the fin. Using the definition of the fin efficiency, $n_f = [\tanh(mb)]/mb$, and doing some rearranging gives:

$$R_{conv} = \frac{(w_w + w_c)}{hw_c + 2hb\eta_f}$$

which represents the convective thermal resistance between the fin base and channel base plane and the local coolant, for moderate aspect-ratio channels. This equation assumes that the temperatures of the fin base and the channel base are equal. Note that for large aspect-ratio ducts, $hw_c \sim 0$, and for small aspect-ratio ducts $2hbn_f \sim 0$.

The overall thermal resistance is based on the difference between the peak chip surface temperature and the inlet coolant temperature. Thus, an effective thermal resistance can be defined which is to be added to the local thermal resistance at a given distance from the channel entrance. Therefore, the sixth type of thermal resistance is $R_{bulk}$, which is due to the bulk temperature rise of the coolant from the channel entrance caused by absorption of the heat from the microchannel heat sink. The bulk thermal resistance is given by:

$$R_{bulk} = \frac{[L(w_w + w_c)]}{\rho_f C_{pf} V} = \frac{L(w_w + w_c)}{\rho_f C_{pf} b w_c V_c}$$

where V is the volumetric flow rate of the coolant per channel, $V_c$ is the velocity of the coolant in the channel, $Cp_f$ is the specific heat, and $\rho_f$ is the coolant density.

There is one phenomenon that cannot be put into the form of a thermal resistance since it is independent of the heating rate. This is the temperature rise of the coolant due to viscous heating. The coolant temperature rises due to the conversion of mechanical energy (fluid pressure) into thermal energy (fluid temperature rise). The temperature rise is defined as $\Delta T_{pump}$ and is given by:

$$\Delta T_{pump} = \Delta P / \rho_f C p_f J$$

where $\Delta P$ is the coolant pressure drop (between the inlet plenum and the channel exit), and J is the mechanical equivalent of heat.

To summarize, the total modified thermal resistance is give by the sum of six thermal resistance terms as:

$$R_{tot} = R_{spread} + R_{solid} + R_{int} + R_{cont} + R_{conv} + R_{bulk}$$

$R_{spread}$ is ignored since it should become small as the level of circuit integration increases, and because it is highly dependent on the transistor technology. $R_{int}$ is in general not required for integrated circuits and is also ignored. Therefore, the thermal resistance models discussed below will consider the total thermal resistance as being given by:

$$R_{tot} = R_{solid} + R_{cont} + R_{conv} + R_{bulk}$$

Since viscous heating cannot be accounted for using a thermal resistance, the total temperature rise at the channel exit is given by:

$$\Delta T_{tot} = R_{tot} q + \Delta T_{pump}$$

where it is implied that $R_{tot}$ and $\Delta T_{pump}$ are independent of q. To be accurate, the properties must be evaluated at proper average temperatures.

To facilitate comparison between heat sink designs, it is necessary to have a common ambient reference temperature (i.e., the inlet coolant temperature). But this is not enough. It is obvious that different heating rates will result in different average properties of the liquid coolant and the heat sink material as well. Therefore, the total thermal resistance of the same heat sink with the same inlet coolant temperature will be different for different heating rates—especially if a comparison is attempted between very small and very large heating rates. Therefore, when comparing various heat sink designs, the heating rate must also be prescribed.

Thermal resistance models will now be analyzed for various channel aspect ratios ($\alpha = b/W_c$). They are large ($\alpha > 10$), moderate ($0.1 < \alpha < 10$), and small ($\alpha < 0.1$).

Large aspect-ratio channels have large fin heights. The surface area for convective heat transfer of the channel base is small compared to the surface area of the fins. Therefore, the contribution of the channel base to the overall heat transfer is small and can be ignored even though the channel base surface temperature is on average higher than the fin temperature. Ignoring the contribution of the channel base ($hw_c \sim 0$) in $R_{conv}$, gives the following model for the total thermal resistance:

$$R_{tot,large} =$$

-continued $$\frac{t}{k_w} + \frac{(w_w + w_c)}{\pi k_w} \ln\left[\frac{1}{\sin\{\pi w_w/[2(w_w + w_c)]\}}\right] +$$

$$\frac{(w_w + w_c)}{2hb\eta_f} + \frac{L(w_w + w_c)}{\rho_f C p_f b w_c V_c}$$

where $R_{tot,large}$ is the total modified thermal resistance for large aspect-ratio channels.

Moderate aspect-ratio channels have shorter fin heights such that the heat transfer from the channel base is also significant (and therefore not ignored). The total thermal resistance is given by:

$$R_{tot,moderate} =$$

$$\frac{t}{k_w} + \frac{(w_w + w_c)}{\pi k_w} \ln\left[\frac{1}{\sin\{\pi w_w/[2(w_w + w_c)]\}}\right] +$$

$$\frac{(w_w + w_c)}{hw_c + 2hb\eta_f} + \frac{L(w_w + w_c)}{\rho_f C p_f b w_c V_c}$$

where $R_{tot,moderate}$ is the total modified thermal resistance for moderate aspect-ratio channels.

Small aspect-ratio channels have fins which are primarily used for structural purposes. The fins are small in thickness compared to the channel width ($w_w << w_c$), and are very short in height ($b << w_c$) Therefore, the contribution of the fins to the overall heat transfer is small and can be ignored. Since $w_w << w_c$, it is assumed that $w_w \sim 0$, which results in $R_{cont} \sim 0$. Therefore, the total thermal resistance is:

$$R_{tot,small} = \frac{t}{k_w} + \frac{1}{h} + \frac{L}{\rho_f C p_f b V_c}$$

where $R_{tot,small}$ is the total modified thermal resistance for small aspect-ratio ducts.

The analysis performed by D. Tuckerman and R. Pease of Stanford University considered similar thermal resistance formulas and developed an "optimum" design for microchannel heat sinks. Their analysis was the basis for prior art microchannel heat sink designs and every microchannel heat sink built to date has been constructed in accordance with their conclusions. The Tuckerman and Pease analysis is discussed in one or more of the following publications, each of which are incorporated herein by reference: Tuckerman, D. B., 1984, "Heat-Transfer Microstructures for Integrated Circuits", PhD Thesis, Stanford University, Stanford, California; Tuckerman, D. B. and Pease, R. F. W., 1981, "High Performance Heat Sinking for VLSI", IEEE Electron Device Lett. EDL-2, pp. 126–129; Tuckerman, D. B. and Pease, R. F. W., 1981, "Ultrahigh Thermal Conductance Microstructures for Cooling Integrated Circuits", 32nd Electronics Components Conf. Proc., pp. 145–149; Tuckerman, D. B. and Pease, R. F. W., 1982, "Optimized Convective Cooling Using Micromachined Structures", Electrochemical Society Extended Abstract No. 125,82, pp. 197–198; Tuckerman, D. B. and Pease, R. F. W., 1983, "Microcapillary Thermal Interface Technology for VLSI Packaging", Symposium on VLSI Technology, Digest of Technical Papers, pp. 60–61. Background material is also available in Philips, R. J., 1988, "Forced Convection Liquid Cooled Microchannel Heat Sinks", Technical Report 787, Massachusetts Institute of Technology, also incorporated herein by reference. The following is a summary of Tuckerman and Pease's analysis and conclusions.

For large aspect-ratio channels, there is a surface area multiplication factor $\delta = 2b/(w_w + w_c)$ due to the fins Assuming fully developed laminar flow at the channel exit provides the friction factor as $f = 24/Re = 24\mu_f/(\rho_f V_c 2w_c)$. The Nusselt number is constant for a given channel aspect ratio. The coolant pressure drop is a design constraint and is given by $\Delta P = 4f(L/D_e)\rho_f V_c^2/2g_c$. Upon substitution into the thermal resistance equation, the following thermal resistance model is obtained:

$$R = \frac{2w_c}{k_f Nu \delta \eta_f} + \frac{24\mu_f L^2}{\rho_f C_{pf} \Delta P w_c^3 \delta}$$

When $\delta$ is large, it can be shown that $w_w = w_c$ maximizes $\eta_f$ (which is less than 1.0 and therefore minimizes R). The surface area enhancement is given by $\delta = (k_w/k_f Nu)^{0.5}$ which results in $\eta_f = 0.76$. With these values for $\delta$ and $\eta_f$ substituted into the above equation, the "optimum" channel width is given by taking $dR/dw_c = 0$ which gives:

$$w_c \approx 2.29(\mu_f L^2 k_f Nu/\rho_f C_{pf} \Delta P)^{0.25}$$

for which the "optimum" modified thermal resistance is given by:

$$R = \frac{4}{3} R_{conv} = 4R_{bulk} = 8.01 \ (\mu_f L^2/k_f \rho_f C_{pf} k_w^2 Nu\Delta P)^{0.25}$$

As a result of this analysis, prior art microchannel heat sinks are designed to operate with fully developed laminar flow and have channel widths typically less than 100 μm.

SUMMARY OF THE INVENTION

The present invention is directed to a method of using a microchannel heat sink that includes the step of passing a liquid through a plurality of channels in the heat sink in such a manner as to create a turbulent flow (either developing or fully developed). A second embodiment of the invention utilizes a developing laminar flow instead of a turbulent flow.

In order to create more uniform temperatures about the periphery of the integrated circuit the present invention utilizes a "compensation heater" comprising a heater in close thermal contact to the perimeter of the IC chip.

In the preferred embodiments, the microchannel heat sink is formed from indium phosphide with channel widths between 125 μm and 300 μm. The heating rate of the compensation heater is the same as the heating rate of the IC chip.

DETAILED DESCRIPTION OF THE PREFERRED EMBODIMENTS

The drawings will first briefly be described.

DRAWINGS

STRUCTURE

Figure 1:
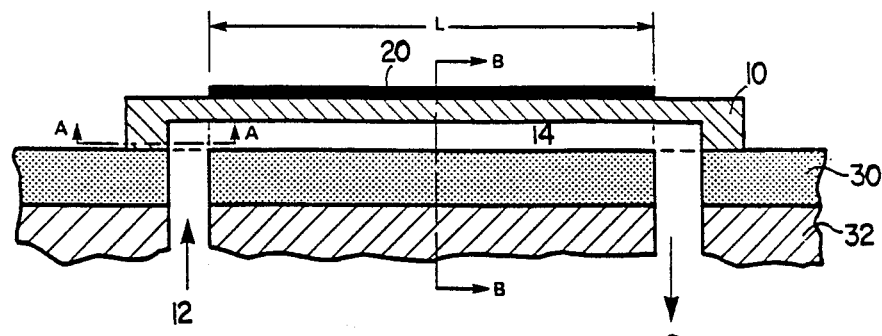
FIGS. 1-3 are various views of a prior art microchannel heat sink.
Figure 4:
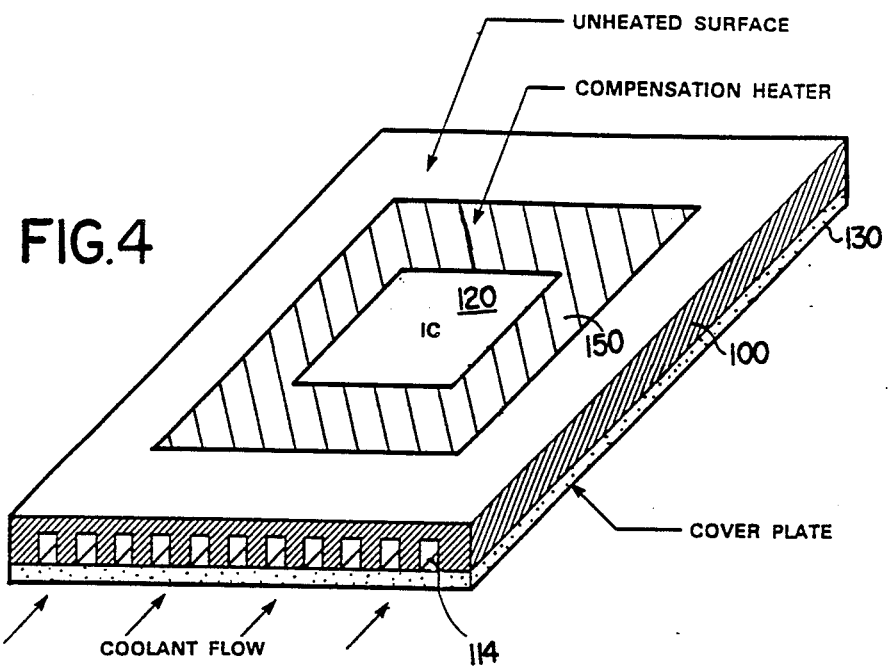
FIGS. 4 and 5 are two views of a microchannel heat sink in accordance with the present invention.

The microchannel heat sink structure of the present invention is shown in FIG. 4 and comprises heat sink 100 having a plurality of microchannels 114 through which coolant flows as indicated by the arrows. Heat sink 100 is mounted on cover plate 130. Integrated circuit (IC) 120 is surrounded by compensation heater 150 shown in greater detail in FIG. 5. The device includes input and output ports identical to those described above in connection with the prior art device shown in FIG. 1 and are therefore not shown in FIG. 4.

Figure 5:
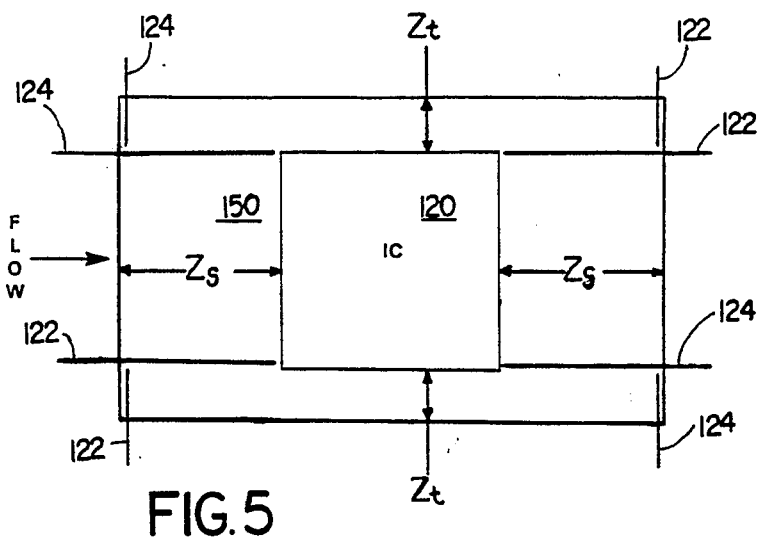

FIG. 5 illustrates a more detailed view of compensation heater 150. Compensation heater 150 extends a distance Zs on both sides of IC 120 in the direction of fluid flow as shown, and extends a distance Zt in a direction perpendicular to fluid flow. The dimensions of Zs and Zt will vary according to the specific design parameters. These dimensions apply regardless of the size of IC 120. Power is supplied to compensation heater 120 through four positive contacts 122 and four negative contacts 124, which may be formed of any high conductivity material such as silver or gold. Compensation heater 120 may be formed of any standard resistive material.

OPERATION

The operation of the microchannel heat sink of this invention was developed as the result of a detailed analysis of the thermal resistance models that departs substantially from the analysis of Tuckerman and Pease upon which the prior art microchannel heat sinks are based. A summary of the analysis upon which the present invention is based is presented below.

As noted above, the Tuckerman and Pease analysis began by assuming that the flow was laminar and fully developed. These assumptions produced the "optimum" designs that are the basis for today's microchannel heat sinks The analysis upon which the present invention is based, however, makes no such assumptions. Through the use of a sophisticated computer program discussed below and attached hereto as appendix A, it was discovered that the "optimum" of Tuckerman and Pease was illusory. As the following detailed discussion makes clear, vastly superior results have been shown to be achievable if the microchannel heat sink is operated in the turbulent regime (fully developed or developing flow) or in the laminar regime with developing flow.

The solution of the thermal resistance models will now be analyzed for three design constraints on the coolant flow rate.

The first design constraint is fixed pressure drop $\Delta P$, which may be required due to supply pressure limitations of the circulation pump or due to structural (stress) limitations of the heat-sink design. The second design constraint is fixed volumetric flow rate per unit heater surface area V, which may be required since the circulation pump may be of the positive-displacement type. The third design constraint is fixed pumping power per unit heater surface area $P = \Delta PV$, which may be required to limit the power consumption of the cooling system. These three constraints are not totally independent when a practical heat-sink design is being sought. In general, all three constraints must be satisfied in that the pressure drop does not exceed $\Delta P$, that the volumetric flow rate does not exceed V, and that the pumping power does not exceed P.

To determine the thermal performance of a heat sink, several analysis parameters must be known in advance. They are: the heat-sink material, the liquid coolant, the inlet temperature of the liquid coolant $T_{f,in}$, the heating rate q, the channel width $w_c$, the fin thickness $w_w$ (or the ratio $w_w/w_c$), the fin height b (or the channel aspect ratio $\alpha = b/w_c$), the channel length L, the ratio of the channel and plenum cross-sectional areas $Ac/Ap$, the substrate thickness t, the ratio of the channel and plenum cross-sectional areas $Ac/Ap$, the substrate thickness t, and one design constraint ($\Delta P$, V, or P). This adds up to ten variables plus the design constraint. If the channels are roughened with repeated-ribs, there are four additional analysis parameters which must also be known in advance. These roughness parameters are: the ratio of the rib height to the channel hydraulic diameter $e/D_e$, the ratio of the distance between repeated-ribs to the rib height $p/e$, the rib shape angle $\phi$, and the flow attack angle $\psi$. The computer program used in this study can only treat one design constraint at a time. Therefore, the solution procedures used to obtain the coolant velocity $V_c$ for each design constraint are discussed separately.

Since the coolant velocity is not in general known in advance, the Reynolds number also is not known. To avoid problems with satisfying the Reynolds number criterion for laminar vs turbulent flow, the flow is first assumed to be laminar. The entire solution procedure is then completed assuming that the flow is laminar. The flow is then assumed to be turbulent and the entire solution procedure is repeated. If the laminar case Reynolds number turns out to be greater than $Re_{crit}$, the numerical results are discarded. Similarly, if the turbulent case Reynolds number turns out to be lower than $Re_{crit}$, the numerical results are discarded.

For the fixed pressure drop constraint, $V_c$ can be obtained after rearrangement as:

$$V_c^2 = \Delta P \left( \frac{2g_c}{\rho_f} \right) [(Ac/Ap)^2 (2K_{90}) + (Kc + Ke) + 4f_{app}L/D_e]^{-1}$$

where $K_{90} \sim 1.2$, $K_c$ is the entrance pressure loss coefficient, and $K_e$ is the exit pressure loss coefficient. For laminar flow in smooth channels, the apparent friction factor $f_{app}$ is obtained as a function of $\alpha = b/w_c$ and $L^+ = L/D_e Re$. For turbulent flow in smooth channels, the apparent friction factor is obtained as a function of $L/D_e$ and Re. For fully developed turbulent flow in repeated-rib-roughened channels, the apparent friction factor is given by $f_1$ or $f_2$ which are obtained as a function of $D_e$, the roughness parameters ($e/D_e$, $p/e$, $\phi$, and $\psi$), and Re. Therefore, $K_c$, $K_e$, and $f_{app}$ are all functions of Re and other known analysis parameters. Since Re is a function of $V_c$ and other known analysis parameters, it becomes clear that trial-and-error solution using successive guesses of $V_c$ is required.

For the fixed volumetric flow rate constraint, the solution for the coolant velocity is easy. The volumetric flow rate per unit heater surface area V must first be converted to a volumetric flow rate per channel. This is done by multiplying V by the heater surface area directly over one channel and an adjacent fin $L(w_w + w_c)$]. The velocity is directly obtained by dividing the result by the cross-sectional flow area of one channel ($bw_c$). Therefore, the coolant velocity is given by:

$$V_c = \frac{V[L(w_w + w_c)]}{bw_c}$$

where V is the design constraint, and the geometrical parameters (L, $w_w$, $w_c$, and b) are all known.

For the fixed pumping power constraint, the coolant velocity can be obtained using:

$$V_c^3 = P \left( \frac{2g_c}{\rho_f} \right) [(Ac/Ap)^2 (2K_{90}) + (Kc + Ke) + 4f_{app} L/D_e]^{-1} \frac{[L(w_w + w_c)]}{bw_c}$$

where the solution procedure is the same as that discussed above with the fixed pressure drop constraint.

Now that the coolant velocity is known, the heat-transfer coefficient can be obtained from the Nusselt number $Nu = hD_e/k_f$. For laminar flow in smooth channels, Nu is obtained as a function of $\alpha$ and $x^* = L/D_e Re Pr$ (where Pr is the coolant Prandtl number). For turbulent flow in smooth channels, the heat-transfer coefficient is obtained as a function of Pr and Re. For fully developed turbulent flow in repeated-rib-roughened channels, Nu is obtained as a function of $D_e$, the roughness parameters ($e/D_e$, $p/e$, $\phi$, and $\psi$), the coolant parameters ($\rho f$, $\mu f$, and Pr), and Re.

The total thermal resistance can now be obtained by substituting the values for the coolant velocity and the heat-transfer coefficient into the thermal resistance models. This solution is "accurate" if the correct values of the heat-sink material properties and the coolant properties are known. It was previously mentioned that the heating rate q and the inlet coolant temperature $T_{f,in}$ both affect the properties of the heat sink and the coolant. To account for the effect of the heating rate, the following procedure is used. First the properties of the coolant and the heat-sink material are evaluated at $T_{f,in}$ and assumed constant over the entire channel length. Then the coolant velocity, the friction factor, and the heat-transfer coefficient (at the channel exit) are obtained using the solution procedure discussed above. At this point, the individual thermal resistance components are computed and summed to give the total thermal resistance. Several temperatures are then computed using the heating rate, the thermal resistances, and $\Delta T_{pump}$. The relative error between the "new" and "old" temperatures is computed, and the solution is obtained if all the errors are sufficiently small. If one or more of the errors is too large, then average values for the temperatures are computed and used to evaluate the heat sink and coolant properties.

The entire solution procedure is then repeated using these new properties and calculations are performed to account for variations of Nu and $f_{app}$ due to nonuniform coolant properties. This process continues until all the temperature errors are small enough. It is only after this final solution is obtained that the Reynolds number can be checked for being in the flow regime that was assumed in the beginning. If Re is not in the proper flow regime, the solution is discarded because it is not valid.

Figure 6:
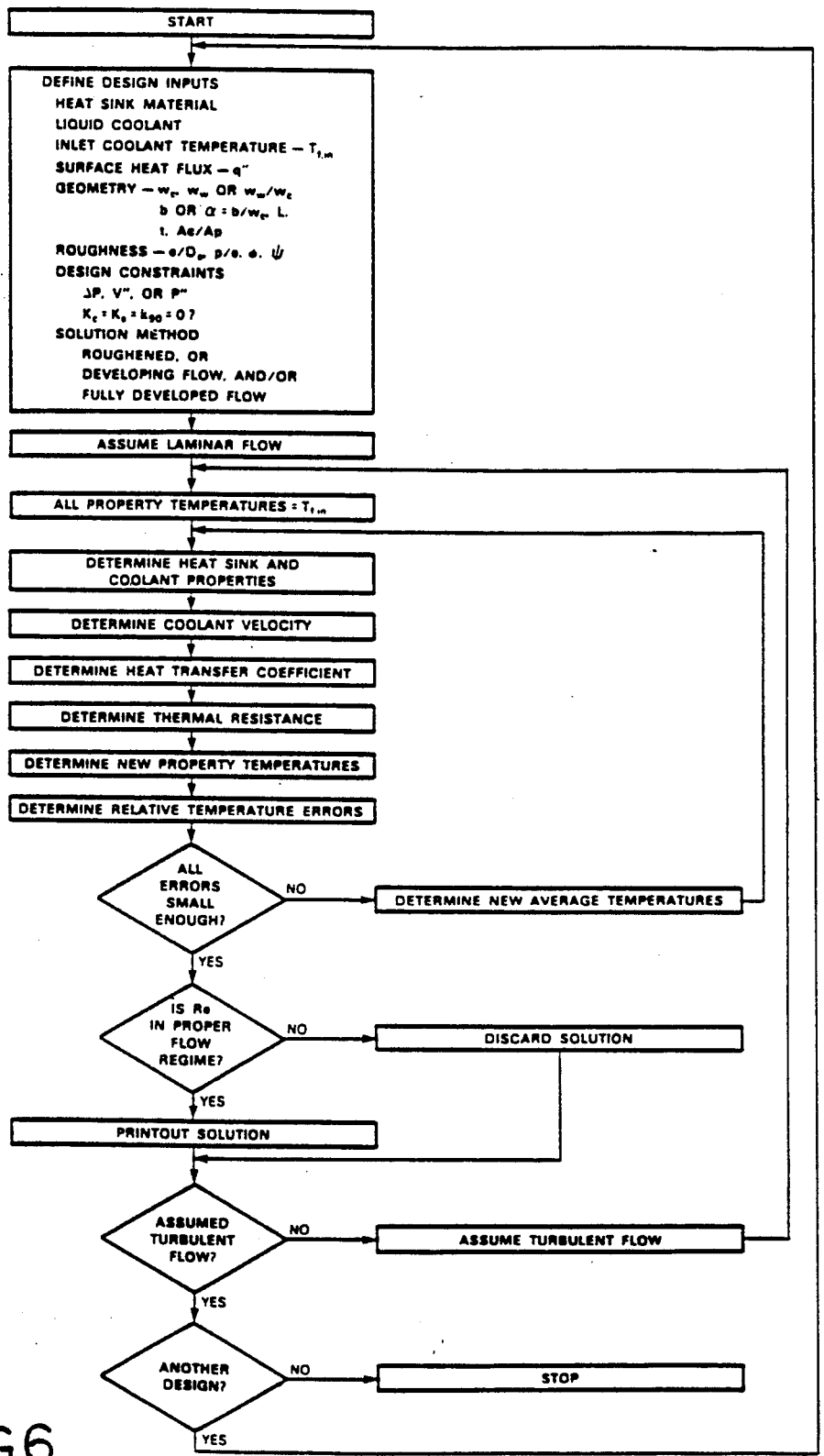
FIG. 6 is a flowchart outlining a method for computing thermal resistance models in accordance with the theory of the present invention.

FIG. 6 summarizes the iterative solution procedure. The solution procedure requires considerable numerical computation. Because of this, a new computer program called "MICROHEX" has been written to compute the thermal and fluid performance of forced-convection, liquid-cooled, microchannel heat sinks (appendix A). MICROHEX will handle small, moderate, and large aspect-ratio channels with fully developed and developing flow in the laminar and turbulent regimes. The channel surfaces can be smooth or roughened with repeated-ribs. Variable property effects are included for the chip material and the liquid coolant (compressibility effects have not been included). The effect of viscous dissipation in the liquid coolant is included. Thermal spreading at the periphery of the heat source is also taken into account with simplified one-dimensional models.

Figure 7:
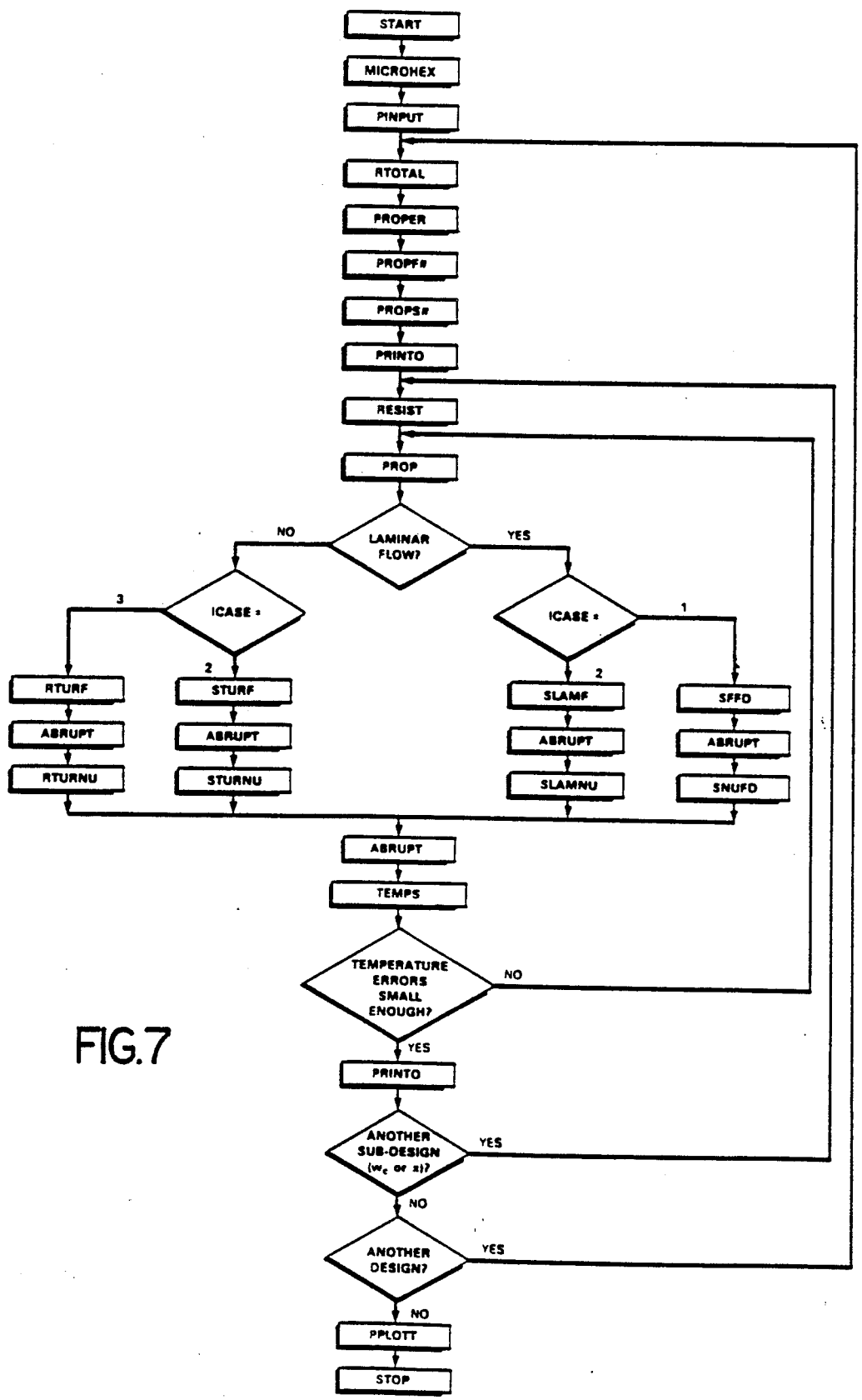
FIG. 7 is a flowchart which shows when subroutines are called in the program used for computing thermal resistance models.

Program MICROHEX and its 19 subroutines are written in Fortran IV. It has been successfully run on an IBM 3081, a MICROVAX II, and an IBM PC. Table 1 briefly discusses what each subroutine does, and FIG. 7 presents the program flowchart which shows when each subroutine is called.

The input for MICROHEX is provided via initializing up to 25 variables in the MICROHEX program data statements. These variables will now be introduced (see Table 2 for a summary of the input variables).

The variable NCURVE determines how many generic heat-sink designs will be analyzed. From one to five designs are allowed, and each design will have its thermal and fluid performance plotted using a unique curve type.

The variable IX determines if either the channel width $w_c$ or the channel length x is fixed (constant). If the channel length is constant (IX=1), then the thermal and fluid performance will be plotted as a function of the channel width with all results provided at the channel exit (thermal spreading at the heater periphery is not included here since the channel exit is not the location of the peak, total thermal resistance if thermal spreading is considered). If the channel width is constant (IX=2), then the thermal and fluid performance will be plotted as a function of the channel length (thermal spreading along the channel length at the heater periphery will be included).

The variable NSINK is used to specify the heat-sink material. MICROHEX contains data for gallium arsenide, germanium, indium phosphide, silicon, aluminum, copper and silver. The user can easily include other materials simply by adding additional PROPS# subroutines.

The variable NFLUID is used to specify the liquid coolant, MICROHEX contains data for FC-77, Freon 12 ($CCl_2F_2$), and water. The user can easily include other liquid coolants simply by adding additional PROPF# subroutines.

The variable ICASE is used to specify the flow regimes(s) and channel surface type. Three ICASEs are currently used. They are: (a) fully developed laminar flow everywhere (smooth surfaces), (b) fully developed/developing, laminar/turbulent flow (smooth channels). and (c) fully developed turbulent flow everywhere (repeated-rib-roughened surfaces).

The variable Q is used to specify the surface heat input q in watts per square centimeter of heater surface area. The variable TFLUIN is used to specify the inlet temperature of the liquid coolant in degrees Kelvin.

The variable WCSTAR is used to specify the smallest channel width $w_c$ in microns that will be analyzed. The variable WCEND is used to specify the largest channel width in microns that will be analyzed. The variable WCINCR is used to specify the increment in channel width between WCSTAR and WCEND for intermediate channel widths that will be analyzed. If IX=1, then the thermal performance will be computed for channel widths $w_c$=WCSTAR, WCSTAR+1WCINCR, WCSTAR+2WCINCR, . . . ,WCEND. If IX=2, then WCSTAR=WCEND, and WCINCR=0 is required since the channel width is constant.

The variable WWBYWC is used to specify the ratio of the fin width $w_w$ to the channel width $w_c$.

The variable IZ is used to determine whether the channel height (fin height) b is constant, or if the channel aspect ratio $\alpha=b/w_c$ is constant. If IZ=1, then the variable B is used to specify the channel height (fin height) b in microns. If IZ=2, then the variable ASPECT is used to specify the constant channel aspect ratio.

The variable L is used to specify the channel length in meters. The variable T is used to specify the thickness in microns of the solid material between the surface of heat input and the channel base and fin base plane.

The variable IKLOSS is used to determine if the inlet and exit header pressure losses will be included or not. If IKLOSS=0, then $Kc=Ke=K_{90}=0$, and only the channel friction will be used to determine the overall pressure drop. If IKLOSS=1, then Kc, Ke, and $K_{90}$ will be computed and included in the overall pressure drop.

The variable ICONS is used to determine which flow constraint will be used to determine the velocity of the liquid in the microchannels. If ICONS=1, then the variable DELP is used to specify the coolant pressure drop ΔP in psi. If ICONS=2, then the variable VOLUME is used to specify the coolant flow rate V in cubic centimeters per second per square centimeter of heater surface area. If ICONS=3, then the variable POWER is used to specify the coolant pumping power P in watts per square centimeter of heater surface area.

If the channel surfaces are roughened with repeated-ribs ($\alpha<0.1$ or $\alpha>10$), then the following four variables must be initialized. The variable EBYDE is used to specify the ratio of the rib height e to the channel equivalent diameter $D_e$. The variable PBYE is used to specify the ratio of the spacing between repeated ribs p and the rib height e. The variable PHI is used to specify the rib shape angle $\phi$ in degrees. The variable ZI is used to specify the flow attack angle $\psi$ in degrees.

Typical thermal and fluid performance predictions that can be obtained using MICROHEX will now be described. A "reference" microchannel heat sink design is utilized The reference design is a water-cooled silicon heat sink. The modified "echo" (produced by subroutine PINPUT) of the input variables is provided as Table 3. From this table, it can be seen that all thermal and fluid performance calculations were done at the channel exit and therefore the effect of thermal spreading at the heater perimeter was not included. The calculations were done for fully developed/developing, laminar/turbulent flow in smooth channels. The inlet coolant temperature is $T_{f,in} = 300°$ K. The surface heat flux is assumed negligible, and therefore the properties of the heat-sink material and the liquid coolant are constant all along the channel. The computations begin with a channel width of 5 μm and proceed in 5-μm increments up to $w_c = 500$ μm. The ratio of the fin thickness to the channel width is unity, and the channel aspect ratio is constant at 4.0. The channel length is 1.0 cm, and the substrate thickness t is 100 μm. The pressure drop through the 90° bends, the inlet contraction, and the exit expansion are assumed to be small compared to the friction pressure drop along the 1.0 cm-long channel. The coolant velocity is determined for a 68.9 kPa (10 psi) pressure drop for all channel widths.

Figure 8:
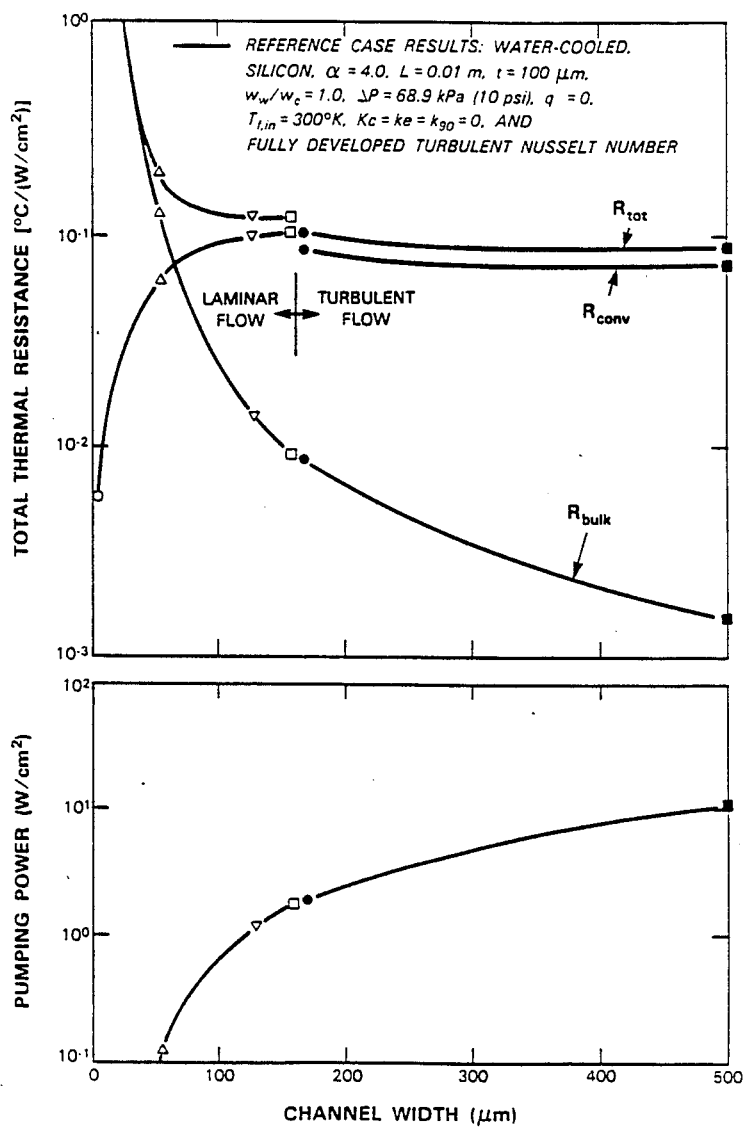
FIG. 8 is a graph of thermal resistance and pumping power v. channel width for the preferred embodiment.

The thermal and fluid performance predictions are plotted in FIG. 8 for the reference case. The upper graph is a plot of the total thermal resistance per unit area as a function of the channel width. The lower graph is a plot of the pumping power required per unit surface area as a function of the channel width. On both graphs, the laminar flow results begin with open circles (small $w_c$), and end with open squares (large $w_c$) (the open circle is not visible on the lower graph). Similarly, the turbulent flow results begin with closed circles (smallest turbulent $w_c$), and end with closed squares (largest $w_c$) The transition Reynolds number determines where the laminar flow curve ends, and where the turbulent flow curve beings. The upward pointing triangular symbols indicate the separation between fully developed flow (to the left) and developing flow (to the right). The downward pointing triangular symbols on the laminar flow curves indicate where the thermal entrance length $x^* = L/D_e Re Pr$ becomes <0.005 (to the right).

Three thermal resistance curves are shown for the reference case. They are the coolant bulk temperature rise thermal resistance $R_{bulk}$), the convective thermal resistance ($R_{conv}$), and the total thermal resistance ($R_{tot}$). The total thermal resistance also includes the solid substrate thermal resistance ($R_{solid}$) and the contraction thermal resistance ($R_{cont}$). The solid substrate thermal resistance was not plotted since it is constant for all channel widths (q=0). The contraction thermal resistance was not plotted since it is small and nearly constant.

Some interesting features of the curves should be noted. The magnitude of $R_{bulk}$ continuously gets smaller with channel width since more coolant can be forced through the larger channels at the same pressure drop. It is quite interesting to note that the turbulent flow $R_{bulk}$ appears to be an extension of the laminar flow results.

The laminar flow $R_{conv}$ continuously gets larger with increasing channel width. This is an intuitively correct result. For example, for fully developed laminar flow, $Nu = hD_e/k_f = $ const. Since the channel hydraulic diameter increases with channel width, the heat-transfer coefficient must decrease, thereby causing the thermal resistance to increase. For developing laminar flow, the Nusselt number increases as the flow at the channel exit becomes less fully developed, and therefore $R_{conv}$ increases less rapidly. The turbulent flow $R_{conv}$ is shown initially to decrease slowly with increasing channel width, and then to increase slowly. This is due to a steady increase in the flow Reynolds number which is required to meet the specified pressure drop. The Nusselt number gets bigger quite rapidly due to the increase in the Reynolds number. In fact, this effect is initially stronger than the reduction in h due to increases in $D_e$. One should also remember that the Nusselt number was determined assuming that the flow was fully developed, when in this case it really is not fully developed at the channel exit.

Perhaps the most interesting fact to note here is that the laminar flow $R_{tot}$ curve does not show any distinct optimum as predicted by the Tuckerman and Pease analysis. Instead, the total thermal resistance tends to more-or-less level off with sufficiently large channel widths. In fact, it is found that the total thermal resistance for turbulent flow is lower! It is significantly lower—on the order of 20 to 30 percent. The turbulent flow thermal and fluid performance predictions should be conservative (too large a friction factor, and too small a Nusselt number). This result is completely contrary to the results achieved by the prior art analysis and is the basis for the superior performance of the present invention. These facts will become more evident as the analysis is completed.

Four separate output files are provided as output by MICROHEX The numerical results contained in those output files for the reference case have been included as Appendix B of this report. At the top of each output column is the variable name and the units of the output results. The description of what each variable name represents is included in the comment header section of the RTOTAL subroutine (see Apendix A).

The typical values of several analysis parameters for the reference case will now be reviewed. For simplicity, the following channel widths are selected: fully developed laminar flow ($w_c = 50$ μm), developing laminar flow ($w_c = 100$ μm), and developing turbulent flow ($w_c = 300$ μm). The liquid coolant and heat-sink material properties are uniformly constant since the surface heat input is zero (q=0). The properties are evaluated at TFLUIN=300° K. The silicon thermal conductivity is $k_w \sim 148$ W/m°C. The water thermal conductivity is $k_f \sim 0.613$ W/m°C., the specific heat is $C_{pf} \sim 4177.6$ J/kg°C., the Prandtl number is Pr $\sim 6.033$, the density is $\rho_f \sim 9995.5$ kg/m$^3$, and the dynamic viscosity is $\mu_f \sim 0.00088$ kg/ms. The coolant temperature rise due to viscous dissipation is $\Delta T_{pump} \sim 0.017°$ C. This is a very small temperature change, and therefore the properties are still esentially constant.

The heat sinks have a channel height b=200, 400, and 1200 μm, respectively, for $w_c = 50$, 100, 25 and 300 μm ($\alpha = 4.0$). The corresponding fin widths are $w_w = 50$, 100, and 300 μm. The channel hydraulic diameters are $D_e = 4A/P = 80$, 160, and 480 μm for the same channel widths. The laminar equivalent diameter is $D_l = 416.3$ μm for $w_c = 300$ μm (turbulent flow).

The average coolant velocity in the channels is $V_c = 1.40$, 4.67, and 11.59 m/s, respectively, for $w_c = 50$, 100, and 300 μm. The corresponding Reynolds numbers are Re=127, 845, and 6290. The laminar equivalent Reynolds number is Re*=5450 for $w_c = 300$ μm (turbulent flow). The hydrodynamic entrance length is given by $L^+ = L/D_e Re = 0.99$, 0.074, and 0.0033, respectively. The corresponding thermal entrance lengths are $x^* = 0.164$, 0.0123, and 0.0005.

The laminar flow friction factor can be obtained as $f_{app}=[(f_{app}Re)/Re]=0.142$ and $0.0254$, respectively, for $w_c=50$ and $100$ μm. The turbulent flow friction factor is $f_{app}=0.0124$. Using the specified pressure drop and these friction factors, the aforementioned coolant velocities are obtained (assuming $K_c=K_e=K_{90}=0$). The coolant volumetric flow per unit heater surface area is $V=1.4$, $9.35$, and $69.53$ (cm$^3$/s)/cm$^3$, respectively, for $w_c=50$, $100$, and $300$ μm. The corresponding coolant pumping power per unit heater surface area is $P=\Delta PV=0.10$, $0.64$, and $4.79$ W/cm$^2$.

The laminar flow Nusselt number is approximately $5.86$ and $7.17$, respectively, for $w_c=50$ and $100$ μm. The turbulent flow Nusselt number is approximately $42.8$ for $w_c=300$ μm. The corresponding heat-transfer coefficients are $h=Nuk_f/D_e=44,900$, $27,470$, and $54,600$ W/m$^2$°C. The corresponding fin efficiencies are $86.4$, $84.0$ and $50.7$ percent. The corresponding values of the fin criterion are $2k_w/hw_w=132$, $108$, and $18.1$.

The thermal resistance was computed for a moderate-aspect ratio since $\alpha=4.0$. The solid material thermal resistance between the heater surface and the fin base and channel base plane is $R_{solid}=0.0068°$ C./(W/cm$^2$) for all three channel widths. The contraction thermal resistance is $R_{cont}=0.0007$, $0.0015$, and $0.0045°$ C./(W/cm$^2$). The convective thermal resistance is $R_{conv}=0.0563$, $0.0943$, and $0.0724°$ C./(W/cm$^2$). The coolant bulk temperature rise thermal resistance is $R_{bulk}=0.1718$, $0.0257$, and $0.0035°$ C./(W/cm$^2$). The total thermal resistance is $R_{tot}=0.2356$, $0.1282$, and $0.0871°$ C./(W/cm$^2$).

Figure 9:
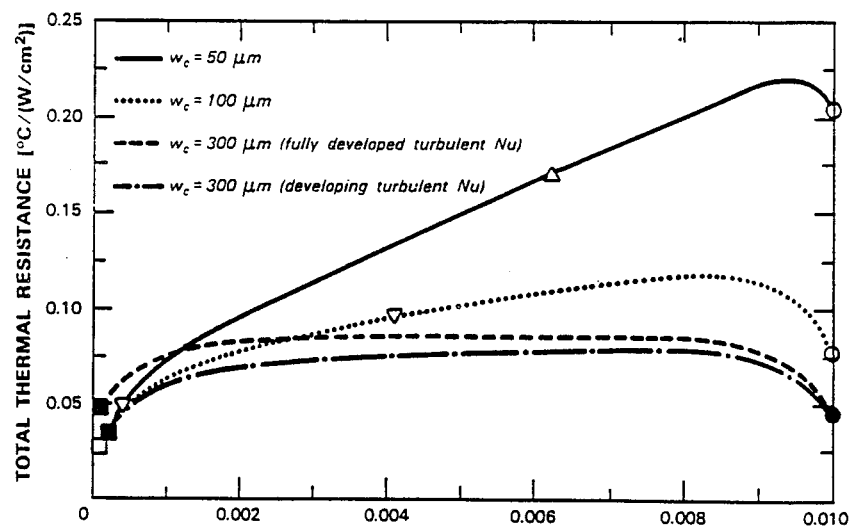
FIG. 9 is a graph of thermal resistance v. the distance from the upstream heater edge.

The total thermal resistance of the three representative channel widths for the reference case is plotted in FIG. 9 as a function of the distance from the upstream heater edge. Two curves are shown for turbulent flow. The dashed curve assumes that the Nusselt number is fully developed everywhere. The solid dot curve multiplies the turbulent Nusselt number by $[1+(D_e/L)^{2/3}]$ to approximate the effect of developing flow on the Nusselt number. A comparison of the two curves shows that the flow at the channel exit is nearly fully developed for $w_c=300$ μm. A comparison of the curves shows that the effect of $R_{bulk}$ is very important for laminar flow. This leads to greater nonuniformity in $R_{tot}$ along the channel. The average $R_{tot}$ is consequently much smaller for turbulent flow. "Compensation heaters" can be used to enhance the uniformity in $R_{tot}$, as discussed more fully below.

Figure 10:
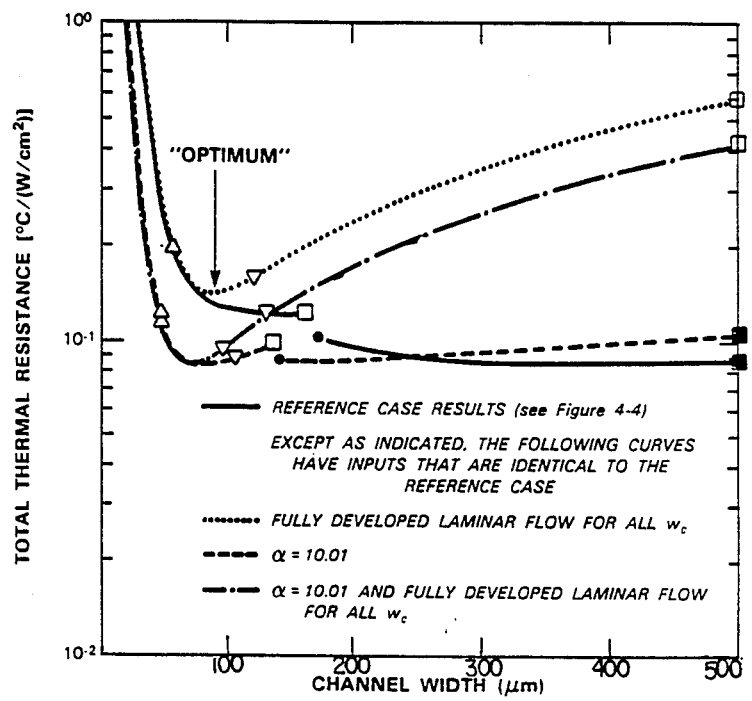
FIG. 10 is a graph of thermal resistance v. channel width for the preferred embodiment and for the prior art.

A comparison between the prior art thermal and fluid performance prediction theory (i.e., the Tuckerman and Pease theory), and that theory which is the basis of this invention, is shown in FIG. 10. The solid curve is for the reference case where the calculations are done for fully developed/developing, laminar/turbulent flow. The dotted curve is for the same reference case except that the flow is assumed to be fully developed and laminar for all channel widths (i.e., the Tuckerman and Pease assumption). When the flow really is laminar and fully developed (to the left of the upward pointing triangles), the two computational methods yield virtually identical results, which indeed they should. The small difference between the two curves in this region is due to the inherent disagreement between using polynomial equations to model fully developed laminar flow (see subroutines SFFD and SNUFD in Appendix A), and using interpolation in the lookup tables used in this study (see subroutines SLAMF and SLAMNU in Appendix A).

To the right of the upward pointing triangles, the flow is not fully developed. The $R_{tot}$ for the case where the flow is always assumed to be laminar and fully developed is higher than that for the reference case. The error increases with increasing channel width. In fact, there is a distinct minimum (or "optimum") in the thermal resistance, which is an artifact of the assumption that the flow is always laminar and fully developed. This optimum led the industry to believe that the best possible results were obtained using fully developed laminar flow when, in fact, as can be clearly seen from FIG. 10, the total thermal resistance is less for developing laminar flow and substantially less for developing or fully developed turbulent flow. Therefore, a microchannel heat sink operating in accordance with the present invention will achieve results that are superior to anything achieved by the prior art since the prior art thought such results were impossible.

FIG. 10 also presents thermal and fluid performance results for a channel aspect ratio of $\alpha=10.01$ (the solid-dot and dashed curves). The solid-dot curve gives the results where the flow is assumed to be fully developed and laminar for all channel widths. The dashed curve gives the results for fully developed/developing, laminar/turbulent flow. The computational differences between the two models are greater for $\alpha=4.0$ than for $\alpha=10.01$. This difference is due to the fact that when $\alpha$ is greater than $10.0$ it is assumed to be equivalent to flow between infinite parallel plates. The difference is notably small (less than 10 percent), which is the reason why $\alpha=10.0$ is used to delineate between moderate-and large-aspect-ratio channels. The thermal resistance in o laminar flow is about 50 percent smaller for $\alpha=10.01$ than for $\alpha=4.0$. The turbulent flow thermal performance "crosses over" at $w_c=240$ μm. This effect is due to the fact that the fin efficiency for $\alpha=10.01$ is much smaller than that for $\alpha=4.0$ (even though the $\alpha=10.01$ Nusselt number is larger).

Thermal spreading at the edge of an IC heat source can cause significant variation in temperature across an IC. This nonuniformity in temperature can lead to reliability problems owing to thermal stress caused by differential thermal expansion across the IC. Timing problems may also arise because the path lengths between devices will change due to differential thermal expansion. If the IC temperature is more uniform, these problems can be virtually eliminated.

One known method used to make the IC temperature more uniform is to keep the coolant bulk temperature rise as small as possible. The coolant bulk temperature rise can be reduced by increasing the coolant flow rate per unit surfce area V. This can be achieved by increasing the coolant pressure drop for a specified channel width, and by increasing the channel width for a specified coolant pressure drop. The effect of thermal spreading at the heater perimeter can still be a serious problem even if the coolant flow is large.

In the preferred embodiment. a "compensation heater" is used to make the IC temperature more uniform. As shown in FIG. 5, if an IC is sourrounded by a heater with the same heating rate q, then the zone of thermal spreading can be displaced outward from the IC. The heater which surrounds the IC heat source is called a "compensation heater" because it compensates for thermal spreading at the IC heat source perimeter.

Figure 11:
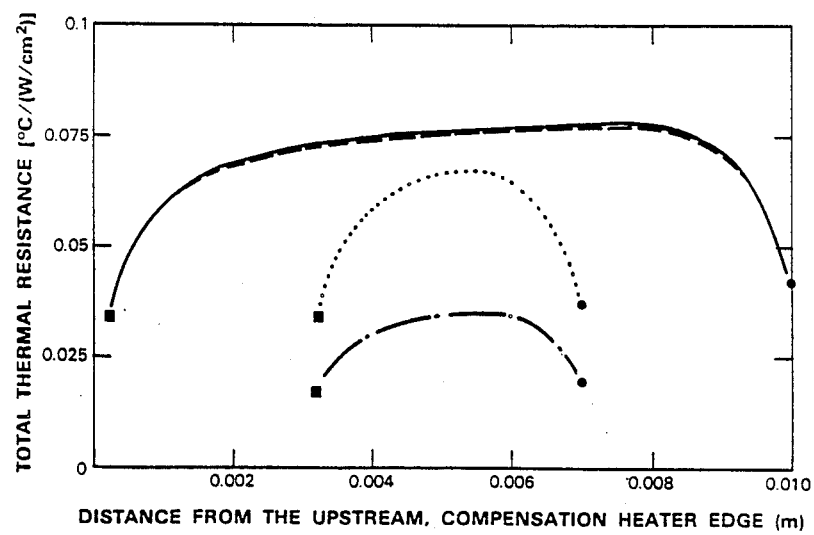
FIG. 11 is a graph of thermal resistance v. distance from the upstream compensation heater edge with and without the compensation heater energized.

FIG. 11 represents the thermal performance prediction obtained by MICROHEX for a comparison of the IC with and without the compensation heater energized. The dotted and solid-dot curves are for the IC without the compensation heater energized, and the solid and dashed curves are for both the IC and the compensation heater energized. The solid and dotted curves are for the center of the IC in the streamwise direction. The dashed and solid-dot curves are for the edge of the IC in the streamwise direction. Note that the effect of the two-dimensional heat transfer near the corners of the IC and the compensation heater has been crudely modeled by superimposing the one-dimensional models for the two directions.

From FIG. 11, it is apparent that the thermal resistance over the region of the IC heat source is much more uniform when the compensation heater is energized. The average total thermal resistance, though, is somewhat larger than when the compensation heater is off. The average thermal resistance is about $R_{tot} = 0.0825$ and $0.05°$ C./(W/cm$^2$) when the compensation heater is on and off, respectively. This means that the inlet coolant temperature would need to be only about 3.0° to 3.5° C. lower when the compensation heater is on (q=100 W/cm$^2$) to maintain the same average surface temperature. In this example, the additional power required for the compensation heater is 2.75 times that of the IC heat source (the IC requires 16 W and the "compensation heater" requires 44 W).

Additional embodiments of the invention are within the scope of the appended claims.

APPENDIX A

```
      REAL DUMMY,COMMAND,LINE
C------------------------------------------------------------
C NOTES TO THE USER FROM THE AUTHOR OF THIS PROGRAM......
C
C THIS COMPUTER PROGRAM HAS BEEN DOCUMENTED BY DEFINING THE ANALYSIS
C VARIABLES IN THE TOP OF EACH SUBROUTINE, AND BY DEFINING THE PRIMARY
C ANALYSIS EQUATIONS THAT ARE BEING USED.  MOST OF THE DOCUMENTATION
C HERE WAS DONE BY THE AUTHOR IN ORDER TO AVOID HIS OWN CONFUSION WHILE
C WRITING AND DEBUGGING THE CODE.  HOPEFULLY YOU WILL FIND IT RELATIVELY
C EASY TO UNDERSTAND THE CODE, BUT BEFORE YOU DO SO, IT PROBABLY WOULD
C BE BEST IF YOU READ THE THESIS TEXT FIRST.  THE AUTHOR IS NOT AWARE OF
C ANY BUGS IN THIS PROGRAM AT THE TIME OF PUBLICATION.  THERE ARE SOME
C TIMES WHEN NUMERICAL ROUNDOFF ERRORS DO SHOW UP, BUT THESE USUALLY
C DISAPPEAR WHEN THE INPUT PARAMETER 'WCSTAR' IS ADJUSTED (USE OF
C INCREMENTS OF TEN APPEAR TO BE MOST ACCURATE (10,20,30,...)).  THE
C AUTHOR WOULD APPRECIATE IT IF ANY COMPUTATIONAL ENHANCEMENTS OR BUGS
C ARE BROUGHT TO HIS ATTENTION, SO THAT OTHER INTERESTED PARTIES MAY BE
C INFORMED.  GOOD LUCK, AND HAPPY PROGRAMMING!
C                                          SINCERELY,
C                                          RICHARD J. PHILLIPS
C                                          16 JAN 87
C
C------------------------------------------------------------
C MICROHEX:  WRITTEN BY RICHARD J. PHILLIPS.  MICROHEX CONTAINS THE
C            INPUT DATA ARRAYS THAT ARE USED TO COMPUTE THE THERMAL-
C            HYDRAULIC PERFORMANCE OF MICROCHANNEL HEAT SINKS.
C------------------------------------------------------------
C DISCRIPTION OF INPUT VARIABLES
C
C NUMBER OF CURVES AND TYPE OF OUTPUT
C
C             NCURVE : NUMBER OF GENERIC DESIGNS TO BE ANALYZED
C             IX     : CONTROL FOR IF CHANNEL WIDTH OR AXIAL POSITION
C                      IS TO BE VARIED.  NOTE THAT THE CALCULATIONS MUST
C                      BE DONE FOR WC=WCSTAR=WCEND.
C                      1 - WC VARIED, OR 2 - X VARIED
C
C HEAT SINK MATERIAL
C                                          TEMP. RANGE OF DATA
C             NSINK  : 1 = GALLIUM ARSENIDE  20. K - 470. K
C                      2 = GERMANIUM         10. K - 500. K
C                      3 = INDIUM PHOSPHIDE  20. K - 500. K
C                      4 = SILICON           10. K - 500. K
C                      5 = ALUMINUM          10. K - 500. K
C                      6 = COPPER            10. K - 500. K
C                      7 = SILVER            10. K - 500. K
C
C TYPE OF LIQUID COOLANT AND INLET TEMPERATURE
C                                          TEMP. RANGE OF DATA
C             NFLUID : 1 = FC-77            273. K - 353. K
C                      2 = FREON            223. K - 323. K
C                      3 = WATER            273. K - 377. K
C             TFLUIN : INLET COOLANT TEMP.  (DEG KELVIN)
C
```

```
C HEATING RATE
C
C              Q        : SURFACE HEATING RATE (W/CM**2)
C
C ANALYSIS METHOD
C
C              ICASE    : 1 = FULLY DEVELOPED LAMINAR FLOW IN SMOOTH
C                             CHANNELS
C                        2 = FULLY DEVELOPED/DEVELOPING LAMINAR AND
C                             TURBULENT FLOW IN SMOOTH CHANNELS
C                        3 = FULLY DEVELOPED TURBULENT FLOW IN REPEATED-
C                             RIB ROUGHENED CHANNELS
C
C GEOMETRICAL PARAMETERS
C
C              WCSTAR   : INITIAL CHANNEL WIDTH (MICRONS)
C              WCEND    : FINAL CHANNEL WIDTH (MICRONS)
C              WCINCR   : INCREMENT IN CHANNEL WIDTH (MICRONS)
C              WWBYWC   : RATIO OF FIN THICKNESS TO CHANNEL WIDTH (-)
C              IZ       : CONTROL FOR WHICH CRITERION USED FOR FIN LENGTH
C                          1 - B, OR 2 - ASPEC
C              B        : FIN HEIGHT (MICRONS)
C              ASPECT   : CHANNEL ASPECT RATIO (-)
C              L        : CHANNEL LENGTH (M)
C              T        : SUBSTRATE HEIGHT (MICRONS)
C
C COOLANT VELOCITY CONSTRAINTS
C
C              IKLOSS   : CONTROL FOR INCLUDING K90, KC, AND KE
C                         0 - NO   1 - YES
C              ICONS    : CONTROL FOR WHICH FLOW CONSTRAINT SHOULD BE USED
C                         1 - DELP, 2 - VOLUME, OR 3 - POWER
C              DELP     : CONSTANT PRESSURE DROP CONSTRAINT (PSI)
C              VOLUME   : CONSTANT VOLUMETRIC FLOW CONSTRAINT((CC/S)/CM*2)
C              POWER    : CONSTANT PUMPING POWER CONSTRAINT (W/CM**2)
C
C ROUGHNESS PARAMETERS
C
C              EBYDE    : RATIO OF REPEATED RIB HEIGHT TO CHANNEL
C                          HYDRAULIC DIAMETER (-)
C              PBYE     : RATIO OF RIB SEPARATION TO RIB HEIGHT (-)
C              PHI      : FLOW ATTACK ANGLE (DEGREES)
C              ZI       : RIB SHAPE ANGLE (DEGREES)
C------------------------------------------------------------------------
C INITIALIZE ARRAYS
      REAL L
      INTEGER WCSTAR,WCEND,WCINCR
      DIMENSION NSINK(5),NFLUID(5),TFLUIN(5),Q(5),ICASE(5),IZ(5),
     1          WCSTAR(5),WCEND(5),WCINCR(5),WWBYWC(5),B(5),ASPECT(5),
     1          L(5),T(5),IKLOSS(5),DELP(5),VOLUME(5),POWER(5),
     1          ICONS(5),EBYDE(5),PBYE(5),PHI(5),ZI(5),
     1          X1(5,2,100),Y1A(5,2,100),Y2(5,2,100),Y3(5,2,100),
     1          IINUM(5,2),Y1B(5,2,100),Y1C(5,2,100),
     1          XX(5,2,100),XSTARX(5,2,100)
C ************ INPUT DATA FOR UP TO FIVE CURVES **********
      DATA NCURVE/1/
      DATA IX    /1/
      DATA ICASE /     2,       0,       0,       0,       0/
      DATA NSINK /     4,       0,       0,       0,       0/
      DATA NFLUID/     3,       0,       0,       0,       0/
      DATA TFLUIN/ 300.0,      0.,      0.,      0.,      0./
      DATA Q     /    0.,      0.,      0.,      0.,      0./
      DATA WCSTAR/     5,       0,       0,       0,       0/
      DATA WCEND /   500,       0,       0,       0,       0/
      DATA WCINCR/     5,       0,       0,       0,       0/
      DATA WWBYWC/   1.0,      0.,      0.,      0.,      0./
      DATA IZ    /     2,       0,       0,       0,       0/
      DATA B     /  0.E-6,  0.E-6,   0.E-6,   0.E-6,   0.E-6/
      DATA ASPECT/    4.,      0.,      0.,      0.,      0./
      DATA L     / .01000,     0.,      0.,      0.,      0./
      DATA T     /100.E-6, 0.E-6,   0.E-6,   0.E-6,   0.E-6/
      DATA IKLOSS/     0,       0,       0,       0,       0/
      DATA ICONS /     1,       0,       0,       0,       0/
```

```
      DATA DELP    /    10.0,      0.,      0.,      0.,      0./
      DATA VOLUME/       0.,      0.,      0.,      0.,      0./
      DATA POWER /       0.,      0.,      0.,      0.,      0./
      DATA EBYDE /       0.,      0.,      0.,      0.,      0./
      DATA PBYE  /       0.,      0.,      0.,      0.,      0./
      DATA PHI   /       0.,      0.,      0.,      0.,      0./
      DATA ZI    /       0.,      0.,      0.,      0.,      0./
C INITIALIZE OUTPUT DATA FILES FOR MICROVAX
      OPEN (UNIT=11, FILE='MICROHEX.OUTPUT1',
     &      ORGANIZATION='SEQUENTIAL', STATUS='NEW')
      OPEN (UNIT=13, FILE='MICROHEX.OUTPUT2',
     &      ORGANIZATION='SEQUENTIAL', STATUS='NEW')
      OPEN (UNIT=15, FILE='MICROHEX.OUTPUT3',
     &      ORGANIZATION='SEQUENTIAL', STATUS='NEW')
      OPEN (UNIT=17, FILE='MICROHEX.OUTPUT4',
     &      ORGANIZATION='SEQUENTIAL', STATUS='NEW')
C DETERMINE EXECUTION TIME (HUMAN CLOCK) FOR MICROVAX
      T1=SECNDS(0.0)
CC PROMPT FOR PLOT OUTPUT DEVICE
C     WRITE(6,10)
C10   FORMAT(
C    &' +------------------------------------+',/,
C    &' + SEND PLOT OUTPUT TO ......        +',/,
C    &' +    0 = DO NOT PLOT RESULTS        +',/,
C    &' +    1 = COMPRS                     +',/,
C    &' +    2 = TEKTRONIX 4015             +',/,
C    &' +    3 = TEKTRONIX 4114             +',/,
C    &' +    4 = BENSON                     +',/,
C    &' +    5 = COMP80                     +',/,
C    &' + MAKE NEGATIVE FOR NO DATA ECHO    +',/,
C    &' + ENTER SELECTION NUMBER AND <CR>   +',/,
C    &' +------------------------------------+')
C     IECHO=1
C     READ(6,*)IPLOT
C     IF(IPLOT.LT.0)IECHO=0
C     IF(IPLOT.LT.0)IPLOT=-1*IPLOT
C     IF(IPLOT.EQ.1)CALL COMPRS
C     IF(IPLOT.EQ.2)CALL TEKALL(4015,480,0,1,0)
C     IF(IPLOT.EQ.3)CALL TEKALL(4114,480,0,1,0)
C     IF(IPLOT.EQ.4)CALL BENSN2(0)
C     IF(IPLOT.EQ.5)CALL COMP80(69,16,0,0,1)
C     IF((IPLOT.NE.0).AND.(IECHO.NE.0))
C    &CALL PINPUT(NCURVE,ICASE,NSINK,NFLUID,TFLUIN,Q,WCSTAR,WCEND,
C    &            WCINCR,WWBYWC,IZ,IX,B,ASPECT,L,T,IKLOSS,
C    &            ICONS,DELP,VOLUME,POWER,EBYDE,PBYE,PHI,ZI)
C LOOP FOR UP TO FIVE CURVES
      DO 100 I=1,NCURVE,1
C        CONVERT W/CM*2 TO W/M*2
         Q(I)=Q(I)*(1.E+4)
C        CONVERT (CC/S)/CM**2 TO (M**3/S)/CM**2
         VOLUME(I)=VOLUME(I)*(1.E-6)
C        CONVERT PSI TO PA
         DELP(I)=DELP(I)*6894.8
         CALL RTOTAL(
     &        I,NSINK(I),NFLUID(I),TFLUIN(I),Q(I),ICASE(I),
     &        WCSTAR(I),WCEND(I),WCINCR(I),WWBYWC(I),B(I),IZ(I),IX,
     &        ASPECT(I),L(I),T(I),IKLOSS(I),ICONS(I),DELP(I),VOLUME(I),
     &        POWER(I),EBYDE(I),PBYE(I),PHI(I),ZI(I),X1,Y1A,Y1B,Y1C,Y2,
     &        Y3,IINUM,XX,XSTARX)
100   CONTINUE
C PLOT OUT RESULTS
C     IF(IPLOT.NE.0)
C    &CALL PPLOTT(X1,Y1A,Y1B,Y1C,Y2,Y3,IINUM,NCURVE,ICASE,IX,XX,XSTARX)
C PRINT OUT EXECUTION TIME (HUMAN TIME) FOR MICROVAX
      DELTA=SECNDS(T1)
      WRITE(5,1000)DELTA
1000  FORMAT(/,' ELAPSED TIME = ',F8.2,' SECONDS',/)
      STOP
      END
C END OF FILE FOR PROGRAM MICROHEX
```

Figure 2:
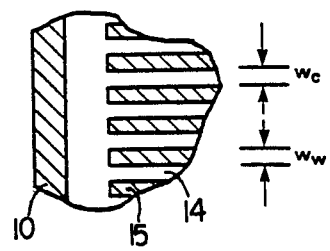
Figure 3:
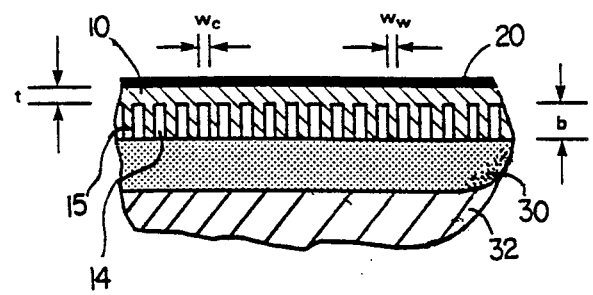

```
C-----------------------------------------------------------------
C ABRUPT:  WRITTEN BY RICHARD J. PHILLIPS.  ABRUPT
C          COMPUTES THE ENTRANCE AND EXIT PRESSURE LOSS COEFFICIENTS.
C          THE POLYNOMIAL EQUATIONS FOR KC AND KE WERE OBTAINED FROM
C          FIGURES 2.10 AND 2.11 USING HP-41C PROGRAMS (SUM)POLYC
C          AND (SUM)LIN.  THE CIRCULAR-TUBE, TURBULENT FLOW EQUATIONS
C          WERE OBTAINED FOR RE=5000, AND THE PARALLEL-PLATE, TURBULENT
C          -FLOW EQUATIONS WERE OBTAINED FOR RE=10000.  NOTE THAT THE
C          POLYNOMIAL EQUATIONS ARE FOR LPLUS=X/DE*RE BECAUSE THE FACTOR
C          OF FOUR HAS BEEN USED TO OBTAIN THE LPLUS = .05, .025, AND
C          .0125 VALUES.
C-----------------------------------------------------------------
C ANALYSIS VARIABLES
C A,AA,AAA . DUMMY CALCULATION VARIABLES                         (-)
C ACBYAP ... RATIO OF FREE-FLOW TO FRONTAL CROSS-SECTIONAL
C              AREAS                                             (-)
C ASPECT ... CHANNEL ASPECT RATIO                                (-)
C IFLOW  ... FLOW REGIME INDICATOR                               (-)
C IKLOSS ... CONTROL FOR INCLUDING K90, KC, AND KE               (-)
C KC     ... ENTRANCE PRESSURE LOSS COEFFICIENT                  (-)
C KCXXX  ... ENTRANCE PRESSURE LOSS COEFFICIENT AT
C              LPLUS=.XXX                                        (-)
C KE     ... EXIT PRESSURE LOSS COEFFICIENT                      (-)
C KEXXX  ... EXIT PRESSURE LOSS COEFFICIENT AT LPLUS=.XXX        (-)
C K90    ... NINETY DEGREE BEND PRESSURE LOSS COEFFICIENT        (-)
C LPLUS  ... HYDRODYNAMIC ENTRY LENGTH                           (-)
C-----------------------------------------------------------------
      SUBROUTINE ABRUPT(ACBYAP,ASPECT,IFLOW,IKLOSS,KC,KE,K90,LPLUS)
      REAL KC,KC05,KC025,KC0125,KE,KE05,KE025,KE0125,K90,LPLUS
C CHECK IF K90, KC, AND KE ARE TO BE ZERO
      IF(IKLOSS.NE.0)GO TO 10
         K90=0.
         KC=0.
         KE=0.
         RETURN
10    CONTINUE
C LOSS COEFFICIENTS ARE TO BE COMPUTED
      K90=1.2
      A=ACBYAP
      AA=A*ACBYAP
      AAA=AA*ACBYAP
C DETERMINE IF CIRCULAR TUBE OR PARALLEL PLATE COEFFICIENTS ARE USED
      IF((ASPECT.LE.0.1).OR.(ASPECT.GE.10.))GO TO 1000
C
C***************
C CIRCULAR TUBES
C***************
C  DETERMINE FLOW REGIME
      IF(IFLOW.EQ.2)GO TO 500
C  LAMINAR FLOW
      IF((LPLUS.LT.0.05).AND.(LPLUS.GE.0.025))GO TO 100
      IF((LPLUS.LT.0.025).AND.(LPLUS.GE.0.0125))GO TO 200
      IF(LPLUS.LT.0.0125)GO TO 300
C  LPLUS>=0.05
      KC=1.0600-0.4000*A
      KE=0.9998-2.6248*A+0.8958*AA+0.0694*AAA
      RETURN
100   CONTINUE
C  0.05<LPLUS>=0.025
      KC05=1.0600-0.4000*A
      KC025=1.0000-0.4000*A
      KE05=0.9998-2.6248*A+0.8958*AA+0.0694*AAA
      KE025=0.9973-2.6089*A+1.0903*AA-0.0810*AAA
      FACTOR=(0.05-LPLUS)/0.025
      KC=(KC025-KC05)*FACTOR+KC05
      KE=(KE025-KE05)*FACTOR+KE05
      RETURN
200   CONTINUE
C  0.025<LPLUS>=0.0125
      KC025=1.0000-0.4000*A
      KC0125=0.8800-0.4000*A
      KE025=0.9973-2.6089*A+1.0903*AA-0.0810*AAA
      KE0125=1.0006-2.4414*A+0.8790*AA+0.0926*AAA
```

```
      FACTOR=(0.025-LPLUS)/0.0125
      KC=(KC0125-KC025)*FACTOR+KC025
      KE=(KE0125-KE025)*FACTOR+KE025
      RETURN
300   CONTINUE
C     LPLUS<0.0125
      KC=0.8800-0.4000*A
      KE=1.0006-2.4414*A+0.8790*AA+0.0926*AAA
      RETURN
500   CONTINUE
C     TURBULENT FLOW
      KC=0.5200-0.4000*A
      KE=1.0000-2.1000*A+1.0000*AA+0.0000*AAA
      K90=(1.70-KC-KE)/(2.*ACBYAP*ACBYAP)
      RETURN
C
1000  CONTINUE
C***************
C     INFINITE PARALLEL PLATES
C***************
C     DETERMINE FLOW REGIME
      IF(IFLOW.EQ.2)GO TO 1500
C     LAMINAR FLOW
      KC=0.7990+0.0392*A-0.4439*AA+0.0058*AAA
      KE=1.0009-2.4356*A+1.1171*AA-0.0810*AAA
      RETURN
1500  CONTINUE
C     TURBULENT FLOW
      KC=0.4604+0.0362*A-0.4841*AA+0.0579*AAA
      KE=0.9993-2.0226*A+0.9152*AA+0.0521*AAA
      RETURN
      END
C END OF FILE FOR SUBROUTINE ABRUPT
C-----------------------------------------------------------------
C SFFD:   WRITTEN BY RICHARD J. PHILLIPS. SFFD COMPUTES THE SMOOTH-
C         CHANNEL COOLANT VELOCITY AND OTHER ANALYSIS VARIABLES
C         ASSUMING FULLY DEVELOPED FLOW FOR ALL CHANNEL WIDTHS.
C-----------------------------------------------------------------
C ANALYSIS VARIABLES
C A       ... INTERMEDIATE DUMMY VARIABLE FOR FIXED PRESSURE
C             DROP CONSTRAINT                                  (M*2/S*2)
C ACBYAP  ... RATIO OF FREE-FLOW TO FRONTAL CROSS-SECTIONAL
C             AREAS                                            (-)
C ASPECT  ... CHANNEL ASPECT RATIO                             (-)
C B,C     ... INTERMEDIATE DUMMY VARIABLES FOR FIXED PRESSURE
C             DROP CONSTRAINT                                  (-)
C DE      ... HYDRAULIC DIAMETER                               (M)
C DELP    ... PRESSURE DROP                                    (N/M*2)
C DUMPHI  ... FRICTION FACTOR CORRECTION FOR CHANNEL SHAPE     (-)
C E       ... INTERMEDIATE DUMMY VARIABLE FOR FIXED PRESSURE
C             DROP CONSTRAINT                                  (S/M)
C FACT    ... VARIABLE PROPERTIES COMPENSATION FACTOR          (-)
C FAPP    ... APPARANT FRICTION FACTOR                         (-)
C ICONS   ... COOLANT FLOW CONSTRAINT                          (-)
C IFLOW   ... FLOW REGIME INDICATOR                            (-)
C IKLOSS  ... CONTROL FOR INCLUDING K90, KC AND KE             (-)
C KC      ... ENTRANCE PRESSURE LOSS COEFFICIENT               (-)
C KE      ... EXIT PRESSURE LOSS COEFFICIENT                   (-)
C K90     ... NINETY DEGREE BEND PRESSURE LOSS COEFFICIENT     (-)
C L       ... CHANNEL LENGTH                                   (M)
C LPLUS   ... HYDRODYNAMIC ENTRY LENGTH                        (-)
C MUFILA  ... AVERAGE COOLANT DYNAMIC VISCOSITY AT THE
C             AVERAGE FIN TEMPERATURE BETWEEN THE
C             CHANNEL ENTRANCE AND EXIT                        (KG/M S)
C MUFLLA  ... AVERAGE COOLANT DYNAMIC VISCOSITY AT THE
C             AVERAGE COOLANT TEMPERATURE BETWEEN THE
C             CHANNEL ENTRANCE AND EXIT                        (KG/M S)
C MUFLUL  ... COOLANT DYNAMIC VISCOSITY AT CHANNEL EXIT        (KG/M S)
C MUFLUX  ... COOLANT DYNAMIC VISCOSITY AT POSITION X          (KG/M S)
C NCHAN   ... NUMBER OF CHANNELS PER CENTIMETER CHIP WIDTH     (-)
C NPARAL  ... NUMBER OF CHANNELS IN SERIES PER CENTIMETER      (-)
C PPOWER  ... PUMPING POWER PER UNIT CIRCUIT SURFACE AREA      (W/CM*2)
C PRFLUL  ... COOLANT PRANDTL NUMBER AT CHANNEL EXIT           (-)
```

```
C PRFLUX ... COOLANT PRANDTL NUMBER AT POSITION X           (-)
C REL     ... REYNOLDS NUMBER AT CHANNEL EXIT               (-)
C REX     ... REYNOLDS NUMBER AT POSITION X                 (-)
C RHOFLL  ... COOLANT DENSITY AT CHANNEL EXIT               (KG/M*3)
C RHOFLX  ... COOLANT DENSITY AT POSITION X                 (KG/M*3)
C V1CL    ... COOLANT FLOW VELOCITY AT CHANNEL EXIT         (M/S)
C V1CX    ... COOLANT FLOW VELOCITY AT POSITION X           (M/S)
C VOLUME  ... COOLANT FLOW RATE PER UNIT
C                 CIRCUIT SURFACE AREA                      ((M*3/S)/CM*2)
C WC      ... CHANNEL WIDTH                                 (M)
C WW      ... FIN WIDTH                                     (M)
C X       ... POSITION FROM CHANNEL ENTRANCE                (M)
C XSTARL  ... THERMAL ENTRY LENGTH AT CHANNEL EXIT          (-)
C XSTARX  ... THERMAL ENTRY LENGTH AT POSITION X            (-)
C Z       ... FIN HEIGHT                                    (M)
C-------------------------------------------------------------------
      SUBROUTINE SFFD(IFLOW,WW,WC,Z,L,X,DE,ASPECT,ACBYAP,
     &                RHOFLL,RHOFLX,MUFLUL,MUFLUX,MUFLLA,MUFILA,
     &                PRFLUL,PRFLUX,IKLOSS,ICONS,DELP,VOLUME,PPOWER,
     &                REL,REX,V1CL,V1CX,LPLUS,FAPP,XSTARL,XSTARX)
      REAL KC,KE,K90,L,LPLUS,MUFLLA,MUFILA,MUFLUL,MUFLUX,NCHAN,NPARAL
C DETERMINE SOLUTION METHOD - NO SOLUTION IS GIVEN FOR FIXED PUMPING
C    POWER
      IF(ICONS.EQ.2)GO TO 200
      IF(ICONS.EQ.3)RETURN
C
C
C                   **********************************
C                   *     PRESSURE DROP FIXED        *
C                   **********************************
C
C NONUNIFORM PROPERTIES - EQN. 2.24
      FACT=(MUFILA/MUFLLA)**0.58
C CORRECTION FOR DUCT SHAPE - EQN. 2.3
      DUMPHI=(2./3.)+(11./24.)*(WC/Z)*(2.-(WC/Z))
      CALL ABRUPT(ACBYAP,ASPECT,IFLOW,IKLOSS,KC,KE,K90,9999.)
C COMPUTE REYNOLDS NUMBER - EQN. 4.18
      A=DELP*2.*1./RHOFLL
      B=((ACBYAP*ACBYAP*2.*K90)+(KC+KE))
      C=(4.*L/DE)*(16./DUMPHI)*FACT
      E=RHOFLL*DE/MUFLUL
      IF(IKLOSS.NE.0)
     &REL=((-1.*C)+((C*C)+(4.*A*B*E*E)))/(2.*B)
      IF(IKLOSS.EQ.0)
     &REL=A*E*E/C
C COMPUTE MISC. STUFF
      V1CL=REL/E
      V1CX=V1CL*RHOFLL/RHOFLX
      REX=RHOFLX*V1CX*DE/MUFLUX
      XSTARL=L/(DE*REL*PRFLUL)
      XSTARX=X/(DE*REX*PRFLUX)
      LPLUS=L/(DE*REL)
C COMPUTE FULLY DEVELOPED FRICTION FACTOR
      FAPP=(16./(DUMPHI*REL))*FACT
C COMPUTE FLOW STUFF
      NCHAN=0.01/(WW+WC)
      NPARAL=0.01/L
      VOLUME=(V1CL*WC*Z)*(NCHAN*NPARAL)
      PPOWER=DELP*VOLUME
      RETURN
C
C
C                   **********************************
C                   * VOLUMETRIC FLOW RATE FIXED     *
C                   **********************************
C
200   CONTINUE
C NONUNIFORM PROPERTIES - EQN. 2.24
      FACT=(MUFILA/MUFLLA)**0.58
C CORRECTION FOR DUCT SHAPE - EQN. 2.3
      DUMPHI=(2./3.)+(11./24.)*(WC/Z)*(2.-(WC/Z))
      CALL ABRUPT(ACBYAP,ASPECT,IFLOW,IKLOSS,KC,KE,K90,9999.)
C COMPUTE COOLANT VELOCITY - EQN. 4.19
      V1CL=VOLUME*10000.*L*(WW+WC)/(WC*Z)
```

```
C COMPUTE MISC. STUFF
      REL=RHOFLL*V1CL*DE/MUFLUL
      V1CX=V1CL*RHOFLL/RHOFLX
      REX=RHOFLX*V1CX*DE/MUFLUX
      XSTARL=L/(DE*REL*PRFLUL)
      XSTARX=X/(DE*REX*PRFLUX)
      LPLUS=L/(DE*REL)
C COMPUTE FULLY DEVELOPED FRICTION FACTOR
      FAPP=(16./(DUMPHI*REL))*FACT
C COMPUTE PRESSURE DROP - EQN. 2.9
      DELP=(RHOFLL*V1CL*V1CL/2.)*
     &  ((ACBYAP*ACBYAP*2.*K90)+(KC+KE)+(4.*FAPP*FACT*L/DE))
      PPOWER=DELP*VOLUME
      RETURN
      END
C END OF FILE FOR SUBROUTINE SFFD
C-----------------------------------------------------------------------
C  SLAMF:  WRITTEN BY RICHARD J. PHILLIPS. SLAMF COMPUTES THE
C          SMOOTH-CHANNEL COOLANT VELOCITY AND SOME OTHER ANALYSIS
C          VARIABLES FOR FULLY DEVELOPED/DEVELOPING LAMINAR FLOW.
C-----------------------------------------------------------------------
C ANALYSIS VARIABLES
C A       ... INTERMEDIATE DUMMY VARIABLE FOR FIXED PRESSURE
C                DROP CONSTRAINT                              (M*2/S*2)
C ACBYAP  ... RATIO OF FREE-FLOW TO FRONTAL CROSS-SECTIONAL
C                AREAS                                        (-)
C ASPEC   ... ARRAY OF CHANNEL ASPECT RATIOS FOR FAPRE        (-)
C ASPECT  ... CHANNEL ASPECT RATIO(FIN LENGTH/CHANNEL WIDTH)  (-)
C B1,B2   ... Y - INTERCEPTS FOR LPLUS LOCATION               (-)
C B,C     ... INTERMEDIATE DUMMY VARIABLES FOR FIXED PRESSURE
C                DROP CONSTRAINT                              (-)
C DE      ... CHANNEL HYDRAULIC DIAMETER                      (M)
C DELP    ... PRESSURE DROP                                   (N/M*2)
C DUMF    ... ARRAY OF INTERMEDIATE FAPPRE VALUES             (-)
C E       ... INTERMEDIATE DUMMY VARIABLE FOR FIXED PRESSURE
C                DROP CONSTRAINT                              (S/M)
C ELARGE  ... ERROR OF EQUATION 4.18 USING VLARGE             (-)
C EMED    ... ERROR OF EQUATION 4.18 USING VMED               (-)
C ERROR   ... RELATIVE ERROR BETWEEN VLARGE AND VSMALL        (-)
C ESMALL  ... ERROR OF EQUATION 4.18 USING VSMALL             (-)
C FACT    ... VARIABLE PROPERTIES COMPENSATION FACTOR         (-)
C FACTOR  ... INTERPOLATION DUMMY VARIABLE                    (-)
C FAPP    ... APPARANT FRICTION FACTOR                        (-)
C FAPRE   ... APPARANT FRICTION FACTOR AND RE PRODUCT DATA    (-)
C FAPPRE  ... FLOW APPARANT FRICTION FACTOR AND RE PRODUCT    (-)
C ICONS   ... COOLANT FLOW CONSTRAINT                         (-)
C IFLOW   ... FLOW REGIME INDICATOR                           (-)
C IKLOSS  ... CONTROL FOR INCLUDING K90, KC, AND KE           (-)
C KC      ... ENTRANCE PRESSURE LOSS COEFFICIENT              (-)
C KE      ... EXIT PRESSURE LOSS COEFFICIENT                  (-)
C K90     ... NINETY DEGREE BEND PRESSURE LOSS COEFFICIENT    (-)
C L       ... CHANNEL LENGTH                                  (M)
C LLPLUS  ... ARRAY OF MOMENTUM ENTRY LENGTH DATA FOR FAPRE   (-)
C LOOP    ... DUMMY COUNTER                                   (-)
C LPLUS   ... MOMENTUM ENTRY LENGTH                           (-)
C MUFILA  ... AVERAGE COOLANT DYNAMIC VISCOSITY AT THE
C                AVERAGE FIN TEMPERATURE BETWEEN THE
C                CHANNEL ENTRANCE AND EXIT                    (KG/M S)
C MUFLLA  ... AVERAGE COOLANT DYNAMIC VISCOSITY AT THE
C                AVERAGE COOLANT TEMPERATURE BETWEEN THE
C                CHANNEL ENTRANCE AND EXIT                    (KG/M S)
C MUFLUL  ... COOLANT DYNAMIC VISCOSITY AT CHANNEL EXIT       (KG/M S)
C MUFLUX  ... COOLANT DYNAMIC VISCOSITY AT POSITION X         (KG/M S)
C NCHAN   ... NUMBER OF CHANNELS PER CENTIMETER CHIP WIDTH    (-)
C NPARAL  ... NUMBER OF CHANNELS IN SERIES PER CENTIMETER
C                CHIP LENGTH                                  (-)
C PPOWER  ... PUMPING POWER PER UNIT CIRCUIT SURFACE AREA     (W/CM*2)
C PRFLUL  ... COOLANT PRANDTL NUMBER AT CHANNEL EXIT          (-)
C PRFLUX  ... COOLANT PRANDTL NUMBER AT POSITION X            (-)
C REL     ... REYNOLDS NUMBER AT CHANNEL EXIT                 (-)
C REX     ... REYNOLDS NUMBER AT POSITION X                   (-)
C RE1,RE2 ... ARRAYS OF INTERMEDIATE REYNOLDS NUMBERS
C                FOR LOCATION OF THE APPROPRIATE LPLUS        (-)
```

```
C RHOFLL  ... COOLANT DENSITY AT CHANNEL EXIT              (KG/M*3)
C RHOFLX  ... COOLANT DENSITY AT POSITION X                (KG/M*3)
C SLOPE1,2.. SLOPES FOR LPLUS LOCATION                     (-)
C V1CL    ... COOLANT FLOW VELOCITY AT CHANNEL EXIT        (M/S)
C V1CX    ... COOLANT FLOW VELOCITY AT POSITION X          (M/S)
C VLARGE  ... HIGH ESTIMATE OF COOLANT VELOCITY            (M/S)
C VMED    ... NEW ESTIMATE OF COOLANT VELOCITY             (M/S)
C VOLUME  ... COOLANT FLOW RATE PER UNIT SURFACE AREA      (M*3/CM*2)
C VSMALL  ... LOW ESTIMATE OF COOLANT VELOCITY             (M/S)
C WC      ... CHANNEL WIDTH                                (M)
C WW      ... FIN THICKNESS                                (M)
C X       ... POSITION FROM CHANNEL ENTRANCE               (M)
C XSTARL  ... THERMAL ENTRY LENGTH AT CHANNEL EXIT         (-)
C XSTARX  ... THERMAL ENTRY LENGTH AT POSITION X           (-)
C Z       ... FIN HEIGHT                                   (M)
C-----------------------------------------------------------------
      SUBROUTINE SLAMF(IFLOW,WW,WC,Z,L,X,DE,ASPECT,ACBYAP,
     &            RHOFLL,RHOFLX,MUFLUL,MUFLUX,MUFLLA,MUFILA,
     &            PRFLUL,PRFLUX,IKLOSS,ICONS,DELP,VOLUME,PPOWER,
     &            REL,REX,V1CL,V1CX,LPLUS,FAPP,XSTARL,XSTARX)
      DIMENSION FAPRE(5,19),DUMF(19),LLPLUS(19),ASPEC(5),RE1(19),RE2(19)
      REAL L,X90,KC,KE,LLPLUS,LPLUS,MUFLUL,MUFLUX,MUFLLA,MUFILA,
     &     NCHAN,NPARAL
C DATA FOR FAPRE, LLPLUS, AND ASPEC WERE OBTAINED FROM TABLE 2.5.
      DATA FAPRE/
     &       287.,142.,142.,142.,287.,
     &       112.,111.,111.,111.,112.,
     &       67.5,66.0,66.0,66.1,67.5,
     &       53.0,51.8,51.8,52.5,53.0,
     &       46.2,44.6,44.6,45.3,46.2,
     &       42.1,39.9,40.0,40.6,42.1,
     &       40.4,38.0,38.2,38.9,40.4,
     &       35.6,32.1,32.5,33.3,35.6,
     &       32.4,28.6,29.1,30.2,32.4,
     &       29.7,24.6,25.3,26.7,29.7,
     &       28.2,22.4,23.2,24.9,28.2,
     &       27.4,21.0,21.8,23.7,27.4,
     &       27.1,20.0,20.8,22.9,26.8,
     &       26.9,19.3,20.1,22.4,26.4,
     &       26.7,18.7,19.6,22.0,26.1,
     &       26.5,18.2,19.1,21.7,25.8,
     &       26.2,17.8,18.8,21.4,25.6,
     &       24.7,15.8,17.0,20.1,24.7,
     &       24.0,14.2,15.5,19.1,24.0/
      DATA LLPLUS/0.0000001,.001,.003,.005,.007,.009,.01,.015,
     &       .02,.03,.04,.05,.06,.07,.08,.09,.10,0.20,1./
      DATA ASPEC/0.1,1.,2.,5.,10./
C INTERPOLATION BETWEEN COLUMNS OF FAPPRE AT PROPER CHANNEL ASPECT RATIO
C
      IF(ASPECT.GT.ASPEC(1))GO TO 10
C  SMALL ASPECT RATIO CHANNELS
      DO 5 II=1,19
         DUMF(II)=FAPRE(1,II)
5     CONTINUE
      GO TO 50
10    CONTINUE
      IF(ASPECT.LT.ASPEC(5))GO TO 20
C  LARGE ASPECT RATIO CHANNELS
      DO 15 II=1,19
         DUMF(II)=FAPRE(5,II)
15    CONTINUE
      GO TO 50
C MODERATE ASPECT RATIO CHANNELS
20    CONTINUE
      DO 30 I=1,4
         IF((ASPECT.GE.ASPEC(I)).AND.(ASPECT.LT.ASPEC(I+1)))GO TO 40
30    CONTINUE
40    CONTINUE
      FACTOR=(ASPECT-ASPEC(I))/(ASPEC(I+1)-ASPEC(I))
      DO 45 II=1,19
         DUMF(II)=FACTOR*(FAPRE(I+1,II)-FAPRE(I,II))+FAPRE(I,II)
45    CONTINUE
50    CONTINUE
C
```

```
C DETERMINE COOLANT FLOW RATE CONSTRAINT
C  1) DELP FIXED
         IF(ICONS.EQ.1)GO TO 1000
C  2) VOLUME FIXED
         IF(ICONS.EQ.2)GO TO 2000
C  3) POWER FIXED
         IF(ICONS.EQ.3)GO TO 3000
1000  CONTINUE
C
C                *********************************
C                *    PRESSURE DROP FIXED        *
C                *********************************
C
C     THE APPROPRIATE LPLUS WILL BE LOCATED WHERE RE1 AND RE2 ARE THE
C     SAME. IN GENERAL, IF LPLUS IS TOO SMALL, RE1 WILL BE LARGER THAN
C     RE2.  WHEN THE NEXT VALUE OF LPLUS RESULTS IN A RE1 THAT IS LESS
C     THAN RE2, THE CORRECT VALUE OF LPLUS HAS BEEN BRACKETED.
C
C
C  NONUNIFORM PROPERTIES - EQN. 2.24
         FACT=(MUFILA/MUFLLA)**0.58
         DO 200 I=1,19,1
C           DETERMINE ENTRANCE AND EXIT PRESSURE LOSS COEFFICIENTS
            CALL ABRUPT(ACBYAP,ASPECT,IFLOW,IKLOSS,KC,KE,K90,LLPLUS(I))
C           RE1(I) IS DETERMINED DIRECTLY FROM LLPLUS(I)
            RE1(I)=(L/DE)/LLPLUS(I)
C           RE2(I) IS OBTAINED FROM EQUATION 4.18 AT LLPLUS(I). NOTE THAT
C           V**2=A/(B+C/(EV))
C  COMPUTE REYNOLDS NUMBER - EQN. 4.18
            A=DELP*2.*1./RHOFLL
            B=(ACBYAP*ACBYAP*2.*K90)+(KC+KE)
            C=(4.*L/DE)*(DUMF(I)*FACT)
            E=RHOFLL*DE/MUFLUL
            IF(IKLOSS.NE.0)
     &         RE2(I)=((-1.*C)+SQRT((C*C)+(4.*A*B*E*E)))/(2.*B)
            IF(IKLOSS.EQ.0)
     &         RE2(I)=A*E*E/C
            IF(RE2(I).GT.RE1(I))GO TO 300
200      CONTINUE
C
C     IF THE PROGRAM GETS TO THIS POINT, RE1 AND RE2 DO NOT CROSS. THIS
C     CAN ONLY HAPPEN IF THE FLOW IS FULLY DEVELOPED.
C
C        IF(I.EQ.19)WRITE(11,202)
202      FORMAT(' CHECK THAT FLOW IS FULLY DEVELOPED AT EXIT')
         REL=RE2(19)
         LPLUS=L/(DE*REL)
         FAPPRE=DUMF(19)
         GO TO 350
300      CONTINUE
C
C     RE1 AND RE2 HAVE CROSSED. GENERATE LINEAR CURVES TO FIND THE
C     INTERSECTION. THIS IS DONE WITH 1/LPLUS SO THAT LINEAR
C     INTERPOLATION GIVES MORE ACCURATE RESULTS AT LARGE LPLUS VALUES.
C     THE RESULTS AT SMALL LPLUS'S DON'T APPEAR TO BE AFFECTED BY THE
C     INTERPOLATION METHOD.
C
         SLOPE1=(RE1(I)-RE1(I-1))/(1./LLPLUS(I)-1./LLPLUS(I-1))
         SLOPE2=(RE2(I)-RE2(I-1))/(1./LLPLUS(I)-1./LLPLUS(I-1))
         B1=RE1(I)-SLOPE1/LLPLUS(I)
         B2=RE2(I)-SLOPE2/LLPLUS(I)
         LPLUS=(B2-B1)/(SLOPE1-SLOPE2)
         LPLUS=1./LPLUS
C  INTERPOLATE AT APPROXIMATE INTERSECTION POINT
         FAPPRE=((LPLUS-LLPLUS(I-1))/(LLPLUS(I)-LLPLUS(I-1)))
     &          *(DUMF(I)-DUMF(I-1))+DUMF(I-1)
         REL=(L/DE)/LPLUS
C
350      CONTINUE
C  COMPUTE MISC. STUFF
         FAPP=FAPPRE/REL
         V1CL=(REL*MUFLUL)/(RHOFLL*DE)
         V1CX=V1CL*RHOFLL/RHOFLX
```

```
      REX=RHOFLX*V1CX*DE/MUFLUX
      XSTARL=L/(DE*REL*PRFLUL)
      XSTARX=X/(DE*REX*PRFLUX)
C COMPUTE FLOW STUFF
      NCHAN=0.01/(WW+WC)
      NPARAL=0.01/L
      VOLUME=(V1CL*WC*Z)*(NCHAN*NPARAL)
      PPOWER=VOLUME*DELP
      RETURN
C
2000  CONTINUE
C
C                ***********************************
C                *  VOLUMETRIC FLOW RATE FIXED     *
C                ***********************************
C
C COMPUTE COOLANT VELOCITY - EQN. 4.19
      V1CL=VOLUME*10000.*(L*(WW+WC))/(WC*Z)
C COMPUTE MISC. STUFF
      REL=V1CL*RHOFLL*DE/MUFLUL
      LPLUS=(L/DE)/REL
C
C     INTERPOLATE FAPPRE AND THE DESIRED LPLUS
C
      DO 2200 I=1,18
         IF((LPLUS.GE.LLPLUS(I)).AND.(LPLUS.LT.LLPLUS(I+1)))GO TO 2300
2200  CONTINUE
      IF(LPLUS.LT.LLPLUS(1))FAPPRE=DUMF(1)
      IF(LPLUS.GE.LLPLUS(19))FAPPRE=DUMF(19)
      GO TO 2400
2300  CONTINUE
      FAPPRE=((LPLUS-LLPLUS(I))/(LLPLUS(I+1)-LLPLUS(I)))
     &       *(DUMF(I+1)-DUMF(I))+DUMF(I)
2400  CONTINUE
C
C     COMPUTE OTHER NUMBERS
C
      FAPP=FAPPRE/REL
      V1CX=V1CL*RHOFLL/RHOFLX
      REX=RHOFLX*V1CX*DE/MUFLUX
      XSTARL=L/(DE*REL*PRFLUL)
      XSTARX=X/(DE*REX*PRFLUX)
C DETERMINE ENTRANCE AND EXIT PRESSURE LOSS COEFFICIENTS
      CALL ABRUPT(ACBYAP,ASPECT,IFLOW,IKLOSS,KC,KE,K90,LPLUS)
C NONUNIFORM PROPERTIES - EQN. 2.24
      FACT=(MUFILA/MUFLLA)**0.58
C COMPUTE PRESSURE DROP - EQN. 2.9
      DELP=(RHOFLL*V1CL*V1CL/2.)*
     &((ACBYAP*ACBYAP*2.*K90)+(KC+KE)+(4.*FAPP*FACT*L/DE))
C COMPUTE PUMPING POWER
      PPOWER=VOLUME*DELP
      RETURN
C
3000  CONTINUE
C
C                ***********************************
C                *     PUMPING POWER FIXED         *
C                ***********************************
C
C   THE APPROPRIATE LPLUS WILL BE LOCATED WHERE RE1 AND RE2 ARE THE
C   SAME.  IN GENERAL, IF LPLUS IS TOO SMALL, RE1 WILL BE LARGER THAN
C   RE2.  WHEN THE NEXT VALUE OF LPLUS RESULTS IN A RE1 THAT IS LESS
C   THAN RE2, THE CORRECT VALUE OF LPLUS HAS BEEN BRACKETED.
C
C NONUNIFORM PROPERTIES - EQN. 2.24
      FACT=(MUFILA/MUFLLA)**0.58
      DO 3200 I=1,19,1
C        DETERMINE ENTRANCE AND EXIT PRESSURE LOSS COEFFICIENTS
         CALL ABRUPT(ACBYAP,ASPECT,IFLOW,IKLOSS,KC,KE,K90,LLPLUS(I))
C        RE1(I) IS DETERMINED DIRECTLY FROM LLPLUS(I)
         RE1(I)=(L/DE)/LLPLUS(I)
C        RE2(I) IS OBTAINED FROM EQUATION 4.20 AT LLPLUS(I).
C        NOTE THAT V**3=A/(B+C/(EV))
```

```
C COMPUTE REYNOLDS NUMBER - EQN. 4.20
        A=(PPOWER*10000.*2.*1./RHOFLL)*(L*(WW+WC)/(WC*Z))
        B=(ACBYAP*ACBYAP*2.*K90)+(KC+KE)
        C=(4.*L/DE)*(DUMF(I)*FACT)
        E=RHOFLL*DE/MUFLUL
        IF(IKLOSS.EQ.0)
        RE2(I)=SQRT(A*E*E*E/C)
        IF(IKLOSS.EQ.0)GO TO 3190
C
C       TRIAL AND ERROR SOLUTION FOR V1C AT LLPLUS(I). NOTE THAT
C       EQUATION 4.20 GIVES V**3=A/(B+C/(EV)),
C       AND ERROR=B*V**3+(C/E)*V**2-A.
C
C       VLARGE: ASSUMES K90=KC=KE=0.
        VLARGE=SQRT(A*E/C)
        ELARGE=(VLARGE*VLARGE*VLARGE*B)+(VLARGE*VLARGE*C/E)-A
C       INITIAL GUESS OF VSMALL IS VERY SMALL
        VSMALL=0.00001
        ESMALL=(VSMALL*VSMALL*VSMALL*B)+(VSMALL*VSMALL*C/E)-A
C
C       NOTE THAT VSMALL GIVES RHS<0, AND VLARGE GIVES RHS>0, AND
C       THEREFORE THE SOLUTION IS SOMEWHERE BETWEEN.
C
        LOOP=0
3110    CONTINUE
        LOOP=LOOP+1
        IF(LOOP.EQ.20)STOP
        VMED=(VLARGE+VSMALL)/2.
        EMED=(VMED*VMED*VMED*B)+(VMED*VMED*C/E)-A
        IF(EMED.GT.0.)GO TO 3150
C       UPDATE VSMALL
        VSMALL=VMED
        ERROR=ABS((VLARGE-VSMALL)/VMED)
        IF(ERROR.LT.0.0001)GO TO 3155
        ESMALL=EMED
        GO TO 3110
C       UPDATE VLARGE
3150    CONTINUE
        VLARGE=VMED
        ERROR=ABS((VLARGE-VSMALL)/VMED)
        IF(ERROR.LT.0.0001)GO TO 3155
        ELARGE=EMED
        GO TO 3110
3155    CONTINUE
C
C       THE COOLANT VELOCITY IS APPROXIMATELY KNOWN FOR THIS LLPLUS(I)
C
        RE2(I)=RHOFLL*DE*((VLARGE+VSMALL)/2.)/MUFLUL
3190    CONTINUE
        IF(RE2(I).GT.RE1(I))GO TO 3220
3200    CONTINUE
C
C       IF THE PROGRAM GETS TO THIS POINT, RE1 AND RE2 DO NOT CROSS. THIS
C       CAN ONLY HAPPEN IF THE FLOW IS FULLY DEVELOPED.
C
C       IF(I.EQ.19)WRITE(11,3202)
3202    FORMAT(' CHECK THAT FLOW IS FULLY DEVELOPED AT EXIT')
        REL=RE2(19)
        LPLUS=L/(DE*REL)
        FAPPRE=DUMF(19)
        GO TO 3350
3220    CONTINUE
C
C   RE1 AND RE2 HAVE CROSSED. GENERATE LINEAR CURVES TO FIND THE
C   INTERSECTION. THIS IS DONE WITH 1/LPLUS SO THAT LINEAR
C   INTERPOLATION GIVES MORE ACCURATE RESULTS AT LARGE LPLUS VALUES.
C   THE RESULTS AT SMALL LPLUS'S DON'T APPEAT TO BE AFFECTED BY THE
C   INTERPOLATION METHOD.
C
        SLOPE1=(RE1(I)-RE1(I-1))/(1./LLPLUS(I)-1./LLPLUS(I-1))
        SLOPE2=(RE2(I)-RE2(I-1))/(1./LLPLUS(I)-1./LLPLUS(I-1))
        B1=RE1(I)-SLOPE1/LLPLUS(I)
        B2=RE2(I)-SLOPE2/LLPLUS(I)
        LPLUS=(B2-B1)/(SLOPE1-SLOPE2)
        LPLUS=1./LPLUS
```

```
C      INTERPOLATE AT APPROXIMATE INTERSECTION POINT
       FAPPRE=((LPLUS-LLPLUS(I-1))/(LLPLUS(I)-LLPLUS(I-1)))
     &        *(DUMF(I)-DUMF(I-1))+DUMF(I-1)
       REL=(L/DE)/LPLUS
C
C      COMPUTE OTHER NUMBERS
C
3350   CONTINUE
C COMPUTE MISC. STUFF
       CALL ABRUPT(ACBYAP,ASPECT,IFLOW,IKLOSS,KC,KE,K90,LPLUS)
       FAPP=FAPPRE/REL
       V1CL=(REL*MUFLUL)/(RHOFLL*DE)
       V1CX=V1CL*RHOFLL/RHOFLX
       REX=RHOFLX*V1CX*DE/MUFLUX
       XSTARL=L/(DE*REL*PRFLUL)
       XSTARX=X/(DE*REX*PRFLUX)
C COMPUTE COOLANT FLOW STUFF
       DELP=(RHOFLL*V1CL*V1CL/2.)*((ACBYAP*ACBYAP*2.*K90)+(KC+KE)
     &                           +(4.*FAPP*FACT*L/DE))
       NCHAN=0.01/(WW+WC)
       NPARAL=0.01/L
       VOLUME=(V1CL*WC*Z)*(NCHAN*NPARAL)
       RETURN
       END
C END OF FILE FOR SUBROUTINE SLAMF
C-----------------------------------------------------------------------
C STURF: WRITTEN BY RICHARD J. PHILLIPS. STURF COMPUTES THE
C         SMOOTH-CHANNEL COOLANT VELOCITY AND SOME OTHER ANALYSIS
C         VARIABLES FOR FULLY DEVELOPED/DEVELOPING TURBULENT FLOW.
C-----------------------------------------------------------------------
C ANALYSIS VARIABLES
C A1,A2,A3.. DUMMY ANALYSIS VARIABLES FOR EQUATION 4.18    (-)
C A,B    ... DUMMY ANALYSIS PARAMETERS FOR EQUATION 2.6    (-)
C ACBYAP ... RATIO OF CHANNEL AND PLENUM CROSS-SECTIONAL
C               AREAS                                      (-)
C ASPECT ... CHANNEL ASPECT RATIO                          (-)
C DE     ... CHANNEL HYDRAULIC DIAMETER                    (M)
C DELP   ... ASSUMED CHANNEL PRESSURE LOSS                 (N/M*2)
C DLE    ... LAMINAR EQUIVALENT DIAMETER (ONLY FOR RESTAR) (-)
C ELARGE ... ERROR OF EQUATION 4.18 USING VLARGE           (-)
C EMED   ... ERROR OF EQUATION 4.18 USING VMED             (-)
C ERROR  ... RELATIVE ERROR BETWEEN VLARGE AND VSMALL      (-)
C ESMALL ... ERROR OF EQUATION 4.18 USING VSMALL           (-)
C FACT   ... VARIABLE PROPERTIES COMPENSATION FACTOR       (-)
C FAPP   ... APPARANT FRICTION FACTOR                      (-)
C ICONS  ... CONTROL FOR WHICH FLOW CONSTRAINT IS USED     (-)
C IFLOW  ... ACTIVE LOOP INDICATOR FOR FLOW REGIME         (-)
C IKLOSS ... CONTROL FOR INCLUDING K90, KC, AND KE         (-)
C KC     ... ENTRANCE PRESSURE LOSS COEFFICIENT            (-)
C KE     ... EXIT PRESSURE LOSS COEFFICIENT                (-)
C K90    ... NINETY DEGREE BEND PRESSURE LOSS COEFFICIENT  (-)
C L      ... CHANNEL LENGTH                                (M)
C LOOP   ... DUMMY COUNTER                                 (-)
C LPLUS  ... MOMENTUM ENTRY LENGTH                         (-)
C MUFILA ... AVERAGE COOLANT DYNAMIC VISCOSITY AT THE
C               AVERAGE FIN TEMPERATURE BETWEEN THE
C               CHANNEL ENTRANCE AND EXIT                  (KG/M S)
C MUFLLA ... AVERAGE COOLANT DYNAMIC VISCOSITY AT THE
C               AVERAGE COOLANT TEMPERATURE BETWEEN THE
C               CHANNEL ENTRANCE AND EXIT                  (KG/M S)
C MUFLUL ... COOLANT DYNAMIC VISCOSITY AT CHANNEL EXIT     (KG/M S)
C MUFLUX ... COOLANT DYNAMIC VISCOSITY AT POSITION X       (KG/M S)
C NCHAN  ... NUMBER OF CHANNELS PER CENTIMETER CHIP WIDTH  (-)
C NPARAL ... NUMBER OF CHANNELS IN SERIES PER CENTIMETER
C               CHIP LENGTH                                (-)
C PPOWER ... COOLANT PUMPING POWER PER UNIT SURFACE AREA   (W/CM*2)
C PRFLUL ... COOLANT PRANDTL NUMBER AT CHANNEL EXIT        (-)
C PRFLUX ... COOLANT PRANDTL NUMBER AT POSITION X          (-)
C REL    ... REYNOLDS NUMBER AT CHANNEL EXIT               (-)
C REX    ... REYNOLDS NUMBER AT POSITION X                 (-)
C RESTAL ... MODIFIED REYNOLDS NUMBER AT CHANNEL EXIT      (-)
C RESTAX ... MODIFIED REYNOLDS NUMBER AT POSITION X        (-)
C RHOFLL ... COOLANT DENSITY AT CHANNEL EXIT               (KG/M*3)
C RHOFLX ... COOLANT DENSITY AT POSITION X                 (KG/M*3)
C V1CL   ... COOLANT FLOW VELOCITY AT CHANNEL EXIT         (M/S)
```

```
C VICX    ... COOLANT FLOW VELOCITY AT POSITION X              (M/S)
C VLARGE  ... HIGH ESTIMATE OF COOLANT VELOCITY                (M/S)
C VMED    ... NEW ESTIMATE OF COOLANT VELOCITY                 (M/S)
C VOLUME  ... COOLANT FLOW RATE PER UNIT SURFACE AREA          (M*3/CM*2)
C VSMALL  ... LOW ESTIMATE OF COOLANT VELOCITY                 (M/S)
C WC      ... CHANNEL WIDTH                                    (M)
C WW      ... FIN THICKNESS                                    (M)
C X       ... POSITION FROM CHANNEL ENTRANCE                   (M)
C XSTARL  ... THERMAL ENTRY LENGTH AT CHANNEL EXIT             (-)
C XSTARX  ... THERMAL ENTRY LENGTH AT POSITION X               (-)
C Z       ... FIN LENGTH                                       (M)
C---------------------------------------------------------------------
      SUBROUTINE STURF(IFLOW,WW,WC,Z,L,X,DE,DLE,ASPECT,ACBYAP,
     1                 RHOFLL,RHOFLX,MUFLUL,MUFLUX,MUFLLA,MUFILA,
     1                 PRFLUL,PRFLUX,IKLOSS,ICONS,DELP,VOLUME,PPOWER,
     1                 REL,REX,RESTAL,RESTAX,V1CL,V1CX,LPLUS,FAPP,
     1                 XSTARL,XSTARX)
      REAL L,K90,KC,KE,LPLUS,MUFLUL,MUFLUX,MUFLLA,MUFILA,NCHAN,NPARAL
C
C DETERMINE COOLANT FLOW RATE CONSTRAINT
C  1) DELP FIXED
      IF(ICONS.EQ.1)GO TO 1000
C  2) VOLUME FIXED
      IF(ICONS.EQ.2)GO TO 2000
C  3) PUMPING POWER FIXED
      IF(ICONS.EQ.3)GO TO 3000
1000  CONTINUE
C
C
C           **********************************
C           *      PRESSURE DROP FIXED       *
C           **********************************
C
C DETERMINE ENTRANCE AND EXIT PRESSURE LOSS COEFFICIENTS
      CALL ABRUPT(ACBYAP,ASPECT,IFLOW,IKLOSS,KC,KE,K90,LPLUS)
C NONUNIFORM PROPERTIES - EQN. 2.24
      FACT=(MUFILA/MUFLLA)**0.25
C FRICTION FACTOR - EQN. 2.6 - REMEMBER THAT B IS NEGATIVE
      A=0.09290+(1.01612/(L/DE))
      B=0.26800+(0.31930/(L/DE))
C     CONSTANTS FOR PRESSURE DROP EQUATION 4.18
C     NOTE THAT V**2=(A1)/(A2+A3*V**(-B))
      A1=DELP*2.*1./RHOFLL
      A2=(ACBYAP*ACBYAP*2.*K90)+(KC+KE)
      A3=(4.*L/DE)*A/((RHOFLL*DLE/MUFLUL)**B)
      IF(IKLOSS.EQ.0)V1CL=(A1/A3)**(1./(2.-B))
      IF(IKLOSS.EQ.0)GO TO 300
C
C     TRIAL AND ERROR ESTIMATION OF V1CL
C     EQUATION 4.18 GIVES V**2=(A1)/(A2+A3*V**(-B))
C     WHICH CAN BE REARRANGED TO (V**2)*A2+(V**(2-B))*A3-A1=0.
C
C     VLARGE: ASSUMES K90=KC=KE=0.
      VLARGE=(A1/A3)**(1./(2.-B))
      ELARGE=(VLARGE*VLARGE*A2)+((VLARGE**(2.-B))*A3)-A1
C     INITIAL GUESS OF VSMALL IS VERY SMALL
      VSMALL=0.00001
      ESMALL=(VSMALL*VSMALL*A2)+((VSMALL**(2.-B))*A3)-A1
C
C     NOTE THAT VSMALL GIVES RHS<0, AND VLARGE GIVES RHS>0, THEREFORE
C     THE SOLUTION IS SOMEWHERE BETWEEN.
C
      LOOP=0
100   CONTINUE
      LOOP=LOOP+1
      IF(LOOP.EQ.20)STOP
      VMED=(VLARGE+VSMALL)/2.
      EMED=(VMED*VMED*A2)+((VMED**(2.-B))*A3)-A1
      IF(EMED.GT.0.)GO TO 200
C     UPDATE VSMALL
      VSMALL=VMED
      ERROR=ABS((VLARGE-VSMALL)/VMED)
      IF(ERROR.LT.0.00001)GO TO 300
      ESMALL=EMED
      GO TO 100
200   CONTINUE
```

```
C       UPDATE VLARGE
        VLARGE=VMED
        ERROR=ABS((VLARGE-VSMALL)/VMED)
        IF(ERROR.LT.0.00001)GO TO 300
        ELARGE=EMED
        GO TO 100
300     CONTINUE
        IF(IKLOSS.NE.0)V1CL=(VLARGE+VSMALL)/2.
C
C       THE COOLANT VELOCITY IS APPROXIMATELY KNOWN
C
C COMPUTE MISC. STUFF
        REL=RHOFLL*V1CL*DE/MUFLUL
        RESTAL=RHOFLL*V1CL*DLE/MUFLUL
C       REMEMBER THAT B IS NEGATIVE
        FAPP=A/(RESTAL**B)
        LPLUS=(L/DE)/REL
        V1CX=V1CL*RHOFLL/RHOFLX
        REX=RHOFLX*V1CX*DE/MUFLUX
        RESTAX=RHOFLX*V1CX*DLE/MUFLUX
        XSTARL=L/(DE*REL*PRFLUL)
        XSTARX=X/(DE*REX*PRFLUX)
C COMPUTE FLOW STUFF
        NCHAN=0.01/(WW+WC)
        NPARAL=0.01/L
        VOLUME=(V1CL*WC*Z)*(NCHAN*NPARAL)
        PPOWER=VOLUME*DELP
        RETURN
C
2000    CONTINUE
C
C                   ******************************
C                   * VOLUMETRIC FLOW RATE FIXED *
C                   ******************************
C
C NONUNIFORM PROPERTIES - EQN. 2.24
        FACT=(MUFILA/MUFLLA)**0.25
C COMPUTE COOLANT VELOCITY - EQN. 4.19
        V1CL=VOLUME*10000.*(L*(WW+WC))/(WC*Z)
C COMPUTE MISC. STUFF
        REL=V1CL*RHOFLL*DE/MUFLUL
        RESTAL=V1CL*RHOFLL*DLE/MUFLUL
        LPLUS=(L/DE)/REL
        V1CX=V1CL*RHOFLL/RHOFLX
        REX=RHOFLX*V1CX*DE/MUFLUX
        RESTAX=RHOFLX*V1CX*DLE/MUFLUX
        XSTARL=L/(DE*REL*PRFLUL)
        XSTARX=X/(DE*REX*PRFLUX)
C DETERMINE ENTRANCE AND EXIT PRESSURE LOSS COEFFICIENTS
        CALL ABRUPT(ACBYAP,ASPECT,IFLOW,IKLOSS,KC,KE,K90,LPLUS)
C DETERMINE APPARENT FRICTION FACTOR - EQN. 2.6
        A=0.09290+(1.01612/(L/DE))
        B=0.26800+(0.31930/(L/DE))
C       REMEMBER THAT B IS NEGATIVE
        FAPP=A/(RESTAL**B)
C DETERMINE PRESSURE DROP - EQN. 2.9
        DELP=(RHOFLL*V1CL*V1CL/2.)*
       &(((ACBYAP**2.)*2.*K90)+(KC+KE)+(4.*FAPP*FACT*L/DE))
        PPOWER=VOLUME*DELP
        RETURN
3000    CONTINUE
C
C                   ******************************
C                   *    PUMPING POWER FIXED     *
C                   ******************************
C
C DETERMINE ENTRANCE AND EXIT PRESSURE LOSS COEFFICIENTS
        CALL ABRUPT(ACBYAP,ASPECT,IFLOW,IKLOSS,KC,KE,K90,LPLUS)
C NONUNIFORM PROPERTIES - EQN. 2.24
        FACT=(MUFILA/MUFLLA)**0.25
C COMPUTE FRICTION FACTOR - EQN. 2.6 - REMEMBER THAT B IS NEGATIVE
        A=0.09290+(1.01612/(L/DE))
        B=0.26800+(0.31930/(L/DE))
C CONSTANTS FOR PRESSURE DROP EQUATION 4.20
```

```
C       NOTE THAT V**3=(A1)/(A2+A3*V**(-B))
        A1=(PPOWER*2.*1./RHOFLL)*(10000.*L*(WW+WC)/(WC*Z))
        A2=(ACBYAP*ACBYAP*2.*K90)+(KC+KE)
        A3=(4.*L/DE)*A/((RHOFLL*DLE/MUFLUL)**B)
        IF(IKLOSS.EQ.0)V1CL=(A1/A3)**(1./(3.-B))
        IF(IKLOSS.EQ.0)GO TO 3300
C
C       TRIAL AND ERROR ESTIMATION OF V1C
C       EQUATION 4.20 GIVES V**3=(A1)/(A2+A3*V**(-B))
C       WHICH CAN BE REARRANGED TO (V**3)*A2+(V**(3-B))*A3-A1=0
C
C       VLARGE: ASSUMES K90=KC=KE=0.
        VLARGE=(A1/A3)**(1./(3.-B))
        ELARGE=(VLARGE*VLARGE*VLARGE*A2)+((VLARGE**(3.-B))*A3)-A1
C       INITIAL GUESS OF VSMALL IS VERY SMALL
        VSMALL=0.00001
        ESMALL=(VSMALL*VSMALL*VSMALL*A2)+((VSMALL**(3.-B))*A3)-A1
C
C       NOTE THAT VSMALL GIVES RHS<0, AND VLARGE GIVES RHS>0, THEREFORE
C       THE SOLUTION IS SOMEWHERE BETWEEN.
C
        LOOP=0
3100    CONTINUE
        LOOP=LOOP+1
        IF(LOOP.EQ.20)STOP
        VMED=(VLARGE+VSMALL)/2.
        EMED=(VMED*VMED*VMED*A2)+((VMED**(3.-B))*A3)-A1
        IF(EMED.GT.0.)GO TO 3200
C       UPDATE VSMALL
        VSMALL=VMED
        ERROR=ABS((VLARGE-VSMALL)/VMED)
        IF(ERROR.LT.0.00001)GO TO 3300
        ESMALL=EMED
        GO TO 3100
3200    CONTINUE
C       UPDATE VLARGE
        VLARGE=VMED
        ERROR=ABS((VLARGE-VSMALL)/VMED)
        IF(ERROR.LT.0.00001)GO TO 3300
        ELARGE=EMED
        GO TO 3100
3300    CONTINUE
        IF(IKLOSS.NE.0)V1CL=(VLARGE+VSMALL)/2.
C
C       THE COOLANT VELOCITY IS APPROXIMATELY KNOWN
C
C COMPUTE MISC. STUFF
        REL=RHOFLL*V1CL*DE/MUFLUL
        RESTAL=RHOFLL*V1CL*DLE/MUFLUL
        V1CX=V1CL*RHOFLL/RHOFLX
        REX=RHOFLX*V1CX*DE/MUFLUX
        RESTAX=RHOFLX*V1CX*DLE/MUFLUX
        XSTARL=L/(DE*REL*PRFLUL)
        XSTARX=X/(DE*REX*PRFLUX)
        LPLUS=(L/DE)/REL
C COMPUTE FRICTION FACTOR - EQN. 2.6 - REMEMBER THAT B IS NEGATIVE
        FAPP=A/(RESTAL**B)
        CALL ABRUPT(ACBYAP,ASPECT,IFLOW,IKLOSS,KC,KE,K90,LPLUS)
C COMPUTE PRESSURE DROP - EQN. 2.9
        DELP=(RHOFLL*V1CL*V1CL/2.)*((ACBYAP*ACBYAP*2.*K90)+(KC+KE)
     &                              +(4.*FAPP*FACT*L/DE))
C COMPUTE VOLUMETRIC FLOW RATE
        NCHAN=0.01/(WW+WC)
        NPARAL=0.01/L
        VOLUME=(V1CL*WC*Z)*(NCHAN*NPARAL)
        RETURN
        END
C END OF FILE FOR SUBROUTINE STURF
C-----------------------------------------------------------------------
C  RTURF:  WRITTEN BY RICHARD J. PHILLIPS.  RTURF COMPUTES THE REPEATED-
C          RIB ROUGHENED CHANNEL COOLANT VELOCITY AND SOME OTHER
C          VARIABLES FOR TURBULENT FLOW.
C-----------------------------------------------------------------------
C ANALYSIS VARIABLES
C A1,A2,
```

```
C    A3,A4... DUMMY VARIABLES FOR TERMS OF EQUATION 2.16     (-)
C ACBYAP ... RATIO OF CHANNEL AND PLENUM CROSS-SECTIONAL
C              AREAS                                          (-)
C ASPECT ... CHANNEL ASPECT RATIO                             (-)
C DE     ... CHANNEL HYDRAULIC DIAMETER                       (M)
C DELP   ... ASSUMED CHANNEL PRESSURE LOSS                    (N/M*2)
C EBYDE  ... RATIO OF RIB HEIGHT TO EQUIVALENT DIAMETER       (-)
C EPLUS  ... ROUGHNESS REYNOLDS NUMBER                        (-)
C EPLUS1 ... PREVIOUS ROUGHNESS REYNOLDS NUMBER               (-)
C ERROR  ... RELATIVE ERROR IN ROUGHNESS REYNOLDS NUMBER      (-)
C F0     ... SMOOTH CHANNEL FRICTION FACTOR                   (-)
C F1     ... ONE SIDE ROUGHENED FRICTION FACTOR               (-)
C F2     ... BOTH SIDES ROUGHENED FRICTION FACTOR             (-)
C FACT   ... VARIABLE PROPERTIES COMPENSATION FACTOR          (-)
C FAPP   ... APPARANT FRICTION FACTOR                         (-)
C ICONS  ... CONTROL FOR WHICH FLOW CONSTRAINT IS USED        (-)
C IFLOW  ... ACTIVE LOOP INDICATOR FOR FLOW REGIME            (-)
C IKLOSS ... CONTROL FOR INCLUDING K90, KC, AND KE            (-)
C IRETUR ... CONTROL VARIABLE FOR OUT OF RANGE DATA           (-)
C KC     ... ENTRANCE PRESSURE LOSS COEFFICIENT               (-)
C KE     ... EXIT PRESSURE LOSS COEFFICIENT                   (-)
C K90    ... NINETY DEGREE BEND PRESSURE LOSS COEFFICIENT     (-)
C L      ... CHANNEL LENGTH                                   (M)
C LOOP   ... DUMMY COUNTER                                    (-)
C LPLUS  ... MOMENTUM ENTRY LENGTH                            (-)
C MUFILA ... AVERAGE COOLANT DYNAMIC VISCOSITY AT THE
C              AVERAGE FIN TEMPERATURE BETWEEN THE
C              CHANNEL ENTRANCE AND EXIT                      (KG/M S)
C MUFLLA ... AVERAGE COOLANT DYNAMIC VISCOSITY AT THE
C              AVERAGE COOLANT TEMPERATURE BETWEEN THE
C              CHANNEL ENTRANCE AND EXIT                      (KG/M S)
C MUFLUL ... COOLANT DYNAMIC VISCOSITY AT CHANNEL EXIT        (KG/M S)
C MUFLUX ... COOLANT DYNAMIC VISCOSITY AT POSITION X          (KG/M S)
C PBYE   ... RATIO OF RIB SEPARATION TO RIB HEIGHT            (-)
C PHI    ... REPEATED-RIB FLOW ATTACK ANGLE                   (DEGREES)
C PPOWER ... COOLANT PUMPING POWER PER UNIT SURFACE AREA      (W/CM*2)
C PRFLUL ... COOLANT PRANDTL NUMBER AT CHANNEL EXIT           (-)
C PRFLUX ... COOLANT PRANDTL NUMBER AT POSITION X             (-)
C REPLUS ... ROUGHNESS FUNCTION                               (-)
C REL    ... REYNOLDS NUMBER AT CHANNEL EXIT                  (-)
C REX    ... REYNOLDS NUMBER AT POSITION X                    (-)
C RHOFLL ... COOLANT DENSITY AT CHANNEL EXIT                  (KG/M*3)
C RHOFLX ... COOLANT DENSITY AT POSITION X                    (KG/M*3)
C RESTAL ... MODIFIED REYNOLDS NUMBER AT CHANNEL EXIT         (-)
C RESTAX ... MODIFIED REYNOLDS NUMBER AT POSITION X           (-)
C V1CL   ... COOLANT FLOW VELOCITY AT CHANNEL EXIT            (M/S)
C V1CX   ... COOLANT FLOW VELOCITY AT POSITION X              (M/S)
C VOLUME ... COOLANT FLOW RATE PER UNIT SURFACE AREA          (M*3/CM*2)
C WC     ... CHANNEL WIDTH                                    (M)
C WW     ... FIN THICKNESS                                    (M)
C X      ... POSITION FROM CHANNEL ENTRANCE                   (M)
C XSTARL ... THERMAL ENTRY LENGTH AT CHANNEL EXIT             (-)
C XSTARX ... THERMAL ENTRY LENGTH AT POSITION X               (-)
C Z      ... FIN LENGTH                                       (M)
C ZI     ... REPEATED-RIB SHAPE ANGLE                         (DEGREES)
C-----------------------------------------------------------------------
      SUBROUTINE RTURF(IFLOW,WW,WC,Z,L,X,DE,DLE,ASPECT,ACBYAP,
     &                RHOFLL,RHOFLX,MUFLUL,MUFLUX,MUFLLA,MUFILA,
     &                PRFLUL,PRFLUX,IKLOSS,ICONS,DELP,VOLUME,PPOWER,
     &                REL,REX,V1CL,V1CX,RESTAL,RESTAX,LPLUS,F1,F2,FAPP,
     &                XSTARL,XSTARX,IRETUR,EBYDE,PBYE,ZI,PHI)
      REAL L,K90,KC,KE,LPLUS,MUFLUL,MUFLUX,MUFLLA,MUFILA
C
C CHECK IF CORRECT ASPECT RATIO
C
      IF((ASPECT.GT.0.1).AND.(ASPECT.LT.10.))RETURN
C
C DETERMINE COOLANT FLOW RATE CONSTRAINT
C  1) DELP FIXED
      IF(ICONS.EQ.1)RETURN
C  2) VOLUME FIXED
      IF(ICONS.EQ.2)GO TO 10
C  3) PUMPING POWER FIXED
      IF(ICONS.EQ.3)RETURN
C
```

```
10      CONTINUE
C
C                    *********************************
C                    * VOLUMETRIC FLOW RATE FIXED *
C                    *********************************
C
C COMPUTE COOLANT VELOCITY - EQN. 4.19
        V1CL=VOLUME*10000.*(L*(WW+WC))/(Z*WC)
        REL=V1CL*RHOFLL*DE/MUFLUL
        LPLUS=(L/DE)/REL
C CHECK IF THE VARIABLES ARE WITHIN THE VALID RANGE
        IRETUR=0
        IF((REL.LT.3000.).OR.(REL.GT.30000))IRETUR=1
        IF((EBYDE.LT.0.032).OR.(EBYDE.GT.0.102))IRETUR=1
        IF(IRETUR.EQ.1)RETURN
C
C       BOTH SIDES ROUGHENED FRICTION FACTOR OBTAINED USING EQUATION 2.16
C
C FOLLOW STUFF FROM EQN. 2.16
        A1=(PHI/90.)**0.35
        IF(PBYE.LT.10.)A2=1./((10./PBYE)**0.13)
        IF(PBYE.GE.10.)A2=(10./PBYE)**(0.53*((ZI/90.)**0.71))
        A3=(ZI/45.)**0.57
C ASSUME EPLUS >= 35
        A4=4.9
        REPLUS=A4/(A1*A2*A3)
        F2=2./((REPLUS-(2.5*ALOG(2.*EBYDE))-3.75)**2.)
        EPLUS=EBYDE*REL*SQRT(F2/2.)
C CHECK ASSUMPTION ON EPLUS
        IF(EPLUS.GE.35.)GO TO 500
C
C       ASSUMPTION ON EPLUS WAS WRONG - USE TRIAL AND ERROR TO OBTAIN
C       THE CORRECT VALUE OF EPLUS.
C
        LOOP=0
100     CONTINUE
        LOOP=LOOP+1
        IF(LOOP.GT.20)STOP
        EPLUS1=EPLUS
        A4=4.9/((EPLUS1/35.)**0.4)
        REPLUS=A4/(A1*A2*A3)
        F2=2./((REPLUS-(2.5*ALOG(2.*EBYDE))-3.75)**2.)
        EPLUS=EBYDE*REL*SQRT(F2/2.)
C       CHECK ERROR
        ERROR=ABS((EPLUS-EPLUS1)/EPLUS1)
        IF(ERROR.GT.0.0001)GO TO 100
500     CONTINUE
C
C       APPARENT FRICTION FACTOR IS APPROXIMATELY KNOWN
C
        FAPP=F2
C DETERMINE ENTRANCE AND EXIT PRESSURE LOSS COEFFICIENTS
        CALL ABRUPT(ACBYAP,ASPECT,IFLOW,IKLOSS,KC,KE,K90,LPLUS)
C NONUNIFORM PROPERTIES - EQN. 2.24
        FACT=(MUFILA/MUFLLA)**0.25
        IF(ASPECT.GE.10.)GO TO 1000
C SMALL ASPECT RATIO DUCT PRESSURE DROP - ONLY ONE SIDE IS ROUGHENED
C USE INSTEAD, EQUATIONS 2.17 AND 2.18.
        F0=0.079/(REL**0.25)
        F1=F0+(F2-F0)/2.
        FAPP=F1
1000    CONTINUE
C COMPUTE PRESSURE DROP - EQN. 2.9
        DELP=(RHOFLL*V1CL*V1CL/2.)*
     *((ACBYAP*ACBYAP*2.*K90)+(KC+KE)+(4.*FAPP*FACT*L/DE))
        PPOWER=VOLUME*DELP
C COMPUTE MISC. STUFF
        V1CX=V1CL*RHOFLL/RHOFLX
        REX=RHOFLX*V1CX*DE/MUFLUX
        RESTAL=RHOFLL*V1CL*DLE/MUFLUL
        RESTAX=RHOFLX*V1CX*DLE/MUFLUX
        XSTARL=L/(DE*REL*PRFLUL)
        XSTARX=X/(DE*REX*PRFLUX)
        RETURN
        END
```

C END OF FILE FOR SUBROUTINE RTURF
C----------------------------------------------------------------
C SNUFD:   WRITTEN BY RICHARD J. PHILLIPS.  SFFD COMPUTES THE SMOOTH-
C          CHANNEL NUSSELT NUMBER ASSUMING FULLY DEVELOPED FLOW ALWAYS.
C----------------------------------------------------------------
C ANALYSIS VARIABLES
C ASPECT  ... CHANNEL ASPECT RATIO(FIN LENGTH/CHANNEL WIDTH)(-)
C FACT    ... VARIABLE PROPERTIES COMPENSATION FACTOR        (-)
C IRETUR  ... CONTROL VARIABLE FOR OUT OF RANGE PROP. DATA   (-)
C MUFILA  ... AVERAGE COOLANT DYNAMIC VISCOSITY AT THE
C             AVERAGE FIN TEMPERATURE BETWEEN THE
C             CHANNEL ENTRANCE AND EXIT                     (KG/M S)
C MUFIXA  ... AVERAGE COOLANT DYNAMIC VISCOSITY AT THE
C             AVERAGE FIN TEMPERATURE BETWEEN THE
C             CHANNEL ENTRANCE AND POSITION X               (KG/M S)
C MUFLLA  ... AVERAGE COOLANT DYNAMIC VISCOSITY AT THE
C             AVERAGE COOLANT TEMPERATURE BETWEEN THE
C             CHANNEL ENTRANCE AND EXIT                     (KG/M S)
C MUFLXA  ... AVERAGE COOLANT DYNAMIC VISCOSITY AT THE
C             AVERAGE COOLANT TEMPERATURE BETWEEN THE
C             CHANNEL ENTRANCE AND POSITION X               (KG/M S)
C NUL     ... NUSSELT NUMBER AT CHANNEL EXIT                (-)
C NUX     ... NUSSELT NUMBER AT CHANNEL POSITION X          (-)
C NUTL    ... NUSSELT NUMBER AT CHANNEL EXIT INCUDING
C             EFFECT OF NONUNIFORM COOLANT TEMPERATURE      (-)
C NUTX    ... NUSSELT NUMBER AT CHANNEL POSITION X INCUDING
C             EFFECT OF NONUNIFORM COOLANT TEMPERATURE      (-)
C----------------------------------------------------------------
      SUBROUTINE SNUFD(ASPECT,NUL,NUX,NUTL,NUTX,
     &                MUFILA,MUFIXA,MUFLLA,MUFLXA,IRETUR)
      REAL NUL,NUX,NUTL,NUTX,MUFILA,MUFIXA,MUFLLA,MUFLXA
      IRETUR=0
C INTERPOLATION EQUATIONS FOR FULLY-DEVELOPED FLOW DETERMINED USING
C HP41C PROGRAM (SUM)POLYC, AND TABLE 2.8
      IF(ASPECT.GE.10.)NUL=
     & 8.229-(10.9893/ASPECT)+(14.7321/(ASPECT2.))-(9.75/(ASPECT3.))
      IF((ASPECT.GE.1.).AND.(ASPECT.LT.10.))NUL=
     & 8.227-(14.6284/ASPECT)+(21.5484/(ASPECT2.))-(14.4/(ASPECT3.))
      IF((ASPECT.GE.0.1).AND.(ASPECT.LT.1.0))IRETUR=1
      IF(ASPECT.LT.0.1)NUL=
     & 1.6607+(1.2740/ASPECT)-(0.1954/(ASPECT2.))+(0.01/(ASPECT3.))
      IF(IRETUR.EQ.1)RETURN
C ACCOUNT FOR VARIABLE PROPERTIES - EQN. 2.25
      NUX=NUL
      FACT=(MUFLLA/MUFILA)**0.14
      NUTL=NUL*FACT
      FACT=(MUFLXA/MUFIXA)**0.14
      NUTX=NUX*FACT
      RETURN
      END
C END OF FILE FOR SUBROUTINE SNUFD
C----------------------------------------------------------------
C SLAMNU:  WRITTEN BY RICHARD J. PHILLIPS.  SLAMNU COMPUTES THE SMOOTH
C          CHANNEL FULLY DEVELOPED/DEVELOPING LAMINAR NUSSELT NUMBER.
C----------------------------------------------------------------
C ANALYSIS PARAMETERS
C ASPEC   ... CHANNEL ASPECT RATIO DATA FOR NNUX            (-)
C ASPECT  ... CHANNEL ASPECT RATIO                          (-)
C DUMNUX  ... ARRAY OF DEVELOPING-FLOW, LAMINAR NUSSELT
C             NUMBERS AT ASPECT.                            (-)
C F3TO4   ... RATIO OF FULLY-DEVELOPED 3-SIDE AND 4-SIDE
C             HEATED CHANNELS.                              (-)
C FACT    ... PROPERTY RATIO METHOD INTERPOLATION FACTOR    (-)
C FACTOR  ... INTERPOLATION VARIABLE                        (-)
C MUFILA  ... AVERAGE COOLANT DYNAMIC VISCOSITY AT THE
C             AVERAGE FIN TEMPERATURE BETWEEN THE
C             CHANNEL ENTRANCE AND EXIT                     (KG/M S)
C MUFIXA  ... AVERAGE COOLANT DYNAMIC VISCOSITY AT THE
C             AVERAGE FIN TEMPERATURE BETWEEN THE
C             CHANNEL ENTRANCE AND POSITION X               (KG/M S)
C MUFLLA  ... AVERAGE COOLANT DYNAMIC VISCOSITY AT THE
C             AVERAGE COOLANT TEMPERATURE BETWEEN THE
C             CHANNEL ENTRANCE AND EXIT                     (KG/M S)
C MUFLXA  ... AVERAGE COOLANT DYNAMIC VISCOSITY AT THE
C             AVERAGE COOLANT TEMPERATURE BETWEEN THE

```
C           CHANNEL ENTRANCE AND POSITION X          (KG/M S)
C NNU3  ... FULLY-DEVELOPED, LAMINAR NUSSELT NUMBER DATA
C           FOR 3-SIDED CHANNELS.                    (-)
C NNU4  ... FULLY-DEVELOPED, LAMINAR NUSSELT NUMBER DATA
C           FOR 4-SIDED CHANNELS.                    (-)
C NNUX  ... DEVELOPING-FLOW, LAMINAR NUSSELT NUMBER DATA
C           FOR CHANNELS WITH ALL FOUR SIDES HEATED. (-)
C NU3   ... 3-SIDE HEATED MODERATE ASPECT RATIO DUCT NU (-)
C NU4   ... 4-SIDE HEATED MODERATE ASPECT RATIO DUCT NU (-)
C NUL   ... NUSSELT NUMBER AT CHANNEL EXIT           (-)
C NUX   ... NUSSELT NUMBER AT CHANNEL POSITION X     (-)
C NUTL  ... NUSSELT NUMBER AT CHANNEL EXIT INCUDING
C           EFFECT OF NONUNIFORM COOLANT TEMPERATURE (-)
C NUTX  ... NUSSELT NUMBER AT CHANNEL POSITION X INCUDING
C           EFFECT OF NONUNIFORM COOLANT TEMPERATURE (-)
C WWCBYZ... CHANNEL ASPECT RATIO DATA FOR NNU3 AND NNU4. (-)
C XSTARL... THERMAL ENTRY LENGTH AT CHANNEL EXIT     (-)
C XSTARX... THERMAL ENTRY LENGTH AT POSITION X       (-)
C XTHERM... THERMAL ENTRANCE LENGTH DATA FOR NNUX    (-)
C----------------------------------------------------------------
      SUBROUTINE SLAMNU(ASPECT,MUFLLA,MUFILA,XSTARL,NUL,NUTL,
     &                 MUFLXA,MUFIXA,XSTARX,NUX,NUTX)
      DIMENSION ASPEC(6),NNUX(6,19),XTHERM(19),NNU3(11),NNU4(11),
     &          WWCBYZ(11),DUMNUX(19)
      REAL MUFLLA,MUFLXA,MUFILA,MUFIXA,NUL,NUX,NUTL,NUTX,
     &     NNUX,NU3,NNU3,NU4,NNU4
C DATA FOR NNUX, ASPEC, AND XTHERM OBTAINED FROM TABLE 2.11, AND APPLY
C     FOR FOUR-SIDED CHANNELS WITH ALL FOUR WALLS HEATING DEVELOPING
C     FLOW.
C DATA POINTS BETWEEN 0.005 AND 0. WERE EXPONENTIALLY EXTRAPOLATED TO
C     PROVIDE LESS 'WAVINESS' IN THE RESULTS
      DATA NNUX/
     &       31.6,25.2,23.7,27.0,26.7,31.4,
     &       18.8,15.0,14.7,16.4,16.6,19.3,
     &       15.0,12.0,12.0,13.2,13.6,15.7,
     &       13.2,10.5,10.6,11.7,12.0,13.9,
     &       12.0, 9.6, 9.8,10.7,11.1,12.7,
     &       11.2, 8.9, 9.2, 9.9,10.4,11.9,
     &        9.0,7.10,7.46,8.02,8.44,10.0,
     &        8.8,6.86,7.23,7.76,8.18, 9.8,
     &        8.5,6.60,6.96,7.30,7.92, 9.5,
     &        8.2,6.32,6.68,7.22,7.63, 9.3,
     &        7.9,6.02,6.37,6.92,7.32, 9.1,
     &       7.49,5.69,6.05,6.57,7.00,8.80,
     &        7.2,5.33,5.70,6.21,6.63, 8.6,
     &        6.7,4.91,5.28,5.82,6.26, 8.5,
     &        6.2,4.45,4.84,5.39,5.87, 8.4,
     &        5.9,4.18,4.61,5.17,5.77, 8.3,
     &       5.55,3.91,4.38,5.00,5.62,8.25,
     &        5.4,3.71,4.22,4.85,5.45,8.24,
     &       5.38,3.60,4.11,4.77,5.35,8.23/
      DATA ASPEC/0.1,1.,2.,3.,4.,10./
      DATA XTHERM/0.,.0005,.0010,.0015,.0020,.0025,
     &            .005,.00556,.00625,.00714,.00833,.01,.0125,
     &            .0167,.025,.033,.05,.1,1./
C DATA FOR NNU4, AND WWCBYZ WERE OBTAINED FROM TABLE 2.8, AND ARE
C     FOR FOUR-SIDED CHANNELS WITH ALL FOUR WALLS HEATING FULLY
C     DEVELOPED FLOW.
      DATA NNU4/3.599,3.612,3.655,3.740,3.884,4.111,4.457,4.969,
     &          5.704,6.700,8.235/
      DATA WWCBYZ/1.,1.11,1.25,1.43,1.67,2.,2.5,3.33,5.,10.,9999./
C DATA FOR NNU3, AND WWCBYZ WERE OBTAINED FROM TABLE 2.8, AND ARE
C     FOR FOUR-SIDED CHANNELS WITH THREE WALLS HEATING FULLY
C     DEVELOPED FLOW.
      DATA NNU3/3.556,3.701,3.846,3.991,4.248,4.505,4.885,5.393,
     &          6.072,6.939,8.235/
C
C DETERMINE IF MODERATE ASPECT RATIO DUCT
C
      IF((ASPECT.LE.ASPEC(1)).OR.(ASPECT.GE.ASPEC(6)))GO TO 210
C
C CALCULATE RATIO OF 4-SIDED AND 3-SIDED FULLY DEVELOPED VALUES FOR
C EQUATION 2.12. NOTE THAT NO CORRECTION IS NEEDED FOR LARGE AND
C SMALL ASPECT RATIO CHANNELS.
      DO 100 I=1,10
```

```
        IF((ASPECT.GE.WWCBYZ(I)).AND.(ASPECT.LT.WWCBYZ(I+1)))GO TO 200
100   CONTINUE
200   CONTINUE
      FACTOR=(ASPECT-WWCBYZ(I))/(WWCBYZ(I+1)-WWCBYZ(I))
      NU3=FACTOR*(NNU3(I+1)-NNU3(I))+NNU3(I)
      NU4=FACTOR*(NNU4(I+1)-NNU4(I))+NNU4(I)
      F3TO4=NU3/NU4
210   CONTINUE
C
C INTERPOLATION BETWEEN COLUMNS OF NNUX AT PROPER CHANNEL ASPECT RATIO
C
C  SMALL ASPECT RATIO CHANNELS
      IF(ASPECT.GE.ASPEC(1))GO TO 250
      DO 225 II=1,19
         DUMNUX(II)=NNUX(1,II)
225   CONTINUE
      GO TO 475
250   CONTINUE
      IF(ASPECT.LE.ASPEC(6))GO TO 280
C  LARGE ASPECT RATIO CHANNELS
      DO 275 II=1,19
         DUMNUX(II)=NNUX(6,II)
275   CONTINUE
      GO TO 475
280   CONTINUE
C MODERATE ASPECT RATIO CHANNELS
      DO 300 I=1,5
         IF((ASPECT.GE.ASPEC(I)).AND.(ASPECT.LT.ASPEC(I+1)))GO TO 400
300   CONTINUE
400   CONTINUE
      FACTOR=(ASPECT-ASPEC(I))/(ASPEC(I+1)-ASPEC(I))
      DO 450 II=1,19
         DUMNUX(II)=FACTOR*(NNUX(I+1,II)-NNUX(I,II))+NNUX(I,II)
450   CONTINUE
475   CONTINUE
C
C INTERPOLATION BETWEEN ROWS AT THE CORRECT THERMAL ENTRANCE LENGTH AT
C THE CHANNEL EXIT
C
      DO 500 J=1,18
         IF((XSTARL.GE.XTHERM(J)).AND.(XSTARL.LT.XTHERM(J+1)))GO TO 600
500   CONTINUE
      IF(XSTARL.GE.XTHERM(19))J=19
600   CONTINUE
      IF(J.NE.19)FACTOR=(XSTARL-XTHERM(J))/(XTHERM(J+1)-XTHERM(J))
      IF(J.NE.19)NUL=FACTOR*(DUMNUX(J+1)-DUMNUX(J))+DUMNUX(J)
      IF(J.EQ.19)NUL=DUMNUX(19)
C COMPUTE DEVELOPING-FLOW, LAMINAR NUSSELT NUMBER USING EQUATION 2.12.
      IF((ASPECT.GT.ASPEC(1)).AND.(ASPECT.LT.ASPEC(6)))NUL=NUL*F3TO4
C ACCOUNT FOR NONUNIFORM PROPERTIES - EQN. 2.25
      FACT=(MUFLLA/MUFILA)**0.14
      NUTL=NUL*FACT
C
C INTERPOLATION BETWEEN ROWS AT THE CORRECT THERMAL ENTRANCE LENGTH AT
C POSITION X
C
      DO 700 J=1,18
         IF((XSTARX.GE.XTHERM(J)).AND.(XSTARX.LT.XTHERM(J+1)))GO TO 800
700   CONTINUE
      IF(XSTARX.GE.XTHERM(19))J=19
800   CONTINUE
      IF(J.NE.19)FACTOR=(XSTARX-XTHERM(J))/(XTHERM(J+1)-XTHERM(J))
      IF(J.NE.19)NUX=FACTOR*(DUMNUX(J+1)-DUMNUX(J))+DUMNUX(J)
      IF(J.EQ.19)NUX=DUMNUX(19)
C COMPUTE DEVELOPING-FLOW, LAMINAR NUSSELT NUMBER USING EQUATION 2.12.
      IF((ASPECT.GT.ASPEC(1)).AND.(ASPECT.LT.ASPEC(6)))NUX=NUX*F3TO4
C ACCOUNT FOR NONUNIFORM PROPERTIES - EQN. 2.25
      FACT=(MUFLXA/MUFIXA)**0.14
      NUTX=NUX*FACT
      RETURN
      END
C END OF FILE FOR SUBROUTINE SLAMNU
```

```
C-----------------------------------------------------------------------
C STURNU:  WRITTEN BY RICHARD J. PHILLIPS.  STURNU COMPUTES
C          THE TURBULENT NUSSELT NUMBER FOR FLOW IN A TUBE.
C-----------------------------------------------------------------------
C ANALYSIS VARIABLES
C DE      ... HYDRAULIC DIAMETER                            (M)
C FACT    ... PROPERTY RATIO METHOD INTERPOLATION FACTOR    (-)
C L       ... CHANNEL LENGTH                                (M)
C MUFILA  ... AVERAGE COOLANT DYNAMIC VISCOSITY AT THE
C             AVERAGE FIN TEMPERATURE BETWEEN THE
C             CHANNEL ENTRANCE AND EXIT                     (KG/M S)
C MUFIXA  ... AVERAGE COOLANT DYNAMIC VISCOSITY AT THE
C             AVERAGE FIN TEMPERATURE BETWEEN THE
C             CHANNEL ENTRANCE AND POSITION X               (KG/M S)
C MUFLLA  ... AVERAGE COOLANT DYNAMIC VISCOSITY AT THE
C             AVERAGE COOLANT TEMPERATURE BETWEEN THE
C             CHANNEL ENTRANCE AND EXIT                     (KG/M S)
C MUFLXA  ... AVERAGE COOLANT DYNAMIC VISCOSITY AT THE
C             AVERAGE COOLANT TEMPERATURE BETWEEN THE
C             CHANNEL ENTRANCE AND POSITION X               (KG/M S)
C NUL     ... NUSSELT NUMBER AT CHANNEL EXIT                (-)
C NUX     ... NUSSELT NUMBER AT CHANNEL POSITION X          (-)
C NUTL    ... NUSSELT NUMBER AT CHANNEL EXIT INCUDING
C             EFFECT OF NONUNIFORM COOLANT TEMPERATURE      (-)
C NUTX    ... NUSSELT NUMBER AT CHANNEL POSITION X INCUDING
C             EFFECT OF NONUNIFORM COOLANT TEMPERATURE      (-)
C PRFLUL  ... COOLANT PRANDTL NUMBER AT CHANNEL EXIT        (-)
C PRFLUX  ... COOLANT PRANDTL NUMBER AT POSITION X          (-)
C REL     ... REYNOLDS NUMBER AT CHANNEL EXIT               (-)
C REX     ... REYNOLDS NUMBER AT POSITION X                 (-)
C X       ... POSITION FROM CHANNEL ENTRANCE                (M)
C-----------------------------------------------------------------------
      SUBROUTINE STURNU(MUFLLA,MUFILA,PRFLUL,REL,NUL,NUTL,
     &                  MUFLXA,MUFIXA,PRFLUX,REX,NUX,NUTX,DE,L,X)
      REAL MUFLLA,MUFLXA,MUFILA,MUFIXA,NUL,NUX,NUTL,NUTX,L
C DITTUS - BOELTER EQUATION
C     NUL=0.023*((REL)**0.8)*(PRFLUL**0.4)
C SIMPLIFIED GNIELINSKI CORRELATION FOR 1.5<PR<500. - EQN. 2.15
      IF(REL.LE.650.)NUL=1.0
      IF(REL.GT.650.)NUL=0.012*((REL**0.87)-280.)*(PRFLUL**0.4)
C NEXT LINE ACCOUNTS FOR DEVELOPING TURBULENT NUSSELT NUMBER
C     NUL=NUL*(1.+(DE/L)**(2./3.))
C ACCOUNT FOR NONUNIFORM PROPERTIES - EQN. 2.25
      FACT=(MUFLLA/MUFILA)**0.11
      NUTL=NUL*FACT
C DITTUS - BOELTER EQUATION
C     NUX=0.023*((REX)**0.8)*(PRFLUX**0.4)
C SIMPLIFIED GNIELINSKI CORRELATION FOR 1.5<PR<500. - EQN. 2.15
      IF(REX.LE.650.)NUX=1.0
      IF(REX.GT.650.)NUX=0.012*((REX**0.87)-280.)*(PRFLUX**0.4)
C NEXT LINE ACCOUNTS FOR DEVELOPING TURBULENT NUSSELT NUMBER
C     NUX=NUX*(1.+(DE/X)**(2./3.))
C ACCOUNT FOR NONUNIFORM PROPERTIES - EQN. 2.25
      FACT=(MUFLXA/MUFIXA)**0.11
      NUTX=NUX*FACT
      RETURN
      END
C END OF FILE FOR SUBROUTINE STURNU
C-----------------------------------------------------------------------
C RTURNU:  WRITTEN BY RICHARD J. PHILLIPS.  RTURNU COMPUTES THE NUSSELT
C          NUMBER FOR REPEATED-RIB ROUGHENED CHANNELS.
C-----------------------------------------------------------------------
C ANALYSIS PARAMETERS
C A1,A2,A3.. DUMMY VARIABLES FOR TERMS OF EQUATION 2.19     (-)
C ASPECT  ... CHANNEL ASPECT RATIO                          (-)
C EBYDE   ... RATIO OF RIB HEIGHT TO EQUIVALENT DIAMETER    (-)
C EPLUS   ... ROUGHNESS REYNOLDS NUMBER                     (-)
C F2      ... BOTH SIDES ROUGHENED FRICTION FACTOR          (-)
C FACT    ... PROPERTY RATIO METHOD INTERPOLATION FACTOR    (-)
C HEPLUS  ... HEAT TRANSFER FUNCTION                        (-)
C MUFILA  ... AVERAGE COOLANT DYNAMIC VISCOSITY AT THE
C             AVERAGE FIN TEMPERATURE BETWEEN THE
C             CHANNEL ENTRANCE AND EXIT                     (KG/M S)
C MUFLLA  ... AVERAGE COOLANT DYNAMIC VISCOSITY AT THE
C             AVERAGE COOLANT TEMPERATURE BETWEEN THE
```

```
C                CHANNEL ENTRANCE AND EXIT                  (KG/M S)
C NUL     ... NUSSELT NUMBER AT CHANNEL EXIT                (-)
C NUX     ... NUSSELT NUMBER AT CHANNEL POSITION X          (-)
C NUTL    ... NUSSELT NUMBER AT CHANNEL EXIT INCUDING
C             EFFECT OF NONUNIFORM COOLANT TEMPERATURE      (-)
C NUTX    ... NUSSELT NUMBER AT CHANNEL POSITION X INCUDING
C             EFFECT OF NONUNIFORM COOLANT TEMPERATURE      (-)
C PRFLUL  ... COOLANT PRANDTL NUMBER AT CHANNEL EXIT        (-)
C REL     ... REYNOLDS NUMBER AT CHANNEL EXIT               (-)
C REPLUS  ... ROUGHNESS FUNCTION                            (-)
C STANTO  ... AVERAGE STANTON NUMBER                        (-)
C ZI      ... REPEATED-RIB SHAPE ANGLE                      (DEGREES)
C-----------------------------------------------------------------------
      SUBROUTINE RTURNU(ASPECT,EBYDE,ZI,MUFLLA,MUFILA,PRFLUL,REL,F2,
     &                 NUL,NUTL,NUX,NUTX)
      REAL MUFLLA,MUFILA,NUL,NUX,NUTL,NUTX
C
C CHECK IF CORRECT ASPECT RATIO
C
      IF((ASPECT.GT.0.1).AND.(ASPECT.LT.10.))RETURN
C COMPUTE STANTON NUMBER - EQN. 2.19
      EPLUS=EBYDE*REL*SQRT(F2/2.)
      REPLUS=(SQRT(2./F2))+(2.5*ALOG(2.*EBYDE))+3.75
      IF(ZI.LT.45.)A1=(ZI/45.)**0.5
      IF(ZI.GE.45.)A1=1./((ZI/45.)**0.45)
      IF(EPLUS.LT.35.)A2=10.
      IF(EPLUS.GE.35.)A2=10.*((EPLUS/35.)**0.28)
      A3=(0.72/PRFLUL)**0.57
      HEPLUS=A2/(A1*A3)
      STANTO=(F2/2.)/(((HEPLUS-REPLUS)*SQRT(F2/2.))+1.)
C COMPUTE NUSSELT NUMBER - EQN. 2.20
      NUL=STANTO*REL*PRFLUL
      NUX=NUL
C ACCOUNT FOR NONUNIFORM PROPERTIES - EQN 2.25
      FACT=(MUFLLA/MUFILA)**0.11
      NUTL=NUL*FACT
      NUTX=NUTL
      RETURN
      END
C END OF FILE FOR SUBROUTINE RTURNU
C-----------------------------------------------------------------------
C PROPER: WRITTEN BY RICHARD J. PHILLIPS.  PROPER
C         CALLS THE APPRIATE SUBROUTINES TO INITIALIZE THE COOLANT
C         AND SUBSTRATE MATERIAL PROPERTY DATA ARRAYS.
C-----------------------------------------------------------------------
C ANALYSIS VARIABLES
C CPFF    ... COOLANT SPECIFIC HEAT DATA                    (J/KG DEG K)
C FLUID   ... ALPHANUMERIC FOR COOLANT TYPE                 (-)
C KFF     ... COOLANT THERMAL CONDUCTIVITY DATA             (W/M DEG K)
C KWW     ... SUBSTRATE THERMAL CONDUCTIVITY DATA           (W/M DEG K)
C MUFF    ... COOLANT DYNAMIC VISCOSITY DATA                (KG/M S)
C NFLUID  ... COOLANT IDENTIFIER NUMBER                     (-)
C             1)  FC-77
C             2)  FREON
C             3)  WATER
C NPROPF  ... NUMBER OF COOLANT DATA ENTRIES                (-)
C NPROPW  ... NUMBER OF SUBSTRATE MATERIAL DATA ENTRIES     (-)
C NSINK   ... SUBSTRATE MATERIAL INDENTIFIER NUMBER         (-)
C             1)  GALLIUM ARSENIDE
C             2)  GERMANIUM
C             3)  INDIUM PHOSPHIDE
C             4)  SILICON
C             5)  ALUMINUM
C             6)  COPPER
C             7)  SILVER
C PRFF    ... COOLANT PRANDTL NUMBER DATA                   (-)
C RHOFF   ... COOLANT DENSITY DATA                          (KG/M*3)
C SINK    ... ALPHANUMERIC FOR SUBSTRATE TYPE               (-)
C TPROPF  ... TEMPERATURES FOR FLUID PROPERTY DATA          (DEG K)
C TPROPW  ... TEMPERATURES FOR SUBSTRATE PROPERTY DATA      (DEG K)
C-----------------------------------------------------------------------
      SUBROUTINE PROPER(NFLUID,NSINK,FLUID,SINK,
     &                  NPROPF,TPROPF,CPFF,KFF,MUFF,PRFF,RHOFF,
     &                  NPROPW,TPROPW,KWW)
```

```
      DIMENSION TPROPF(20),CPFF(20),KFF(20),MUFF(20),PRFF(20),RHOFF(20)
      DIMENSION TPROPW(20),KWW(20)
      CHARACTER*4 FLUID(3),SINK(4)
      REAL KFF,KWW,MUFF
C CALL PROPER SUBROUTINES FOR COOLANT AND SUBSTRATE PROPERTIES
C     COOLANT
      IF(NFLUID.EQ.1)CALL PROPF1(NPROPF,TPROPF,CPFF,KFF,MUFF,PRFF,RHOFF,
     &FLUID)
      IF(NFLUID.EQ.2)CALL PROPF2(NPROPF,TPROPF,CPFF,KFF,MUFF,PRFF,RHOFF,
     &FLUID)
      IF(NFLUID.EQ.3)CALL PROPF3(NPROPF,TPROPF,CPFF,KFF,MUFF,PRFF,RHOFF,
     &FLUID)
C     SUBSTRATE
      IF(NSINK.EQ.1)CALL PROPS1(NPROPW,TPROPW,KWW,SINK)
      IF(NSINK.EQ.2)CALL PROPS2(NPROPW,TPROPW,KWW,SINK)
      IF(NSINK.EQ.3)CALL PROPS3(NPROPW,TPROPW,KWW,SINK)
      IF(NSINK.EQ.4)CALL PROPS4(NPROPW,TPROPW,KWW,SINK)
      IF(NSINK.EQ.5)CALL PROPS5(NPROPW,TPROPW,KWW,SINK)
      IF(NSINK.EQ.6)CALL PROPS6(NPROPW,TPROPW,KWW,SINK)
      IF(NSINK.EQ.7)CALL PROPS7(NPROPW,TPROPW,KWW,SINK)
      RETURN
      END
C END OF FILE FOR SUBROUTINE PROPER
C-----------------------------------------------------------------------
C PROPF1:  WRITTEN BY RICHARD J. PHILLIPS.  PROPF1 CONTAINS
C          THE COOLANT PROPERTY DATA FOR FC-77 AS TAKEN FROM
C          3M PRODUCT MANUAL (1984).
C-----------------------------------------------------------------------
C ANALYSIS VARIABLES
C CPF     ... COOLANT SPECIFIC HEAT DATA              (J/KG DEG K)
C FLUID   ... ALPHANUMERIC FOR COOLANT TYPE           (-)
C KF      ... COOLANT THERMAL CONDUCTIVITY DATA       (W/M DEG K)
C MUF     ... COOLANT DYNAMIC VISCOSITY DATA          (KG/M S)
C NPROPF  ... NUMBER OF COOLANT DATA ENTRIES          (-)
C PRF     ... COOLANT PRANDTL NUMBER DATA             (-)
C RHOF    ... COOLANT DENSITY DATA                    (KG/M*3)
C TPROPF  ... TEMPERATURES FOR FLUID PROPERTY DATA    (DEG K)
C-----------------------------------------------------------------------
      SUBROUTINE PROPF1(NPROPF,TPROPF,CPFF,KFF,MUFF,PRFF,RHOFF,FLUID)
      DIMENSION TPROPF(20),CPFF(20),KFF(20),MUFF(20),PRFF(20),RHOFF(20)
      DIMENSION TPROP(9),CPF(9),KF(9),MUF(9),PRF(9),RHOF(9)
      CHARACTER*4 FLUID(3),FLU(3)
      REAL KF,KFF,MUF,MUFF
      DATA FLU  /'FC-7','7   ','    '/
      DATA TPROP/ 273., 283., 293., 303., 313., 323., 333., 343., 353./
      DATA CPF  /1010.,1025.,1040.,1055.,1070.,1085.,1100.,1115.,1130./
      DATA KF   /.0651,.0643,.0635,.0627,.0619,.0611,.0603,.0595,.0588/
      DATA MUF  /.00230,.00188,.00155,.00129,.00109,.00093,.00080,
     &           .00071,.00062/
      DATA PRF  / 35.6, 30.0, 25.4, 21.7, 18.8, 16.5, 14.6, 13.3, 11.9/
      DATA RHOF /1836.,1812.,1786.,1762.,1737.,1713.,1687.,1663.,1638./
      NPROPF=9
C TRANSFER VALUES
      DO 10 I=1,3
        FLUID(I)=FLU(I)
10    CONTINUE
      DO 100 I=1,NPROPF
        TPROPF(I)=TPROP(I)
        CPFF(I)=CPF(I)
        KFF(I)=KF(I)
        MUFF(I)=MUF(I)
        PRFF(I)=PRF(I)
        RHOFF(I)=RHOF(I)
100   CONTINUE
      RETURN
      END
C END OF FILE FOR SUBROUTINE PROPF1
C-----------------------------------------------------------------------
C PROPF2:  WRITTEN BY RICHARD J. PHILLIPS.  PROPF2 CONTAINS
C          THE COOLANT PROPERTY DATA FOR FREON (CCL2F2) AS TAKEN FROM
C          HOLMAN (1976).
C-----------------------------------------------------------------------
C ANALYSIS VARIABLES
C CPF     ... COOLANT SPECIFIC HEAT DATA              (J/KG DEG K)
```

```
100     CONTINUE
        RETURN
        END
C END OF FILE FOR SUBROUTINE PROPF3
C------------------------------------------------------------------
C PROPS1:  WRITTEN BY RICHARD J. PHILLIPS.  PROPS1 CONTAINS
C          THE SUBSTRATE PROPERTY DATA FOR GALLIUM ARSENIDE AS TAKEN
C          FROM TYE (1969), NEUBERGER (1971), AND CARLSON ET AL. (1965).
C------------------------------------------------------------------
C ANALYSIS VARIABLES
C KW      ... COOLANT THERMAL CONDUCTIVITY DATA          (W/M DEG K)
C NPROPW  ... NUMBER OF SUBSTRATE MATERIAL DATA ENTRIES  (-)
C MAT     ... ALPHANUMERIC FOR SUBSTRATE TYPE            (-)
C TPROPW  ... TEMPERATURES FOR FLUID PROPERTY DATA       (DEG K)
C------------------------------------------------------------------
        SUBROUTINE PROPS1(NPROPW,TPROPW,KWW,SINK)
        DIMENSION TPROPW(20),KWW(20)
        DIMENSION TPROP(8),KW(8)
        CHARACTER*4 SINK(4),MAT(4)
        REAL KW,KWW
        DATA MAT   /'GALL','IUM ','ARSE','NIDE'/
        DATA TPROP/  20.,   50.,   80.,  100.,  200.,  300.,  400.,  470./
        DATA KW    /4500.,  600.,  400.,  260.,   90.,   54.,   31.,   28./
        NPROPW=8
C TRANSFER VALUES
        DO 10 I=1,4
            SINK(I)=MAT(I)
10      CONTINUE
        DO 100 I=1,NPROPW
            TPROPW(I)=TPROP(I)
            KWW(I)=KW(I)
100     CONTINUE
        RETURN
        END
C END OF FILE FOR SUBROUTINE PROPS1
C------------------------------------------------------------------
C PROPS2:  WRITTEN BY RICHARD J. PHILLIPS.  PROPS2 CONTAINS
C          THE SUBSTRATE PROPERTY DATA FOR GERMANIUM AS TAKEN FROM
C          TOULOUKIAN (1970).
C------------------------------------------------------------------
C ANALYSIS VARIABLES
C KW      ... COOLANT THERMAL CONDUCTIVITY DATA          (W/M DEG K)
C NPROPW  ... NUMBER OF SUBSTRATE MATERIAL DATA ENTRIES  (-)
C MAT     ... ALPHANUMERIC FOR SUBSTRATE TYPE            (-)
C TPROPW  ... TEMPERATURES FOR FLUID PROPERTY DATA       (DEG K)
C------------------------------------------------------------------
        SUBROUTINE PROPS2(NPROPW,TPROPW,KWW,SINK)
        DIMENSION TPROPW(20),KWW(20)
        DIMENSION TPROP(18),KW(18)
        CHARACTER*4 SINK(4),MAT(4)
        REAL KW,KWW
        DATA MAT   /'GERM','ANIU','M   ','    '/
        DATA TPROP/  10.,   20.,   30.,   40.,
     &               50.,   60.,   70.,   80.,   90.,  100.,  150.,  200.,  250.,
     &              273.2, 300.,  350.,  400.,  500./
        DATA KW   /1770.,1490.,1080., 798.,
     &              615.,  487.,  393.,  325.,  270.,  232.,  132.,  96.8,  74.9,
     &               66.7,  59.9,  49.5,  43.2,  33.8/
        NPROPW=18
C TRANSFER VALUES
        DO 10 I=1,4
            SINK(I)=MAT(I)
10      CONTINUE
        DO 100 I=1,NPROPW
            TPROPW(I)=TPROP(I)
            KWW(I)=KW(I)
100     CONTINUE
        RETURN
        END
C END OF FILE FOR SUBROUTINE PROPS2
C------------------------------------------------------------------
C PROPS3:  WRITTEN BY RICHARD J. PHILLIPS.  PROPS3 CONTAINS
C          THE SUBSTRATE PROPERTY DATA FOR INDIUM PHOSPHIDE TAKEN FROM
C          KUDMAN AND STEIGMEIER (1964), ALIEV ET AL. (1965), AND
C          NEUBERGER (1971).
```

```
C----------------------------------------------------------------------
C ANALYSIS VARIABLES
C KW      ... COOLANT THERMAL CONDUCTIVITY DATA         (W/M DEG K)
C NPROPW  ... NUMBER OF SUBSTRATE MATERIAL DATA ENTRIES (-)
C MAT     ... ALPHANUMERIC FOR SUBSTRATE TYPE           (-)
C TPROPW  ... TEMPERATURES FOR FLUID PROPERTY DATA      (DEG K)
C----------------------------------------------------------------------
      SUBROUTINE PROPS3(NPROPW,TPROPW,KWW,SINK)
      DIMENSION TPROPW(20),KWW(20)
      DIMENSION TPROP(11),KW(11)
      CHARACTER*4 SINK(4),MAT(4)
      REAL KW,KWW
      DATA MAT  /'INDI','UM P','HOSP','HIDE'/
      DATA TPROP/  20.,  30.,  50.,  80., 100., 200., 300.,  350.,
     1             400., 450., 500./
      DATA KW   /3000.,2000.,1000., 500., 880., 130.,  67.,   53.,
     1             43.,  35.,  30./
      NPROPW=11
C TRANSFER VALUES
      DO 10 I=1,4
        SINK(I)=MAT(I)
10    CONTINUE
      DO 100 I=1,NPROPW
        TPROPW(I)=TPROP(I)
        KWW(I)=KW(I)
100   CONTINUE
      RETURN
      END
C END OF FILE FOR SUBROUTINE PROPS3
C----------------------------------------------------------------------
C PROPS4: WRITTEN BY RICHARD J. PHILLIPS.  PROPS4 CONTAINS
C         THE SUBSTRATE PROPERTY DATA FOR SILICON AS TAKEN FROM
C         TOULOUKIAN (1970).
C----------------------------------------------------------------------
C ANALYSIS VARIABLES
C KW      ... COOLANT THERMAL CONDUCTIVITY DATA         (W/M DEG K)
C NPROPW  ... NUMBER OF SUBSTRATE MATERIAL DATA ENTRIES (-)
C MAT     ... ALPHANUMERIC FOR SUBSTRATE TYPE           (-)
C TPROPW  ... TEMPERATURES FOR FLUID PROPERTY DATA      (DEG K)
C----------------------------------------------------------------------
      SUBROUTINE PROPS4(NPROPW,TPROPW,KWW,SINK)
      DIMENSION TPROPW(20),KWW(20)
      DIMENSION TPROP(18),KW(18)
      CHARACTER*4 SINK(4),MAT(4)
      REAL KW,KWW
      DATA MAT  /'SILI','CON ','    ','    '/
      DATA TPROP/  10.,  20.,  30.,  40.,
     1             50.,  60.,  70.,  80.,  90., 100., 150., 200., 250.,
     1             273.2, 300., 350., 400., 500./
      DATA KW   /2110.,4940.,4810.,3530.,
     1           2680.,2110.,1680.,1340.,1080., 884., 409., 264., 191.,
     1            168., 148., 119., 98.9, 76.2/
      NPROPW=18
C TRANSFER VALUES
      DO 10 I=1,4
        SINK(I)=MAT(I)
10    CONTINUE
      DO 100 I=1,NPROPW
        TPROPW(I)=TPROP(I)
        KWW(I)=KW(I)
100   CONTINUE
      RETURN
      END
C END OF FILE FOR SUBROUTINE PROPS4
C----------------------------------------------------------------------
C PROPS5: WRITTEN BY RICHARD J. PHILLIPS.  PROPS4 CONTAINS
C         THE SUBSTRATE PROPERTY DATA FOR ALUMINUM AS TAKEN FROM
C         TOULOUKIAN (1970).
C----------------------------------------------------------------------
C ANALYSIS VARIABLES
C KW      ... COOLANT THERMAL CONDUCTIVITY DATA         (W/M DEG K)
C NPROPW  ... NUMBER OF SUBSTRATE MATERIAL DATA ENTRIES (-)
C MAT     ... ALPHANUMERIC FOR SUBSTRATE TYPE           (-)
C TPROPW  ... TEMPERATURES FOR FLUID PROPERTY DATA      (DEG K)
C----------------------------------------------------------------------
```

```
      SUBROUTINE PROPS5(NPROPW,TPROPW,KWW,SINK)
      DIMENSION TPROPW(20),KWW(20)
      DIMENSION TPROP(18),KW(18)
      CHARACTER*4 SINK(4),MAT(4)
      REAL KW,KWW
      DATA MAT  /'ALUM','INUM','    ','    '/
      DATA TPROP/  10.,   20.,   30.,   40.,
     &             50.,   60.,   70.,   80.,   90.,  100.,  150.,  200.,
     &            250., 273.2,  300.,  350.,  400.,  500./
      DATA KW    /23500.,11700.,5180.,2380.,
     &            1230.,  754.,  532.,  414.,  344.,  302.,  248.,  237.,
     &             235.,  236.,  237.,  240.,  240.,  237./
      NPROPW=18
C TRANSFER VALUES
      DO 10 I=1,4
         SINK(I)=MAT(I)
10    CONTINUE
      DO 100 I=1,NPROPW
         TPROPW(I)=TPROP(I)
         KWW(I)=KW(I)
100   CONTINUE
      RETURN
      END
C END OF FILE FOR SUBROUTINE PROPS5
C---------------------------------------------------------------------
C PROPS6: WRITTEN BY RICHARD J. PHILLIPS. PROPS5 CONTAINS
C         THE SUBSTRATE PROPERTY DATA FOR COPPER AS TAKEN FROM
C         TOULOUKIAN (1970).
C---------------------------------------------------------------------
C ANALYSIS VARIABLES
C KW     ... COOLANT THERMAL CONDUCTIVITY DATA          (W/M DEG K)
C NPROPW ... NUMBER OF SUBSTRATE MATERIAL DATA ENTRIES  (-)
C MAT    ... ALPHANUMERIC FOR SUBSTRATE TYPE            (-)
C TPROPW ... TEMPERATURES FOR FLUID PROPERTY DATA       (DEG K)
C---------------------------------------------------------------------
      SUBROUTINE PROPS6(NPROPW,TPROPW,KWW,SINK)
      DIMENSION TPROPW(20),KWW(20)
      DIMENSION TPROP(18),KW(18)
      CHARACTER*4 SINK(4),MAT(4)
      REAL KW,KWW
      DATA MAT  /'COPP','ER  ','    ','    '/
      DATA TPROP/  10.,   20.,   30.,   40.,
     &             50.,   60.,   70.,   80.,   90.,  100.,  150.,  200.,
     &            250., 273.2,  300.,  350.,  400.,  500./
      DATA KW    /19600.,10500.,4300.,2050.,
     &            1220.,  850.,  670.,  570.,  514.,  483.,  428.,  413.,
     &             404.,  401.,  398.,  394.,  392.,  388./
      NPROPW=18
C TRANSFER VALUES
      DO 10 I=1,4
         SINK(I)=MAT(I)
10    CONTINUE
      DO 100 I=1,NPROPW
         TPROPW(I)=TPROP(I)
         KWW(I)=KW(I)
100   CONTINUE
      RETURN
      END
C END OF FILE FOR SUBROUTINE PROPS6
C---------------------------------------------------------------------
C PROPS7: WRITTEN BY RICHARD J. PHILLIPS. PROPS6 CONTAINS
C         THE SUBSTRATE PROPERTY DATA FOR SILVER AS TAKEN FROM
C         TOULOUKIAN (1970).
C---------------------------------------------------------------------
C ANALYSIS VARIABLES
C KW     ... COOLANT THERMAL CONDUCTIVITY DATA          (W/M DEG K)
C NPROPW ... NUMBER OF SUBSTRATE MATERIAL DATA ENTRIES  (-)
C MAT    ... ALPHANUMERIC FOR SUBSTRATE TYPE            (-)
C TPROPW ... TEMPERATURES FOR FLUID PROPERTY DATA       (DEG K)
C---------------------------------------------------------------------
      SUBROUTINE PROPS7(NPROPW,TPROPW,KWW,SINK)
      DIMENSION TPROPW(20),KWW(20)
      DIMENSION TPROP(18),KW(18)
      CHARACTER*4 SINK(4),MAT(4)
      REAL KW,KWW
```

```
      DATA MAT  /'SILV','ER  ',' ',' '/
      DATA TPROP/  10.,   20.,   30.,   40.,
     &             50.,   60.,   70.,   80.,   90.,  100.,  150.,  200.,  250.,
     &             273.2, 300.,  350.,  400.,  500./
      DATA KW   /16800.,5100.,1930.,1050.,
     &             700.,  550.,  497.,  471.,  460.,  450.,  432.,  430.,  428.,
     &             428.,  427.,  424.,  420.,  413./
      NPROPW=18
C TRANSFER VALUES
      DO 10 I=1,4
         SINK(I)=MAT(I)
10    CONTINUE
      DO 100 I=1,NPROPW
         TPROPW(I)=TPROP(I)
         KWW(I)=KW(I)
100   CONTINUE
      RETURN
      END
C END OF FILE FOR SUBROUTINE PROPS7
C-----------------------------------------------------------------
C PRINTO:  WRITTEN BY RICHARD J. PHILLIPS. PRINTO INITIALIZES
C          AND TERMINATES THE PRINTOUTS OF ANALYSIS RESULTS.
C-----------------------------------------------------------------
C FLUID   ... ALPHANUMERIC FOR COOLANT TYPE                (-)
C TFLUIN  ... ASSUMED COOLANT INLET TEMPERATURE            (DEG K)
C Q       ... SURFACE HEATING RATE                         (W/CM*2)
C SINK    ... ALPHANUMERIC FOR SUBSTRATE TYPE              (-)
C IDUM    ... DUMMY VARIABLE FOR PRINTOUT CONTROL          (-)
C-----------------------------------------------------------------
      SUBROUTINE PRINTO(FLUID,TFLUIN,SINK,Q,IDUM)
      CHARACTER*4 FLUID(3),SINK(4)
C******** FILE 11
C GEOMETRY, FLOW CONSTRAINTS, AND THERMAL RESISTANCE
C LABEL PRINTOUT
      IF(IDUM.EQ.0)WRITE(11,500)SINK,FLUID,TFLUIN,Q
500   FORMAT(' SUBSTRATE = ',4A4,
     &'     LIQUID COOLANT = ',3A4,'     TFLUIN = ',F5.1,' DEG K   ',
     &' Q = ',F6.0,' W/CM**2')
C TOP OF PRINTOUT
      IF(IDUM.EQ.0)WRITE(11,800)
800   FORMAT(
     &' -----+-----+-----+------+------+------+------+------+----+---+---+',
     &',
     &'----+------+-----++------+------+------+------+------+------+',
     &'/,
     &'  WC    WW    X    Z      T    ASPEC ACBYAP EBYDE PBYE PHI ZI  ',
     &',
     &'DELP   V*    P*    RCOND    RC   RCONV  RBULK  RTOT  DTPUMP  ',
     &'/,
     &' -----+-----+-----+------+------+------+------+------+----+---+---+',
     &',
     &'----+------+-----++------+------+------+------+------+------+!)
      IF(IDUM.EQ.0)WRITE(11,801)
801   FORMAT(
     &'
     &',
     &'LBF   CC/S    W    DEG. C DEG. C DEG. C DEG. C DEG. C        ',
     &'/,
     &'  M     M     M     M      M      ---    --    ---   --  DEG DEG ',
     &',
     &'----  -----  -----  ------ ------ ------ ------ ------ DEG. C ',
     &'/,
     &'
     &',
     &'IN*2  CM*2   CM*2  W/CM*2 W/CM*2 W/CM*2 W/CM*2 W/CM*2        ',
     &'/,
     &' -----+-----+-----+------+------+------+------+------+----+---+---+',
     &',
     &'----+------+-----++------+------+------+------+------+------+')
      IF(IDUM.EQ.0)WRITE(11,802)
802   FORMAT(
     &' *E-6  *E-6        *E-6   *E-6
     &',
     &'
```

```
           $,/,
           $' -----+-----+----+------+------+-----+------+-----+----+---+---+'
           $,
           $'----+------+----+-+------+------+-----+------+-----+------+------+')
C BOTTOM OF PRINTOUT
      IF(IDUM.EQ.1)WRITE(11,803)
803   FORMAT(
           $' -----+-----+----+----+------+------+-----+------+-----+----+---+'
           $,
           $'----+------+----+-+------+------+-----+------+-----+------+------+')
C******** FILE 13
C FLOW AND HEAT TRANSFER VARIABLES
C LABEL PRINTOUT
      IF(IDUM.EQ.0)WRITE(13,500)SINK,FLUID,TFLUIN,Q
C TOP OF PRINTOUT
      IF(IDUM.EQ.0)WRITE(13,901)
901   FORMAT(
           $' -----+-----+-----+------+------+-----+------+'
           $,
           $'------+------+------+----+-----+----+------+------+'
           $,/,
           $'  DE    DLE    VC     RE    RESTAR XSTAR LPLUS '
           $,
           $'  NU    NUT    FAPP   K90    KC    KE   FINCRI  EFF  '
           $,/,
           $' -----+-----+-----+------+------+------+------+'
           $,
           $'------+------+------+-----+----+----+------+------+')
      IF(IDUM.EQ.0)WRITE(13,902)
902   FORMAT(
           $'    M    M   M/S    --    --    --    --   '
           $,
           $'    --    ---    --    ---    --    --    --    ---   '
           $,/,
           $' -----+------+------+------+------+------+------+'
           $,
           $'------+------+------+----+----+----+------+------+')
C BOTTOM OF PRINTOUT
      IF(IDUM.EQ.1)WRITE(13,903)
903   FORMAT(
           $' -----+------+------+------+------+-----+------+'
           $,
           $'------+------+------+----+----+----+------+------+')
C******** FILE 15
C TEMPERATURES
C LABEL PRINTOUT
      IF(IDUM.EQ.0)WRITE(15,500)SINK,FLUID,TFLUIN,Q
C TOP OF PRINTOUT
      IF(IDUM.EQ.0)WRITE(15,10001)
10001 FORMAT(
           $' -----+------+------+------+------+------+------+------+------+'
           $,
           $'------+------+------+------+------+------+------+'
           $,/,
           $' TFINL  TFLUL   TTBL   TFLLAV TFILAV TFINX  TFLUX   TTBX   TFLXAV '
           $,
           $'TFIXAV  TTX    TTB   TTIPX  TFLUO  DTPUML DTPUMX '
           $)
      IF(IDUM.EQ.0)WRITE(15,10002)
10002 FORMAT(
           $' -----+------+------+------+------+------+------+------+------+'
           $,
           $'------+------+------+------+------+------+------+'
           $,/,
           $' DEG. C DEG. C DEG. C DEG. C DEG. C DEG. C DEG. C DEG. C DEG. C '
           $,
           $'DEG. C DEG. C DEG. C DEG. C DEG. C DEG. C DEG. C '
           $,/,
           $' -----+------+------+------+------+------+------+------+------+'
           $,
           $'------+------+------+------+------+------+------+'
           $)
C BOTTOM OF PRINTOUT
      IF(IDUM.EQ.1)WRITE(15,10003)
```

```
10003 FORMAT(
     1'  ------+------+------+------+------+------+------+------+------+'
     1,
     1'------+------+------+------+------+------+------+------+'
     1)
C******** FILE 17
C PROPERTIES
C LABEL PRINTOUT
      IF(IDUM.EQ.0)WRITE(17,500)SINK,FLUID,TFLUIN,Q
C TOP OF PRINTOUT
      IF(IDUM.EQ.0)WRITE(17,20001)
20001 FORMAT(
     1'  ------+------+------+------+------+------+------+------+------+'
     1,
     1'------+------+------+------+------+------+------+------+------+'
     1,/,
     1' CPFLUL CPFLUX KFLUL   KFLUX   PRFLUL PRFLUX RHOFLL RJOFLX MUFLUL '
     1,
     1'MUFLUX MUFLLA MUFLXA MUFILA MUFIXA KFINL   KFINX   KTBL    KTBX  '
     1)
      IF(IDUM.EQ.0)WRITE(17,20002)
20002 FORMAT(
     1'  ------+------+------+------+------+------+------+------+------+'
     1,
     1'------+------+------+------+------+------+------+------+------+'
     1,/,
     1' J/KG C J/KG C W/M C   W/M C    --      --    KG/M*3 KG/M*3 KG/M S '
     1,
     1'KG/M S KG/M S KG/M S KG/M S KG/M S W/M C   W/M C   W/M C   W/M C  '
     1,/,
     1'  ------+------+------+------+------+------+------+------+------+'
     1,
     1'------+------+------+------+------+------+------+------+------+'
     1)
C BOTTOM OF PRINTOUT
      IF(IDUM.EQ.1)WRITE(17,20003)
20003 FORMAT(
     1'  ------+------+------+------+------+------+------+------+------+'
     1,
     1'------+------+------+------+------+------+------+------+------+'
     1)
      RETURN
      END
C END OF FILE FOR SUBROUTINE PRINTO
C------------------------------------------------------------------------
C PPLOTT:  WRITTEN BY RICHARD J. PHILLIPS.  PPLOTT PLOTS THE THERMAL-
C          HYDRAULIC RESULTS USING THE DISSPLA PLOTTING PACKAGE.  NOTE
C          THAT A 'C' HAS BEEN ADDED BEFORE COLUMN 1 TO COMMENT OUT
C          THE ENTIRE SUBROUTINE.
C------------------------------------------------------------------------
C ANALYSIS VARIABLES
C ICASE   ... ANALYSIS METHOD CONTROL PARAMETER           (-)
C IINUM   ... ARRAY OF THE NUMBER OF CURVE DATA POINTS    (-)
C IX      ... CONTROL FOR IF X OR WC IS VARIED            (-)
C NCURVE  ... NUMBER OF CURVE SETS TO BE PLOTTED          (-)
C X1      ... CHANNEL WIDTH ARRAY DATA POINTS             (M)
C XX      ... ARRAY OF CHANNEL POSITION X VALUES          (M)
C XSTARX  ... ARRAY OF THERMAL ENTRANCE LENGTHS           (-)
C Y1A     ... TOTAL THERMAL RESISTANCE ARRAY DATA POINTS (DEG C/(W/CM*2))
C Y1B     ... CONVECTIVE THERMAL RESISTANCE ARRAY DATA
C             POINTS                                     (DEG C/(W/CM*2))
C Y1C     ... COOLANT BULK TEMPERATURE RISE THERMAL
C             RESISTANCE ARRAY DATA POINTS               (DEG C/(W/CM*2))
C Y2      ... COOLANT PUMPING POWER PER UNIT SURFACE AREA
C             ARRAY DATA POINTS                           (W/CM*2)
C Y3      ... ARRAY FOR LOCATION OF MARKER SYMBOLS        (-)
C------------------------------------------------------------------------
C     SUBROUTINE PPLOTT(X1,Y1A,Y1B,Y1C,Y2,Y3,IINUM,NCURVE,ICASE,
C    1                  IX,XX,XSTARX)
C     DIMENSION X1(5,2,100),Y1A(5,2,100),Y2(5,2,100),Y3(5,2,100),
C    1IINUM(5,2),ICASE(5),X(100),Y(100),Y1B(5,2,100),Y1C(5,2,100),
C    1XX(5,2,100),XSTARX(5,2,100)
CC DETERMINE IF X OR WC WAS VARIED
C     IF(IX.EQ.2)GO TO 50000
```

```
CC THE CHANNEL WIDTH WAS VARIED
CC DEFINE THERMAL RESISTANCE PLOT
C         CALL HWSCAL('SCREEN')
C         CALL HWROT('AUTO')
C         CALL NOBRDR
C         CALL NOCHEK
C         CALL SETDEV(20,20)
C         CALL GRACE(0.)
C         CALL PAGE(8.5,11.)
C         CALL PHYSOR(2.0,4.6)
C         CALL AREA2D(5.,5.)
C         CALL FRAME
C         CALL YNAME('TOTAL THERMAL RESISTANCE - DEG C/(W/CM**2)',42)
C         CALL XNAME('CHANNEL WIDTH - MICRO M',23)
C         CALL YLOG(0.,100.,0.010,2.5)
CC        CALL YLOG(0.,100.,0.001,1.6667)
C         CALL BLSYM
C         CALL THKCRV(0.02)
CC LOOP FOR UP TO FIVE SETS OF CURVES
C         DO 1000 I=1,NCURVE,1
C            IF(I.EQ.2)CALL DOT
C            IF(I.EQ.3)CALL DASH
C            IF(I.EQ.4)CALL CHNDOT
C            IF(I.EQ.5)CALL CHNDSH
C            IF(ICASE(I).EQ.1)JMIN=1
C            IF(ICASE(I).EQ.1)JMAX=1
C            IF(ICASE(I).EQ.2)JMIN=1
C            IF(ICASE(I).EQ.2)JMAX=2
C            IF(ICASE(I).EQ.3)JMIN=2
C            IF(ICASE(I).EQ.3)JMAX=2
CC LOOP FOR FLOW REGIME
C            DO 500 J=JMIN,JMAX,1
C               INUM=IINUM(I,J)
CC LOOP FOR INUM DATA POINTS FOR EACH CURVE SET
CC    TOTAL THERMAL RESISTANCE
C               DO 175 K=1,INUM,1
C                  X(K)=X1(I,J,K)
C                  Y(K)=Y1A(I,J,K)
C                  IF(K.EQ.1)GO TO 50
C                  IF(K.EQ.INUM)GO TO 50
C                  IF(Y3(I,J,K).EQ.(Y3(I,J,K+1)))GO TO 175
C50               CONTINUE
C                  IF(Y3(I,J,K).EQ.1)CALL MARKER(2)
C                  IF(Y3(I,J,K).EQ.2)CALL MARKER(6)
C                  IF((J.EQ.1).AND.(K.EQ.1))CALL MARKER(16)
C                  IF((J.EQ.2).AND.(K.EQ.1))CALL MARKER(15)
C                  IF((J.EQ.1).AND.(K.EQ.INUM))CALL MARKER(17)
C                  IF((J.EQ.2).AND.(K.EQ.INUM))CALL MARKER(18)
C                  IF((J.NE.1).OR.(Y3(I,J,K).NE.1))GO TO 175
C                  IF(K.EQ.1)GO TO 175
C                  CALL CURVE(X(K),Y(K),1,-1)
C175            CONTINUE
C               CALL CURVE(X,Y,INUM,0)
CC    CONVECTIVE THERMAL RESISTANCE
C               DO 200 K=1,INUM,1
C                  X(K)=X1(I,J,K)
C                  Y(K)=Y1B(I,J,K)
C                  IF(K.EQ.1)GO TO 150
C                  IF(K.EQ.INUM)GO TO 150
C                  IF(Y3(I,J,K).EQ.(Y3(I,J,K+1)))GO TO 200
C150              CONTINUE
C                  IF(Y3(I,J,K).EQ.1)CALL MARKER(2)
C                  IF(Y3(I,J,K).EQ.2)CALL MARKER(6)
C                  IF((J.EQ.1).AND.(K.EQ.1))CALL MARKER(16)
C                  IF((J.EQ.2).AND.(K.EQ.1))CALL MARKER(15)
C                  IF((J.EQ.1).AND.(K.EQ.INUM))CALL MARKER(17)
C                  IF((J.EQ.2).AND.(K.EQ.INUM))CALL MARKER(18)
C                  IF((J.NE.1).OR.(Y3(I,J,K).NE.1))GO TO 200
C                  IF(K.EQ.1)GO TO 200
C                  CALL CURVE(X(K),Y(K),1,-1)
C200            CONTINUE
C               CALL CURVE(X,Y,INUM,0)
CC    COOLANT BULK TEMPERATURE RISE THERMAL RESISTANCE
C               DO 300 K=1,INUM,1
C                  X(K)=X1(I,J,K)
```

```
C            Y(K)=Y1C(I,J,K)
C            IF(K.EQ.1)GO TO 250
C            IF(K.EQ.INUM)GO TO 250
C            IF(Y3(I,J,K).EQ.(Y3(I,J,K+1)))GO TO 300
C250      CONTINUE
C            IF(Y3(I,J,K).EQ.1)CALL MARKER(2)
C            IF(Y3(I,J,K).EQ.2)CALL MARKER(6)
C            IF((J.EQ.1).AND.(K.EQ.1))CALL MARKER(16)
C            IF((J.EQ.2).AND.(K.EQ.1))CALL MARKER(15)
C            IF((J.EQ.1).AND.(K.EQ.INUM))CALL MARKER(17)
C            IF((J.EQ.2).AND.(K.EQ.INUM))CALL MARKER(18)
C            IF((J.NE.1).OR.(Y3(I,J,K).NE.1))GO TO 300
C            IF(K.EQ.1)GO TO 300
C            CALL CURVE(X(K),Y(K),1,-1)
C300      CONTINUE
C         CALL CURVE(X,Y,INUM,0)
C500      CONTINUE
C1000     CONTINUE
C         IF(NCURVE.EQ.2)CALL RESET('DOT')
C         IF(NCURVE.EQ.3)CALL RESET('DASH')
C         IF(NCURVE.EQ.4)CALL RESET('CHNDOT')
C         IF(NCURVE.EQ.5)CALL RESET('CHNDSH')
CC     LABEL SURFACE TEMPERATURE RISE - YOU PROVIDE THE HEATING RATE
CC        CALL YLGAXS(0.1,2.0,6.,'PEAK SURFACE TEMPERATURE RISE - DEG C$',
CC   1-100,7.,0.)
C         CALL YNONUM
C         CALL YLGAXS(1.0,2.5,5.,' $',-100,5.,0.)
CC        CALL YLGAXS(1.0,1.6667,5.,' $',-100,5.,0.)
C         CALL RESET('YNONUM')
C         CALL ENDGR(0)
CC DEFINE PUMPING POWER PLOT
C         CALL PAGE(8.5,11.)
C         CALL PHYSOR(2.0,1.0)
C         CALL AREA2D(5.,3.)
C         CALL FRAME
C         CALL YNAME('PUMPING POWER - W/CM**2',23)
C         CALL XNAME('CHANNEL WIDTH - MICRO M',23)
C         CALL YLOG(0.,100.,0.10,1.0)
C         CALL YNONUM
C         CALL YLGAXS(0.10,1.0,3.,' ',-1,5.,0.)
C         CALL RESET('YNONUM')
C         CALL BLSYM
C         CALL THKCRV(0.02)
CC LOOP FOR UP TO FIVE CURVES
C         DO 2000 I=1,NCURVE,1
C            IF(I.EQ.2)CALL DOT
C            IF(I.EQ.3)CALL DASH
C            IF(I.EQ.4)CALL CHNDOT
C            IF(I.EQ.5)CALL CHNDSH
C            IF(ICASE(I).EQ.1)JMIN=1
C            IF(ICASE(I).EQ.1)JMAX=1
C            IF(ICASE(I).EQ.2)JMIN=1
C            IF(ICASE(I).EQ.2)JMAX=2
C            IF(ICASE(I).EQ.3)JMIN=2
C            IF(ICASE(I).EQ.3)JMAX=2
CC LOOP FOR FLOW REGIME
C         DO 1500 J=JMIN,JMAX,1
C            INUM=IINUM(I,J)
CC LOOP FOR INUM DATA POINTS
C         DO 1100 K=1,INUM,1
C            X(K)=X1(I,J,K)
C            Y(K)=Y2(I,J,K)
C            IF(K.EQ.1)GO TO 1050
C            IF(K.EQ.INUM)GO TO 1050
C            IF(Y3(I,J,K).EQ.(Y3(I,J,K+1)))GO TO 1100
C1050     CONTINUE
C            IF(Y3(I,J,K).EQ.1)CALL MARKER(2)
C            IF(Y3(I,J,K).EQ.2)CALL MARKER(6)
C            IF((J.EQ.1).AND.(K.EQ.1))CALL MARKER(16)
C            IF((J.EQ.2).AND.(K.EQ.1))CALL MARKER(15)
C            IF((J.EQ.1).AND.(K.EQ.INUM))CALL MARKER(17)
C            IF((J.EQ.2).AND.(K.EQ.INUM))CALL MARKER(18)
C            IF((J.NE.1).OR.(Y3(I,J,K).NE.1))GO TO 1100
C            IF(K.EQ.1)GO TO 1100
C            CALL CURVE(X(K),Y(K),1,-1)
```

```
C1100    CONTINUE
C        CALL CURVE(X,Y,INUM,0)
C1500    CONTINUE
C2000    CONTINUE
C        CALL ENDPL(0)
C        CALL DONEPL
C        RETURN
C50000   CONTINUE
CC THE POSITION FROM THE CHANNEL ENTRANCE WAS VARIED
CC DEFINE THERMAL RESISTANCE PLOT
C        CALL HWSCAL('SCREEN')
C        CALL HWROT('AUTO')
C        CALL NOBRDR
C        CALL NOCHEK
C        CALL SETDEV(20,20)
C        CALL GRACE(0.)
C        CALL PAGE(8.5,11.)
C        CALL PHYSOR(2.,2.)
C        CALL AREA2D(5.5,3.5)
C        CALL FRAME
C        CALL HEADIN('MICROCHANNEL THERMAL RESISTANCE',31,1.,1)
CC       NOTE THAT PLOTS VERSUS THERMAL ENTRANCE LENGTH USE XSTARX, AND
CC           PLOTS VERSUS DISTANCE FROM UPSTREAM HEATER EDGE USE XX ARRAYS
C        CALL YNAME('TOTAL THERMAL RESISTANCE - DEG C/(W/CM**2)',42)
CC       CALL XNAME('THERMAL ENTRANCE LENGTH - DIMENSIONLESS',39)
CC       CALL GRAF(0.,.01,.04,0.,.05,.2)
C        CALL XNAME('DISTANCE FROM CHANNEL ENTRANCE - M',34)
C        CALL GRAF(0.0,0.002,0.01,0.,.05,.30)
C        CALL BLSYM
C        CALL THKCRV(0.02)
CC LOOP FOR UP TO FIVE SETS OF CURVES
C        DO 51000 I=1,NCURVE,1
C            IF(I.EQ.2)CALL DOT
C            IF(I.EQ.3)CALL DASH
C            IF(I.EQ.4)CALL CHNDOT
C            IF(I.EQ.5)CALL CHNDSH
C            IF(ICASE(I).EQ.1)JMIN=1
C            IF(ICASE(I).EQ.1)JMAX=1
C            IF(ICASE(I).EQ.2)JMIN=1
C            IF(ICASE(I).EQ.2)JMAX=2
C            IF(ICASE(I).EQ.3)JMIN=2
C            IF(ICASE(I).EQ.3)JMAX=2
CC LOOP FOR FLOW REGIME
C        DO 50500 J=JMIN,JMAX,1
C            INUM=IINUM(I,J)
CC LOOP FOR INUM DATA POINTS FOR EACH CURVE SET
CC   TOTAL THERMAL RESISTANCE
C        DO 50100 K=1,INUM,1
CC           X(K)=XSTARX(I,J,K)
C            X(K)=XX(I,J,K)
C            Y(K)=Y1A(I,J,K)
C            IF(K.EQ.1)GO TO 50050
C            IF(K.EQ.INUM)GO TO 50050
C            IF(Y3(I,J,K).EQ.(Y3(I,J,K+1)))GO TO 50100
C50050       CONTINUE
C            IF(Y3(I,J,K).EQ.1)CALL MARKER(2)
C            IF(Y3(I,J,K).EQ.2)CALL MARKER(6)
C            IF((J.EQ.1).AND.(K.EQ.1))CALL MARKER(16)
C            IF((J.EQ.2).AND.(K.EQ.1))CALL MARKER(15)
C            IF((J.EQ.1).AND.(K.EQ.INUM))CALL MARKER(17)
C            IF((J.EQ.2).AND.(K.EQ.INUM))CALL MARKER(18)
C            IF((J.NE.1).OR.(Y3(I,J,K).NE.1))GO TO 50100
C            IF(K.EQ.1)GO TO 50100
C            CALL CURVE(X(K),Y(K),1,-1)
C50100   CONTINUE
C        CALL CURVE(X,Y,INUM,0)
CC   CONVECTIVE THERMAL RESISTANCE
C        DO 50200 K=1,INUM,1
CC           X(K)=XSTARX(I,J,K)
C            X(K)=XX(I,J,K)
C            Y(K)=Y1B(I,J,K)
C            IF(K.EQ.1)GO TO 50150
C            IF(K.EQ.INUM)GO TO 50150
C            IF(Y3(I,J,K).EQ.(Y3(I,J,K+1)))GO TO 50200
C50150       CONTINUE
```

```
C            IF(Y3(I,J,K).EQ.1)CALL MARKER(2)
C            IF(Y3(I,J,K).EQ.2)CALL MARKER(6)
C            IF((J.EQ.1).AND.(K.EQ.1))CALL MARKER(16)
C            IF((J.EQ.2).AND.(K.EQ.1))CALL MARKER(15)
C            IF((J.EQ.1).AND.(K.EQ.INUM))CALL MARKER(17)
C            IF((J.EQ.2).AND.(K.EQ.INUM))CALL MARKER(18)
C            CALL CURVE(X(K),Y(K),1,-1)
C50200 CONTINUE
C       CALL CURVE(X,Y,INUM,0)
CC    COOLANT BULK TEMPERATURE RISE THERMAL RESISTANCE
C       DO 50300 K=1,INUM,1
CC          X(K)=XSTARX(I,J,K)
C           X(K)=XX(I,J,K)
C           Y(K)=Y1C(I,J,K)
C           IF(K.EQ.1)GO TO 50250
C           IF(K.EQ.INUM)GO TO 50250
C           IF(Y3(I,J,K).EQ.(Y3(I,J,K+1)))GO TO 50300
C50250  CONTINUE
C           IF(Y3(I,J,K).EQ.1)CALL MARKER(2)
C           IF(Y3(I,J,K).EQ.2)CALL MARKER(6)
C           IF((J.EQ.1).AND.(K.EQ.1))CALL MARKER(16)
C           IF((J.EQ.2).AND.(K.EQ.1))CALL MARKER(15)
C           IF((J.EQ.1).AND.(K.EQ.INUM))CALL MARKER(17)
C           IF((J.EQ.2).AND.(K.EQ.INUM))CALL MARKER(18)
C           CALL CURVE(X(K),Y(K),1,-1)
C50300 CONTINUE
C       CALL CURVE(X,Y,INUM,0)
C50500 CONTINUE
C51000 CONTINUE
C       IF(NCURVE.EQ.2)CALL RESET('DOT')
C       IF(NCURVE.EQ.3)CALL RESET('DASH')
C       IF(NCURVE.EQ.4)CALL RESET('CHNDOT')
C       IF(NCURVE.EQ.5)CALL RESET('CHNDSH')
C       CALL RESET('THKCRV')
C       CALL DOT
C       CALL GRID(2,2)
C       CALL RESET('DOT')
CC      NOTE THAT YOU MUST PROVIDE THE HEATING RATE TO LABEL TEMP. RISE
CC      CALL YGRAXS(0.,5.,10.0,3.5,'SURFACE TEMPERATURE RISE - DEG C$',
CC     $-100,5.5,0.)
C       CALL YNONUM
CC      CALL YGRAXS(0.,5.,10.0,3.5,' $',-100,5.5,0.)
C       CALL RESET('YNONUM')
C       CALL ENDPL(0)
C       CALL DONEPL
C       RETURN
C       END
CC END OF FILE FOR SUBROUTINE PPLOTT
C-----------------------------------------------------------------------
C PINPUT:  WRITTEN BY RICHARD J. PHILLIPS.  PINPUT PLOTS THE INPUT
C          ARRAY DATA.  NOTE THAT A 'C' HAS BEEN ADDED BEFORE COLUMN 1
C          TO COMMENT OUT THE ENTIRE SUBROUTINE.
C-----------------------------------------------------------------------
C ASPECT ... CHANNEL ASPECT RATIO                             (-)
C B      ... FIN HEIGHT                                       (M)
C DELP   ... PRESSURE DROP                                    (PSI)
C EBYDE  ... RATIO OF RIB HEIGHT TO HYDRAULIC DIAMETER        (-)
C ICASE  ... CASE SELECTION CONTROL VARIABLE                  (-)
C ICONS  ... COOLANT FLOW CONSTRAINT                          (-)
C IKLOSS ... CONTROL FOR INCLUDING K90, KC AND KE             (-)
C IX     ... CONTROL VARIABLE FOR IF X OR WC IS VARIED        (-)
C IZ     ... CONTROL VARIABLE FOR FIN HEIGHT CONSTRAINT       (-)
C L      ... CHANNEL LENGTH                                   (M)
C NCURVE ... CONTROL VARIBLE FOR STORAGE OF PLOTTING DATA     (-)
C NFLUID ... COOLANT IDENTIFIER NUMBER                        (-)
C NSINK  ... SUBSTRATE MATERIAL INDENTIFIER NUMBER            (-)
C PBYE   ... RATIO OF RIB SEPARATION TO RIB HEIGHT            (-)
C PHI    ... REPEATED-RIB FLOW ATTACK ANGLE                   (DEGREES)
C POWER  ... PUMPING POWER PER UNIT CIRCUIT SURFACE AREA      (W/CM*2)
C Q      ... INPUT HEAT FLUX FROM THE SURFACE                 (W/CM*2)
C T      ... SUBSTRATE THICKNESS                              (M)
C TFLUIN ... COOLANT INLET TEMPERATURE                        (DEG K)
C VOLUME ... COOLANT FLOW RATE PER UNIT
C              CIRCUIT SURFACE AREA                           ((CM*3/S)/CM*2)
```

```
C WCEND   ... MAXIMUM CHANNEL WIDTH CONTROL VARIABLE            (M)
C WCINCR  ... CHANNEL WIDTH INCREMENT CONTROL VARIABLE          (M)
C WCSTAR  ... MINIMUM CHANNEL WIDTH CONTROL VARIABLE            (M)
C WWBYWC  ... RATIO OF FIN WIDTH TO THE CHANNEL WIDTH           (-)
C XI      ... DUMMY VARIABLE                                    (-)
C ZI      ... REPEATED-RIB SHAPE ANGLE                          (DEGREES)
C-----------------------------------------------------------------------
C       SUBROUTINE PINPUT(NCURVE,ICASE,NSINK,NFLUID,TFLUIN,Q,WCSTAR,WCEND,
C     &                   WCINCR,WWBYWC,IZ,IX,B,ASPECT,L,T,IKLOSS,
C     &                   ICONS,DELP,VOLUME,POWER,EBYDE,PBYE,PHI,ZI)
C       DIMENSION NSINK(5),NFLUID(5),TFLUIN(5),Q(5),WCSTAR(5),WCEND(5),
C      &WCINCR(5),WWBYWC(5),IZ(5),B(5),ASPECT(5),L(5),T(5),IKLOSS(5),
C      &ICONS(5),DELP(5),VOLUME(5),POWER(5),EBYDE(5),PBYE(5),PHI(5),ZI(5),
C      &ICASE(5),XI(5)
C       DATA XI/1.2,2.4,3.6,4.8,6./
CC SET UP PLOTTER
C       CALL HWSCAL('SCREEN')
C       CALL HWROT('AUTO')
C       CALL NOBRDR
C       CALL NOCHEK
C       CALL SETDEV(20,20)
C       CALL GRACE(0.)
CC PLOT OUT THE ARRAY INFORMATION
C       CALL PAGE(8.5,11.)
C       CALL PHYSOR(1.,0.)
C       CALL AREA2D(7.,9.)
C       CALL MESSAG('INPUT DATA FOR MICROHEX COMPUTATIONS$',100,1.6,8.6)
C       CALL HEIGHT(0.1)
C       CALL MESSAG('      IX: ',11,0.,8.3)
C       IF(IX.EQ.1)CALL MESSAG(
C      &'CALCS. DONE AT CHANNEL EXIT - CHANNEL WIDTH VARIED$',100,XI(1),8.
C      &3)
C       IF(IX.EQ.2)CALL MESSAG(
C      &'CALCS. ALONG CHANNEL - CHANNEL WIDTH IS CONSTANT$',100,XI(1),8.3)
C       CALL MESSAG('LINE TYPE:$',100,-0.1,8.0)
C       CALL MESSAG('       SOLID',12,XI(1),8.0)
C       CALL MESSAG('         DOT',12,XI(2),8.0)
C       CALL MESSAG('        DASH',12,XI(3),8.0)
C       CALL MESSAG('      CHNDOT',12,XI(4),8.0)
C       CALL MESSAG('      CHNDSH',12,XI(5),8.0)
C       CALL MESSAG('   ICASE: ',11,0.,7.7)
C       DO 99 I=1,5,1
C          IF(I.GT.NCURVE)GO TO 98
C          IF(ICASE(I).EQ.1)CALL MESSAG('      FD LAM',12,XI(I),7.7)
C          IF(ICASE(I).EQ.2)CALL MESSAG('FD/D,LAM/TUR',12,XI(I),7.7)
C          IF(ICASE(I).EQ.3)CALL MESSAG('FD,TUR,ROUGH',12,XI(I),7.7)
C          GO TO 99
C98        CONTINUE
C          CALL MESSAG('          NA',12,XI(I),7.7)
C99     CONTINUE
C       CALL MESSAG('MATERIAL: ',11,0.,7.4)
C       DO 101 I=1,5,1
C          IF(I.GT.NCURVE)GO TO 100
C          IF(NSINK(I).EQ.1)CALL MESSAG('        GAAS',12,XI(I),7.4)
C          IF(NSINK(I).EQ.2)CALL MESSAG('          GE',12,XI(I),7.4)
C          IF(NSINK(I).EQ.3)CALL MESSAG('         INP',12,XI(I),7.4)
C          IF(NSINK(I).EQ.4)CALL MESSAG('          SI',12,XI(I),7.4)
C          IF(NSINK(I).EQ.5)CALL MESSAG('          AL',12,XI(I),7.4)
C          IF(NSINK(I).EQ.6)CALL MESSAG('          CU',12,XI(I),7.4)
C          IF(NSINK(I).EQ.7)CALL MESSAG('          AG',12,XI(I),7.4)
C          GO TO 101
C100       CONTINUE
C          CALL MESSAG('          NA',12,XI(I),7.4)
C101    CONTINUE
C       CALL MESSAG(' COOLANT: ',11,0.,7.1)
C       DO 103 I=1,5,1
C          IF(I.GT.NCURVE)GO TO 102
C          IF(NFLUID(I).EQ.1)CALL MESSAG('       FC-77',12,XI(I),7.1)
C          IF(NFLUID(I).EQ.2)CALL MESSAG('       FREON',12,XI(I),7.1)
C          IF(NFLUID(I).EQ.3)CALL MESSAG('       WATER',12,XI(I),7.1)
C          GO TO 103
C102       CONTINUE
C          CALL MESSAG('          NA',12,XI(I),7.1)
C103    CONTINUE
C       CALL MESSAG('  TFLUIN: ',11,0.,6.8)
```

```
C       DO 105 I=1,5,1
C          IF(I.GT.NCURVE)GO TO 104
C          CALL REALNO(TFLUIN(I),103,XI(I),6.8)
C          CALL MESSAG(' DEG. K',7,'ABUT','ABUT')
C          GO TO 105
C104    CONTINUE
C          CALL MESSAG('           NA',12,XI(I),6.8)
C105    CONTINUE
C       CALL MESSAG('        Q: ',11,0.,6.5)
C       DO 107 I=1,5,1
C          IF(I.GT.NCURVE)GO TO 106
C          CALL REALNO(Q(I),104,XI(I),6.5)
C          CALL MESSAG('W/CM*2',6,'ABUT','ABUT')
C          GO TO 107
C106    CONTINUE
C          CALL MESSAG('           NA',12,XI(I),6.5)
C107    CONTINUE
C       CALL MESSAG(' WCSTAR: ',11,0.,6.2)
C       DO 109 I=1,5,1
C          IF(I.GT.NCURVE)GO TO 108
C          CALL REALNO(WCSTAR(I),103,XI(I),6.2)
C          CALL MESSAG('MICRONS',7,'ABUT','ABUT')
C          GO TO 109
C108    CONTINUE
C          CALL MESSAG('           NA',12,XI(I),6.2)
C109    CONTINUE
C       CALL MESSAG('   WCEND: ',11,0.,5.9)
C       DO 111 I=1,5,1
C          IF(I.GT.NCURVE)GO TO 110
C          CALL REALNO(WCEND(I),103,XI(I),5.9)
C          CALL MESSAG('MICRONS',7,'ABUT','ABUT')
C          GO TO 111
C110    CONTINUE
C          CALL MESSAG('           NA',12,XI(I),5.9)
C111    CONTINUE
C       CALL MESSAG(' WCINCR: ',11,0.,5.6)
C       DO 113 I=1,5,1
C          IF(I.GT.NCURVE)GO TO 112
C          CALL REALNO(WCINCR(I),103,XI(I),5.6)
C          CALL MESSAG('MICRONS',7,'ABUT','ABUT')
C          GO TO 113
C112    CONTINUE
C          CALL MESSAG('           NA',12,XI(I),5.6)
C113    CONTINUE
C       CALL MESSAG(' WWBYWC: ',11,0.,5.3)
C       DO 115 I=1,5,1
C          IF(I.GT.NCURVE)GO TO 114
C          CALL MESSAG('      ',6,XI(I),5.3)
C          CALL REALNO(WWBYWC(I),104,'ABUT','ABUT')
C          GO TO 115
C114    CONTINUE
C          CALL MESSAG('           NA',12,XI(I),5.3)
C115    CONTINUE
C       CALL MESSAG('        B: ',11,0.,5.0)
C       DO 117 I=1,5,1
C          IF(I.GT.NCURVE)GO TO 116
C          BB=B(I)*1.E+6
C          IF(IZ(I).EQ.1)CALL REALNO(BB,103,XI(I),5.0)
C          IF(IZ(I).EQ.1)CALL MESSAG('MICRONS',7,'ABUT','ABUT')
C          IF(IZ(I).NE.1)CALL MESSAG('           NA',12,XI(I),5.0)
C          GO TO 117
C116    CONTINUE
C          CALL MESSAG('           NA',12,XI(I),5.0)
C117    CONTINUE
C       CALL MESSAG(' ASPECT: ',11,0.,4.7)
C       DO 119 I=1,5,1
C          IF(I.GT.NCURVE)GO TO 118
C          CALL MESSAG('     ',5,XI(I),4.7)
C          IF(IZ(I).EQ.2)CALL REALNO(ASPECT(I),105,'ABUT','ABUT')
C          IF(IZ(I).NE.2)CALL MESSAG('           NA',12,XI(I),4.7)
C          GO TO 119
C118    CONTINUE
C          CALL MESSAG('           NA',12,XI(I),4.7)
C119    CONTINUE
```

```
C        CALL MESSAG('        L: ',11,0.,4.4)
C        DO 121 I=1,5,1
C           IF(I.GT.NCURVE)GO TO 120
C           CALL MESSAG('     ',4,XI(I),4.4)
C           CALL REALNO(L(I),104,'ABUT','ABUT')
C           CALL MESSAG(' M',2,'ABUT','ABUT')
C           GO TO 121
C120     CONTINUE
C           CALL MESSAG('         NA',12,XI(I),4.4)
C121     CONTINUE
C        CALL MESSAG('        T: ',11,0.,4.1)
C        DO 123 I=1,5,1
C           IF(I.GT.NCURVE)GO TO 122
C           TT=T(I)/1.E-6
C           CALL REALNO(TT,103,XI(I),4.1)
C           CALL MESSAG('MICRONS',7,'ABUT','ABUT')
C           GO TO 123
C122     CONTINUE
C           CALL MESSAG('         NA',12,XI(I),4.1)
C123     CONTINUE
C        CALL MESSAG('   IKLOSS: ',11,0.,3.8)
C        DO 125 I=1,5,1
C           IF(I.GT.NCURVE)GO TO 124
C           IF(IKLOSS(I).EQ.0)CALL MESSAG('KC=KE=K90=0.',12,XI(I),3.8)
C           IF(IKLOSS(I).NE.0)CALL MESSAG(' KC=KE=K90=?',12,XI(I),3.8)
C           GO TO 125
C124     CONTINUE
C           CALL MESSAG('         NA',12,XI(I),3.8)
C125     CONTINUE
C        CALL MESSAG('     DELP: ',11,0.,3.5)
C        DO 127 I=1,5,1
C           IF(I.GT.NCURVE)GO TO 126
C           IF(ICONS(I).NE.1)CALL MESSAG('         NA',12,XI(I),3.5)
C           IF(ICONS(I).EQ.1)CALL MESSAG('   ',3,XI(I),3.5)
C           IF(ICONS(I).EQ.1)CALL REALNO(DELP(I),103,'ABUT','ABUT')
C           IF(ICONS(I).EQ.1)CALL MESSAG(' PSI',4,'ABUT','ABUT')
C           GO TO 127
C126     CONTINUE
C           CALL MESSAG('         NA',12,XI(I),3.5)
C127     CONTINUE
C        CALL MESSAG('   VOLUME: ',11,0.,3.2)
C        DO 129 I=1,5,1
C           IF(I.GT.NCURVE)GO TO 128
C           IF(ICONS(I).NE.2)CALL MESSAG('         NA',12,XI(I),3.2)
C           IF(ICONS(I).EQ.2)CALL REALNO(VOLUME(I),106,XI(I),3.2)
C           IF(ICONS(I).EQ.2)CALL MESSAG('CC/S',4,'ABUT','ABUT')
C           GO TO 129
C128     CONTINUE
C           CALL MESSAG('         NA',12,XI(I),3.2)
C129     CONTINUE
C        CALL MESSAG('    POWER: ',11,0.,2.9)
C        DO 131 I=1,5,1
C           IF(I.GT.NCURVE)GO TO 130
C           IF(ICONS(I).NE.3)CALL MESSAG('         NA',12,XI(I),2.9)
C           IF(ICONS(I).EQ.3)CALL REALNO(POWER(I),105,XI(I),2.9)
C           IF(ICONS(I).EQ.3)CALL MESSAG('W/CM2',5,'ABUT','ABUT')
C           GO TO 131
C130     CONTINUE
C           CALL MESSAG('         NA',12,XI(I),2.9)
C131     CONTINUE
C        CALL MESSAG('     EBYDE: ',11,0.,2.6)
C        DO 133 I=1,5,1
C           IF(I.GT.NCURVE)GO TO 132
C           IF(ICASE(I).NE.3)CALL MESSAG('         NA',12,XI(I),2.6)
C           IF(ICASE(I).EQ.3)CALL MESSAG('     ',4,XI(I),2.6)
C           IF(ICASE(I).EQ.3)CALL REALNO(EBYDE(I),106,'ABUT','ABUT')
C           GO TO 133
C132     CONTINUE
C           CALL MESSAG('         NA',12,XI(I),2.6)
C133     CONTINUE
C        CALL MESSAG('     PBYE: ',11,0.,2.3)
C        DO 135 I=1,5,1
C           IF(I.GT.NCURVE)GO TO 134
C           IF(ICASE(I).NE.3)CALL MESSAG('         NA',12,XI(I),2.3)
C           IF(ICASE(I).EQ.3)CALL MESSAG('     ',4,XI(I),2.3)
```

```
C         IF(ICASE(I).EQ.3)CALL REALNO(PBYE(I),106,'ABUT','ABUT')
C         GO TO 135
C134  CONTINUE
C         CALL MESSAG('              NA',12,XI(I),2.3)
C135  CONTINUE
C         CALL MESSAG('      PHI: ',11,0.,2.)
C         DO 137 I=1,5,1
C           IF(I.GT.NCURVE)GO TO 136
C           IF(ICASE(I).NE.3)CALL MESSAG('          NA',12,XI(I),2.)
C           IF(ICASE(I).EQ.3)CALL MESSAG('    ',4,XI(I),2.)
C           IF(ICASE(I).EQ.3)CALL REALNO(PHI(I),106,'ABUT','ABUT')
C           GO TO 137
C136  CONTINUE
C         CALL MESSAG('              NA',12,XI(I),2.)
C137  CONTINUE
C         CALL MESSAG('      ZI: ',11,0.,1.7)
C         DO 139 I=1,5,1
C           IF(I.GT.NCURVE)GO TO 138
C           IF(ICASE(I).NE.3)CALL MESSAG('          NA',12,XI(I),1.7)
C           IF(ICASE(I).EQ.3)CALL MESSAG('    ',4,XI(I),1.7)
C           IF(ICASE(I).EQ.3)CALL REALNO(ZI(I),106,'ABUT','ABUT')
C           GO TO 139
C138  CONTINUE
C         CALL MESSAG('              NA',12,XI(I),1.7)
C139  CONTINUE
C         CALL RESET('HEIGHT')
C         CALL ENDPL(0)
C         RETURN
C         END
CC END OF FILE FOR SUBROUTINE PINPUT
C------------------------------------------------------------
C RTOTAL:   WRITTEN BY RICHARD J. PHILLIPS.  RTOTAL FINALIZES THE
C           INITIALIZATION OF THE COMPUTATIONAL INPUTS, CALLS
C           SUBROUTINE RESIST (WHICH COMPUTES THE THERMAL RESISTANCE),
C           WRITES OUT THE COMPUTATIONAL RESULTS, AND STORES THE
C           VALID RESULTS INTO ARRAYS WHICH CAN BE PLOTTED.
C------------------------------------------------------------
C NAME       DESCRIPTION                                        UNITS
C ACBYAP ... RATIO OF FREE-FLOW TO FRONTAL CROSS-SECTIONAL
C            AREAS                                              (-)
C ASPECT ... CHANNEL ASPECT RATIO                               (-)
C ASPINV ... INVERSE OF THE CHANNEL ASPECT RATIO                (-)
C B      ... FIN HEIGHT                                         (M)
C CPFF   ... COOLANT SPECIFIC HEAT DATA                         (J/KG DEG K)
C CPFLUL ... COOLANT SPECIFIC HEAT AT CHANNEL EXIT              (J/KG DEG K)
C CPFLUX ... COOLANT SPECIFIC HEAT AT POSITION X                (J/KG DEG K)
C DE     ... HYDRAULIC DIAMETER                                 (M)
C DEO    ... HYDRAULIC DIAMETER                                 (MICRONS)
C DELP   ... PRESSURE DROP                                      (N/M*2)
C DELPO  ... PRESSURE DROP                                      (PSI)
C DLE    ... LAMINAR EQUIVALENT DIAMETER                        (M)
C DLEO   ... LAMINAR EQUIVALENT DIAMETER                        (MICRONS)
C DTPUML ... VISCOUS HEATING TEMPERATURE RISE AT CHANNEL
C            EXIT                                               (DEG K)
C DTPUMX ... VISCOUS HEATING TEMPERATURE RISE AT POSITION X     (DEG K)
C EBYDE  ... RATIO OF RIB HEIGHT TO HYDRAULIC DIAMETER          (-)
C EFFX   ... FIN EFFICIENCY AT CHANNEL POSITION X               (-)
C FAPP   ... APPARANT FRICTION FACTOR                           (-)
C FINCRI ... FIN CRITERION                                      (-)
C FLUID  ... ALPHANUMERIC FOR COOLANT TYPE                      (-)
C ICASE  ... CASE SELECTION CONTROL VARIABLE                    (-)
C ICONS  ... COOLANT FLOW CONSTRAINT                            (-)
C IFLOW  ... FLOW REGIME INDICATOR                              (-)
C IINUM  ... ARRAY OF INUM VALUES FOR PLOTTING CONTROL          (-)
C IKLOSS ... CONTROL FOR INCLUDING K90, KC AND KE               (-)
C IMIN,IMAX. DUMMY LOOP BEGIN/END VARIABLES                     (-)
C INUM   ... NUMBER OF DATA POINTS IN PLOTTING ARRAY DATA       (-)
C IPOINT ... PLOTTING CONTROL VARIABLE FOR XSTAR                (-)
C IRETUR ... CONTROL VARIABLE FOR OUT OF RANGE PROP. DATA       (-)
C IWC    ... LOOP INDICATOR FOR CHANNEL WIDTH                   (-)
C IX     ... CONTROL VARIABLE FOR IF X OR WC IS VARIED          (-)
C IXX    ... LOOP INDICATOR FOR CHANNEL POSITION X              (-)
C IZ     ... CONTROL VARIABLE FOR FIN HEIGHT CONSTRAINT         (-)
C KC     ... ENTRANCE PRESSURE LOSS COEFFICIENT                 (-)
```

```
C KE       ... EXIT PRESSURE LOSS COEFFICIENT                   (-)
C K90      ... NINETY DEGREE BEND PRESSURE LOSS COEFFICIENT     (-)
C KFF      ... COOLANT THERMAL CONDUCTIVITY DATA                (W/M DEG K)
C KFINL    ... AVERAGE FIN THERMAL CONDUCTIVITY AT
C              CHANNEL EXIT                                     (W/M DEG K)
C KFINX    ... AVERAGE FIN THERMAL CONDUCTIVITY AT
C              POSITION X                                       (W/M DEG K)
C KFLUL    ... COOLANT THERMAL CONDUCTIVITY AT
C              CHANNEL EXIT                                     (W/M DEG K)
C KFLUX    ... COOLANT THERMAL CONDUCTIVITY AT
C              POSITION X                                       (W/M DEG K)
C KTBL     ... AVERAGE SUBSTRATE THERMAL CONDUCTIVITY
C              AT CHANNEL EXIT                                  (W/M DEG K)
C KTBX     ... AVERAGE SUBSTRATE THERMAL CONDUCTIVITY
C              AT POSITION X                                    (W/M DEG K)
C KWW      ... SUBSTRATE THERMAL CONDUCTIVITY DATA              (W/M DEG K)
C L        ... CHANNEL LENGTH                                   (M)
C LAST     ... PREVIOUS RESULTS FOR PRINTOUT TO SCREEN  (M, (DEG K/(W/CM2)))
C LPLUS    ... HYDRODYNAMIC ENTRY LENGTH                        (-)
C MUFF     ... COOLANT DYNAMIC VISCOSITY DATA                   (KG/M S)
C MUFILA   ... AVERAGE COOLANT DYNAMIC VISCOSITY AT THE
C              AVERAGE FIN TEMPERATURE BETWEEN THE
C              CHANNEL ENTRANCE AND EXIT                        (KG/M S)
C MUFIXA   ... AVERAGE COOLANT DYNAMIC VISCOSITY AT THE
C              AVERAGE FIN TEMPERATURE BETWEEN THE
C              CHANNEL ENTRANCE AND POSITION X                  (KG/M S)
C MUFLLA   ... AVERAGE COOLANT DYNAMIC VISCOSITY AT THE
C              AVERAGE COOLANT TEMPERATURE BETWEEN THE
C              CHANNEL ENTRANCE AND EXIT                        (KG/M S)
C MUFLUL   ... COOLANT DYNAMIC VISCOSITY AT CHANNEL EXIT        (KG/M S)
C MUFLUX   ... COOLANT DYNAMIC VISCOSITY AT POSITION X          (KG/M S)
C MUFLXA   ... AVERAGE COOLANT DYNAMIC VISCOSITY AT THE
C              AVERAGE COOLANT TEMPERATURE BETWEEN THE
C              CHANNEL ENTRANCE AND POSITION X                  (KG/M S)
C NCURVE   ... CONTROL VARIBLE FOR STORAGE OF PLOTTING DATA     (-)
C NUX      ... NUSSELT NUMBER AT CHANNEL POSITION X             (-)
C NUTX     ... NUSSELT NUMBER AT CHANNEL POSITION X INCUDING
C              EFFECT OF NONUNIFORM COOLANT TEMPERATURE         (-)
C NFLUID   ... COOLANT IDENTIFIER NUMBER                        (-)
C NPROPF   ... NUMBER OF COOLANT DATA ENTRIES                   (-)
C NPROFW   ... NUMBER OF SUBSTRATE DATA ENTRIES                 (-)
C NSINK    ... SUBSTRATE MATERIAL INDENTIFIER NUMBER            (-)
C PBYE     ... RATIO OF RIB SEPARATION TO RIB HEIGHT            (-)
C PHI      ... REPEATED-RIB FLOW ATTACK ANGLE                   (DEGREES)
C POWERO   ... PUMPING POWER PER UNIT CIRCUIT SURFACE AREA      (W/CM*2)
C PPOWER   ... PUMPING POWER PER UNIT CIRCUIT SURFACE AREA      (W/CM*2)
C PRFF     ... COOLANT PRANDTL NUMBER DATA                      (-)
C PRFLUL   ... COOLANT PRANDTL NUMBER AT CHANNEL EXIT           (-)
C PRFLUX   ... COOLANT PRANDTL NUMBER AT POSITION X             (-)
C Q        ... INPUT HEAT FLUX FROM THE SURFACE                 (W/M*2)
C QO       ... INPUT HEAT FLUX FROM THE SURFACE                 (W/CM*2)
C RBFO     ... SAME AS RBFX                                     (DEG K/(2/CM*2)
C RBFX     ... FIN AND CHANNEL BASE TO COOLANT THERMAL
C              RESISTANCE AT POSITION X                         (DEG K/(W/M*2))
C RCO      ... SAME AS RCX                                      (DEG K/(W/CM*2))
C RCX      ... CONTRACTION THERMAL RESISTANCE AT POSITION X(DEG K/(W/M*2))
C REX      ... REYNOLDS NUMBER AT POSITION X                    (-)
C RESTAX   ... MODIFIED REYNOLDS NUMBER AT POSITION X           (-)
C RFFO     ... SAME AS RFFX                                     (DEG K/(2/CM*2)
C RFFX     ... COOLANT BULK TEMPERATURE RISE THERMAL
C              RESISTANCE AT POSITION X                         (DEG K/(W/M*2))
C RHOFF    ... COOLANT DENSITY DATA                             (KG/M*3)
C RHOFLL   ... COOLANT DENSITY AT CHANNEL EXIT                  (KG/M*3)
C RHOFLX   ... COOLANT DENSITY AT POSITION X                    (KG/M*3)
C RTBO     ... SAME AS RTBX                                     (DEG K/(2/CM*2))
C RTBX     ... CIRCUIT SIDE OF THE SUBSTRATE TO THE FIN
C              AND CHANNEL BASE THERMAL RESISTANCE
C              AT POSITION X                                    (DEG K/(W/M*2))
C RTOTO    ... TOTAL THERMAL RESISTANCE AT POSITION X           (DEG K/(W/CM*2))
C RTOTX    ... TOTAL THERMAL RESISTANCE AT POSITION X           (DEG K/(W/M*2))
C SINK     ... ALPHANUMERIC FOR SUBSTRATE TYPE                  (-)
C T        ... SUBSTRATE THICKNESS                              (M)
C TO       ... SUBSTRATE THICKNESS                              (MICRONS)
C TBX      ... FIN BASE TEMPERATURE AT POSITION X               (DEG K)
C TFINL    ... AVERAGE FIN TEMPERATURE AT CHANNEL EXIT          (DEG K)
```

```
C TFINX    ... AVERAGE FIN TEMPERATURE AT POSITION X         (DEG K)
C TFILAV   ... AVERAGE FIN TEMPERATURE MIDWAY BETWEEN
C              THE CHANNEL ENTRANCE AND CHANNEL EXIT         (DEG K)
C TFIXAV   ... AVERAGE FIN TEMPERATURE MIDWAY BETWEEN
C              THE CHANNEL ENTRANCE AND POSITION X           (DEG K)
C TFLLAV   ... AVERAGE COOLANT TEMPERATURE MIDWAY BETWEEN
C              THE CHANNEL ENTRANCE AND CHANNEL EXIT         (DEG K)
C TFLUIN   ... COOLANT INLET TEMPERATURE                     (DEG K)
C TFLUL    ... COOLANT MIXED MEAN TEMPERATURE AT
C              CHANNEL EXIT                                  (DEG K)
C TFLUO    ... OUTLET COOLANT TEMPERATURE                    (DEG K)
C TFLUX    ... COOLANT MIXED MEAN TEMPERATURE AT
C              POSITION X                                    (DEG K)
C TFLXAV   ... AVERAGE COOLANT TEMPERATURE MIDWAY BETWEEN
C              THE CHANNEL ENTRANCE AND POSITION X           (DEG K)
C TMAX     ... MAXIMUM SURFACE TEMPERATURE                   (DEG K)
C TOTK     ... TOTAL PRESSURE LOSS COEFFICIENT               (-)
C TPROPF   ... TEMPERATURES FOR FLUID PROPERTY DATA          (DEG K)
C TPROPW   ... TEMPERATURES FOR SUBSTRATE PROPERTY DATA      (DEG K)
C TRANS    ... TRANSITION REYNOLDS NUMBER                    (-)
C TTBL     ... AVERAGE SUBSTRATE TEMPERATURE AT
C              CHANNEL EXIT                                  (DEG K)
C TTBX     ... AVERAGE SUBSTRATE TEMPERATURE AT
C              POSITION X                                    (DEG K)
C TTIPX    ... FIN TIP TEMPERATURE AT POSITION X             (DEG K)
C TTX      ... TOP SURFACE    (CIRCUIT SIDE) TEMPERATURE
C              AT POSITION X                                 (DEG K)
C VOLUME   ... COOLANT FLOW RATE PER UNIT
C              CIRCUIT SURFACE AREA                          ((M*3/S)/CM*2)
C VOLUMO   ... COOLANT FLOW RATE PER UNIT
C              CIRCUIT SURFACE AREA                          ((CM*3/S)/CM*2)
C V1CX     ... COOLANT FLOW VELOCITY AT POSITION X           (M/S)
C WC       ... CHANNEL WIDTH                                 (M)
C WCO      ... CHANNEL WIDTH                                 (MICRONS)
C WCEND    ... MAXIMUM CHANNEL WIDTH CONTROL VARIABLE        (-)
C WCINCR   ... CHANNEL WIDTH INCREMENT CONTROL VARIABLE      (-)
C WCSTAR   ... MINIMUM CHANNEL WIDTH CONTROL VARIABLE        (-)
C WW       ... FIN WIDTH                                     (M)
C WWBYWC   ... RATIO OF FIN WIDTH TO THE CHANNEL WIDTH       (-)
C WWO      ... FIN WIDTH                                     (MICRONS)
C X        ... POSITION FROM CHANNEL ENTRANCE                (M)
C X1       ... CHANNEL WIDTH PLOTTING DATA                   (MICRONS)
C XX       ... POSITION FROM CHANNEL ENTRANCE PLOTTING DATA  (M)
C XSTAR    ... THERMAL ENTRY LENGTH                          (-)
C XSTARX   ... THERMAL ENTRY LENGTH PLOTTING DATA            (-)
C Y1A      ... RTOTO PLOTTING DATA                           (DEG K/(W/CM*2))
C Y1B      ... RBFO PLOTTING DATA                            (DEG K/(W/CM*2))
C Y1C      ... RFFO PLOTTING DATA                            (DEG K/(W/CM*2))
C Y2       ... POWERO PLOTTING DATA                          (W/CM*2)
C Y3       ... IPLOINT PLOTTING DATA                         (-)
C Z        ... FIN HEIGHT                                    (M)
C ZO       ... FIN HEIGHT                                    (MICRONS)
C ZI       ... REPEATED-RIB SHAPE ANGLE                      (DEGREES)
C-----------------------------------------------------------------------
      SUBROUTINE RTOTAL(NCURVE,NSINK,NFLUID,TFLUIN,Q,ICASE,
     1                  WCSTAR,WCEND,WCINCR,WWBYWC,B,IZ,IX,
     1                  ASPECT,L,T,IKLOSS,ICONS,DELP,VOLUME,PPOWER,
     1                  EBYDE,PBYE,PHI,ZI,X1,Y1A,Y1B,Y1C,Y2,Y3,IINUM,
     1                  XX,XSTARX)
C INITIALIZE ARRAYS
      DIMENSION WC(400),RTOTX(400),
     1          TPROPF(20),CPFF(20),KFF(20),MUFF(20),PRFF(20),RHOFF(20),
     1          TPROPW(20),KWW(20),
     1          TTX(2),TBX(2),TTIPX(2),TFLUO(2),
     1          X1(5,2,100),Y1A(5,2,100),Y2(5,2,100),Y3(5,2,100),
     1          IINUM(5,2),Y1B(5,2,100),Y1C(5,2,100),XX(5,2,100),
     1          XSTARX(5,2,100),LAST(6)
      CHARACTER*4 FLUID(3),SINK(4)
      INTEGER WCSTAR,WCEND,WCINCR
      REAL KC,KE,K90,L,LPLUS,NUX,NUTX,KFF,KWW,MUFF,
     1     KFINL,KFINX,KFLUL,KFLUX,KTBL,KTBX,MUFILA,MUFIXA,MUFLLA,
     1     MUFLXA,MUFLUL,MUFLUX,LAST
C OBTAIN PROPERTY DATA ARRAYS FOR THE COOLANT AND THE SUBSTRATE
      CALL PROPER(NFLUID,NSINK,FLUID,SINK,
```

```
     &                  NPROPF,TPROPF,CPFF,KFF,MUFF,PRFF,RHOFF,
     &                  NPROPW,TPROPW,KWW)
C PRINTOUT INITIALIZATION FOR EACH NCURVE
      Q0=Q/10000.
      IIMAX=0
      CALL PRINTO(FLUID,TFLUIN,SINK,Q0,0)
C
C FLOW REGIME LOOP FOR THE THREE CASES
C
      IF(ICASE.EQ.2)GO TO 510
      IF(ICASE.EQ.3)GO TO 520
C     ICASE=1 - FULLY DEVELOPED LAMINAR FLOW IN SMOOTH
C               CHANNELS
      IMIN=1
      IMAX=1
      GO TO 530
510   CONTINUE
C     ICASE=2 - FULLY DEVELOPED AND DEVELOPING, LAMINAR AND
C               TURBULENT FLOW IN SMOOTH CHANNELS
      IMIN=1
      IMAX=2
      GO TO 530
520   CONTINUE
C     ICASE=3 - FULLY DEVELOPED TURBULENT FLOW IN REPEATED-RIB
C               ROUGHENED CHANNELS
      IMIN=2
      IMAX=2
530   CONTINUE
      DO 70000 IFLOW=IMIN,IMAX,1
C LABEL OUTPUT FILES
         DO 580 II=11,17,2
            IF(ICASE.EQ.1)WRITE(II,600)
            IF((IFLOW.EQ.1).AND.(ICASE.EQ.2))WRITE(II,601)
            IF((IFLOW.EQ.2).AND.(ICASE.EQ.2))WRITE(II,602)
            IF(ICASE.EQ.3)WRITE(II,603)
580      CONTINUE
600      FORMAT(' FULLY DEVELOPED LAMINAR FLOW IN SMOOTH CHANNELS')
601      FORMAT(' FULLY DEVELOPED/DEVELOPING LAMINAR FLOW IN SMOOTH ',
     &          'CHANNELS')
602      FORMAT(' FULLY DEVELOPED/DEVELOPING TURBULENT FLOW IN SMOOTH ',
     &          'CHANNELS')
603      FORMAT(' FULLY DEVELOPED TURBULENT FLOW IN REPEATED-',
     &          'RIB ROUGHENED CHANNELS')
C
C POSITION FROM CHANNEL ENTRANCE IMPLIED DO LOOP
C
      INUM=0
      IRETUR=1
      IXX=0
C
50    IXX=IXX+1
      IF(IXX.GT.100)GO TO 2000
C COMPUTE CHANNEL POSITION
         IF(IX.EQ.1)IXX=100
         X=L*0.01*FLOAT(101-IXX)
         IF(IX.EQ.1)X=L
C
C CHANNEL WIDTH LOOP
C
      DO 1000 IWC=WCSTAR,WCEND,WCINCR
         WC(IWC)=FLOAT(IWC)*01.E-06
         WW=WWBYWC*WC(IWC)
C        COMPUTE ASPECT RATIO AND Z
         IF(IZ.EQ.1)ASPECT=B/WC(IWC)
         IF(IZ.EQ.1)Z=B
         IF(IZ.EQ.2)Z=WC(IWC)*ASPECT
         ASPINV=1./ASPECT
C        THE NEXT LINE ASSUMES THAT THE PLENUM WIDTH IS 0.040 INCH
         ACBYAP=(WC(IWC)*Z)/((WW+WC(IWC))*0.040*0.0254)
C        COMPUTE HYDRAULIC DIAMETER
         IF(ASPECT.LE.0.1)DE=2.*Z
         IF((ASPECT.GT.0.1).AND.(ASPECT.LT.10.))
     &                   DE=4.*WC(IWC)*Z/(2.*(WC(IWC)+Z))
         IF(ASPECT.GE.10.)DE=2.*WC(IWC)
C        IF(ICASE.EQ.1)DE=2.*WC(IWC)
```

```
C         IF DE IS TOO SMALL DON'T DO COMPUTATIONS BECAUSE OF ERRORS
          IF(DE.LT.5.E-6)GO TO 55
C         COMPUTE LAMINAR EQUIVALENT DIAMETER - EQN. 2.3
          IF(IFLOW.NE.2)DLE=0.
          IF((IFLOW.EQ.2).AND.(ASPECT.GE.1.))
     &    DLE=DE*((2./3.)+(11./24.)*(ASPINV)*(2.-(ASPINV)))
          IF((IFLOW.EQ.2).AND.(ASPECT.LT.1.))
     &    DLE=DE*((2./3.)+(11./24.)*(ASPECT)*(2.-(ASPECT)))
C COMPUTE THERMAL RESISTANCE
          CALL RESIST(NCURVE,ICASE,IFLOW,IX,
     &    Q,WC(IWC),WW,X,L,T,ASPECT,ASPINV,Z,DE,DLE,ACBYAP,
     &    IKLOSS,ICONS,DELP,VOLUME,PPOWER,
     &    EBYDE,PBYE,PHI,ZI,
     &    TFLUIN,NPROPF,TPROPF,CPFF,KFF,MUFF,PRFF,RHOFF,
     &    NPROPW,TPROPW,KWW,
     &    IRETUR,TTX,TBX,TTIPX,TFLUO,DTPUML,DTPUMX,
     &    TFINL,TFLUL,TTBL,TFINX,TFLUX,TTBX,TFLLAV,TFLXAV,TFILAV,TFIXAV,
     &    CPFLUL,KFLUL,MUFLUL,PRFLUL,RHOFLL,MUFLLA,MUFILA,KFINL,KTBL,
     &    CPFLUX,KFLUX,MUFLUX,PRFLUX,RHOFLX,MUFLXA,MUFIXA,KFINX,KTBX,
     &    NUX,NUTX,V1CX,K90,KC,KE,FAPP,FINCRI,EFFX,
     &    TRANS,REX,RESTAX,XSTAR,LPLUS,
     &    RTBX,RCX,RBFX,RFFX,RTOTX(IWC))
C COME TO THIS LOCATION IF DE IS TOO SMALL
 55       CONTINUE
C IF RE>3000 FOR LAMINAR FLOW, STOP LAMINAR FLOW CALCS.
C         IF((ICASE.NE.1).AND.((IFLOW.EQ.1).AND.(REX.GT.3000.)))GO TO 1009
C CHECK IF CHIP SURFACE TEMPERATURE (K) IS TOO LARGE TO BE OF INTEREST
          TMAX=Q*RTOTX(IWC)+(TFLUIN+DTPUML)
C         IF(TMAX.GT.400.)GO TO 900
C MODIFY UNITS FOR PRINTOUT
          WCO=WC(IWC)*1.E+6
          WWO=WW*1.E+6
          DEO=DE*1.E+6
          DLEO=DLE*1.E+6
          ZO=Z*1.E+6
          TO=T*1.E+6
          DELPO=DELP/6894.8
          VOLUMO=VOLUME*1.E+6
          POWERO=PPOWER
          RTBO=RTBX*1.E+4
          RCO=RCX*1.E+4
          RBFO=RBFX*1.E+4
          RFFO=RFFX*1.E+4
          RTOTO=RTOTX(IWC)*1.E+4
C CHECK IF RESULTS ARE TO BE PRINTED OUT (IF RE IS IN PROPER RANGE)
          IF((IFLOW.EQ.1).AND.(REX.GT.TRANS))GO TO 1008
          IF((IFLOW.EQ.2).AND.(REX.LT.TRANS))GO TO 1008
C WRITE SOME GOODIES TO THE SCREEN
C         TOTK=(ACBYAP**2.)*2.*K90+KC+KE
C         WRITE(6,999)NCURVE,REX,DELPO,TOTK
C999      FORMAT(' NCURVE = ',I1,'  REX = ',F6.0,'  DELP = ',F5.1,
C        &' PSI   TOTK = ',F4.1)
C PRINTOUT RESULTS
          WRITE(11,1001,ERR=1002)
     &              WCO,WWO,X,ZO,TO,ASPECT,ACBYAP,EBYDE,PBYE,PHI,ZI,
     &              DELPO,VOLUMO,POWERO,RTBO,RCO,RBFO,RFFO,RTOTO,DTPUML
 1001     FORMAT(2(1X,F5.1),1X,F4.3,1X,F6.1,1X,F5.1,1X,F5.2,1X,F5.2,1X,
     &           1X,F5.3,1X,F4.1,2(1X,F3.0),1X,F4.0,1X,F6.2,1X,F5.2,1X,
     &           5(1X,F6.4),1X,F6.3)
 1002     CONTINUE
          WRITE(13,1003,ERR=1004)
     &              DEO,DLEO,V1CX,REX,RESTAX,XSTAR,LPLUS,NUX,NUTX,FAPP,
     &              K90,KC,KE,FINCRI,EFFX
 1003     FORMAT(2(1X,F5.1),1X,F5.2,2(1X,F6.0),2(1X,F6.4),2(1X,F6.2),
     &           1X,F6.5,3(1X,F4.2),1X,F6.2,1X,F6.5)
 1004     CONTINUE
          WRITE(15,1005,ERR=1006)
     &              TFINL,TFLUL,TTBL,TFLLAV,TFILAV,TFINX,TFLUX,TTBX,
     &              TFLXAV,TFIXAV,TTX(2),TBX(2),TTIPX(2),TFLUO(2),
     &              DTPUML,DTPUMX
 1005     FORMAT(14(1X,F6.1),2(1X,F6.3))
 1006     CONTINUE
          WRITE(17,1007,ERR=1008)
     &              CPFLUL,CPFLUX,KFLUL,KFLUX,PRFLUL,PRFLUX,
```

```
     &                   RHOFLL,RHOFLX,MUFLUL,MUFLUX,MUFLLA,MUFLXA,MUFILA,
     &                   MUFIXA,KFINL,KFINX,KTBL,KTBX
1007 FORMAT(2(1X,F6.1),2(1X,F6.4),2(1X,F6.3),2(1X,F6.1),
     &       6(1X,F6.5),4(1X,F6.2))
1008 CONTINUE
C CHECK IF VALID DATA FOR PLOTTING
      IF(IRETUR.EQ.1)GO TO 900
      IF(RTOTO.LT.1.E-10)GO TO 900
C IDENTIFY POINT TYPES FOR PPLOTT
      IF((IFLOW.EQ.1).AND.(XSTAR.GT.0.1))IPOINT=1
      IF((IFLOW.EQ.2).AND.(XSTAR.GT.0.01))IPOINT=1
      IF((IFLOW.EQ.1).AND.(XSTAR.LE.0.1))IPOINT=2
      IF((IFLOW.EQ.2).AND.(XSTAR.LE.0.01))IPOINT=2
      IF((IFLOW.EQ.1).AND.(XSTAR.LT.0.005))IPOINT=3
      IF((IFLOW.EQ.2).AND.(REX.GT.28000.))IPOINT=3
C FILL PLOTTING ARRAYS
      INUM=INUM+1
      XX(NCURVE,IFLOW,INUM)=X
      XSTARX(NCURVE,IFLOW,INUM)=XSTAR
      X1(NCURVE,IFLOW,INUM)=WCO
      Y1A(NCURVE,IFLOW,INUM)=RTOTO
      Y1B(NCURVE,IFLOW,INUM)=RBFO
      Y1C(NCURVE,IFLOW,INUM)=RFFO
      Y2(NCURVE,IFLOW,INUM)=POWERO
      Y3(NCURVE,IFLOW,INUM)=IPOINT
900   CONTINUE
      IF(IXX.EQ.1)GO TO 905
C WRITE MAXIMUM THERMAL RESISTANCE VALUES TO THE SCREEN
      IF(((IX.EQ.2).AND.(RTOTO.LT.LAST(6))).AND.(IIMAX.EQ.0))
     &WRITE(5,902)(LAST(ILAST),ILAST=1,6),REX
902   FORMAT(/,' ...X... ..RTBX.. ...RCX.. ..RBFX.. ..RFFX.. ..RTOTX..
     & ..REX..',/,1X,F7.6,2X,F6.4,3X,F6.4,3X,F6.4,3X,F6.4,3X,F7.4,2X,
     &F6.1)
      IF(((IX.EQ.2).AND.(RTOTO.LT.LAST(6))).AND.(IIMAX.EQ.0))
     &IIMAX=1
905   CONTINUE
C FILL PREVIOUS VALUE ARRAY FOR PRINTOUT WHEN MAXIMUM REACHED
      LAST(1)=X
      LAST(2)=RTBO
      LAST(3)=RCO
      LAST(4)=RBFO
      LAST(5)=RFFO
      LAST(6)=RTOTO
C ZERO COMPUTED VALUES SO THAT IF EXECUTION RETURNS TO THIS RTOTAL
C SUBROUTINE, IT CAN BE MORE READILY DETERMINED WHICH CRITERION WAS
C NOT SATISFIED.
      RTBX=0.
      RCX=0.
      RBFX=0.
      RFFX=0.
      RTOTX(IWC)=0.
      DTPUMX=0.
      NUX=0.
      NUTX=0.
      FINCRI=0.
      EFFX=0.
      V1CX=0.
      REX=0.
      RESTAX=0.
      LPLUS=0.
      XSTAR=0.
      FAPP=0.
1000  CONTINUE
1009  CONTINUE
C     CHANNEL WIDTH LOOP TERMINATED
      IF(IX.EQ.1)GO TO 2001
      GO TO 50
2000  CONTINUE
2001  CONTINUE
C     POSITION FROM CHANNEL ENTRANCE LOOP TERMINATED
      IINUM(NCURVE,IFLOW)=INUM
70000 CONTINUE
C     FLOW REGIME LOOP TERMINATED
C PRINTOUT TERMINATION FOR EACH NCURVE
      CALL PRINTO(FLUID,TFLUIN,SINK,Q,1)
```

```
      RETURN
      END
C END OF FILE FOR SUBROUTINE RTOTAL
C----------------------------------------------------------------------
C TEMPS: WRITTEN BY RICHARD J. PHILLIPS. TEMPS COMPUTES THE
C          NEW COOLANT AND SUBSTRATE TEMPERATURES AT VARIOUS LOCATIONS
C          SO THAT THE AVERAGE PROPERTIES MAY BE COMPUTED.
C----------------------------------------------------------------------
C NAME          DESCRIPTION                                UNITS
C DTPUML ... VISCOUS HEATING COOLANT TEMPERATURE RISE
C                 UP TO CHANNEL EXIT                       (DEG K)
C DTPUMX ... VISCOUS HEATING COOLANT TEMPERATURE RISE
C                 UP TO POSITION X                         (DEG K)
C EFFL   ... FIN EFFICIENCY AT CHANNEL EXIT                (-)
C EFFX   ... FIN EFFICIENCY AT POSITION X                  (-)
C ERROR1-4.. RELATIVE ERROR                                (-)
C ICLOSE ... ITERATION CONTROL VARIABLE                    (-)
C MZL,MZX... FIN EFFICIENCY VARIABLE                       (-)
C Q      ... INPUT HEAT FLUX FROM THE SURFACE              (W/CM*2)
C RBFL   ... FIN AND CHANNEL BASE TO COOLANT THERMAL
C                 RESISTANCE AT CHANNEL EXIT          (DEG K/(W/M*2))
C RBFX   ... FIN AND CHANNEL BASE TO COOLANT THERMAL
C                 RESISTANCE AT POSITION X            (DEG K/(W/M*2))
C RFFL   ... COOLANT BULK TEMPERATURE RISE THERMAL
C                 RESISTANCE AT CHANNEL EXIT          (DEG K/(W/M*2))
C RFFX   ... COOLANT BULK TEMPERATURE RISE THERMAL
C                 RESISTANCE AT POSITION X            (DEG K/(W/M*2))
C RTBL   ... CIRCUIT SIDE OF THE SUBSTRATE TO THE FIN
C                 AND CHANNEL BASE THERMAL RESISTANCE
C                 AT CHANNEL EXIT                     (DEG K/(W/M*2))
C RTBX   ... CIRCUIT SIDE OF THE SUBSTRATE TO THE FIN
C                 AND CHANNEL BASE THERMAL RESISTANCE
C                 AT POSITION X                       (DEG K/(W/M*2))
C RTOTL  ... TOTAL THERMAL RESISTANCE AT CHANNEL EXIT(DEG K/(W/M*2))
C RTOTX  ... TOTAL THERMAL RESISTANCE AT POSITION X  (DEG K/(W/M*2))
C TBL    ... FIN BASE TEMPERATURE AT CHANNEL EXIT          (DEG K)
C TBX    ... FIN BASE TEMPERATURE AT POSITION X            (DEG K)
C TFILAV ... AVERAGE FIN TEMPERATURE MIDWAY BETWEEN
C                 THE CHANNEL ENTRANCE AND CHANNEL EXIT    (DEG K)
C TFINL  ... AVERAGE FIN TEMPERATURE AT CHANNEL EXIT       (DEG K)
C TFINX  ... AVERAGE FIN TEMPERATURE AT POSITION X         (DEG K)
C TFIXAV ... AVERAGE FIN TEMPERATURE MIDWAY BETWEEN
C                 THE CHANNEL ENTRANCE AND POSITION X      (DEG K)
C TFLLAV ... AVERAGE COOLANT TEMPERATURE MIDWAY BETWEEN
C                 THE CHANNEL ENTRANCE AND CHANNEL EXIT    (DEG K)
C TFLUIN ... COOLANT INLET TEMPERATURE                     (DEG K)
C TFLUL  ... COOLANT MIXED MEAN TEMPERATURE AT
C                 CHANNEL EXIT                             (DEG K)
C TFLUO  ... OUTLET COOLANT TEMPERATURE                    (DEG K)
C TFLUX  ... COOLANT MIXED MEAN TEMPERATURE AT
C                 POSITION X                               (DEG K)
C TFLXAV ... AVERAGE COOLANT TEMPERATURE MIDWAY BETWEEN
C                 THE CHANNEL ENTRANCE AND POSITION X      (DEG K)
C TTBL   ... AVERAGE SUBSTRATE TEMPERATURE AT
C                 CHANNEL EXIT                             (DEG K)
C TTBX   ... AVERAGE SUBSTRATE TEMPERATURE AT
C                 POSITION X                               (DEG K)
C TTL    ... TOP SURFACE     (CIRCUIT SIDE) TEMPERATURE
C                 AT CHANNEL EXIT                          (DEG K)
C TTX    ... TOP SURFACE     (CIRCUIT SIDE) TEMPERATURE
C                 AT POSITION X                            (DEG K)
C TTIPL  ... FIN TIP TEMPERATURE AT CHANNEL EXIT           (DEG K)
C TTIPX  ... FIN TIP TEMPERATURE AT POSITION X             (DEG K)
C----------------------------------------------------------------------
      SUBROUTINE TEMPS(TTX,TBX,TTIPX,TFLUIN,TFLUO,
     &                 TFLUL,TFLUX,TFINL,TFINX,TTBL,TTBX,
     &                 TFLLAV,TFLXAV,TFILAV,TFIXAV,
     &                 RTBL,RBFL,RFFL,RTOTL,RTBX,RBFX,RFFX,RTOTX,
     &                 Q,DTPUML,DTPUMX,MZL,EFFL,MZX,EFFX,ICLOSE)
C INITIALIZE VARIABLE ARRAYS
      DIMENSION TTX(2),TBX(2),TTIPX(2),TFLUO(2)
      REAL MZL,MZX
C COMPUTE NEW TEMPERATURES
C    COOLANT AT CHANNEL EXIT
```

```
      TFLUL=RFFL*Q+(TFLUIN+DTPUML)
      TFLUO(2)=TFLUL
      TFLLAV=(TFLUL+TFLUIN)/2.
C   COOLANT AT POSITION X
      TFLUX=RFFX*Q+(TFLUIN+DTPUMX)
      TFLXAV=(TFLUX+TFLUIN)/2.
C   FIN AT CHANNEL EXIT
      TBL=(RFFL+RBFL)*Q+(TFLUIN+DTPUML)
      IF(MZL.EQ.0.)RETURN
      TTIPL=((TBL-TFLUL)/COSH(MZL))+TFLUL
      TFINL=((TBL-TFLUL)*EFFL)+TFLUL
      TFILAV=(TFINL+TFLUIN)/2.
C   FIN AT POSITION X
      TBX(2)=(RFFX+RBFX)*Q+(TFLUIN+DTPUMX)
      IF(MZX.EQ.0.)RETURN
      TTIPX(2)=((TBX(2)-TFLUX)/COSH(MZX))+TFLUX
      TFINX=((TBX(2)-TFLUX)*EFFX)+TFLUX
      TFIXAV=(TFINX+TFLUIN)/2.
C   CAP SUBSTRATE AT CHANNEL EXIT
      TTL=RTOTL*Q+(TFLUIN+DTPUML)
      TTBL=(TTL+TBL)/2.
C   CAP SUBSTRATE AT POSITION X
      TTX(2)=RTOTX*Q+(TFLUIN+DTPUMX)
      TTBX=(TTX(2)+TBX(2))/2.
C   CHECK TEMPERATURE ERRORS
      ERROR1=ABS((TFLUO(1)-TFLUO(2))/TFLUO(1))
      ERROR2=ABS((TBX(1)-TBX(2))/TBX(1))
      ERROR3=ABS((TTIPX(1)-TTIPX(2))/TTIPX(1))
      ERROR4=ABS((TTX(1)-TTX(2))/TTX(1))
C     WRITE(6,*)TFLUO,TBX,TTIPX,TTX
C     WRITE(6,*)ERROR1,ERROR2,ERROR3,ERROR4
      IF(ERROR1.GT.0.0001)GO TO 500
      IF(ERROR2.GT.0.0001)GO TO 500
      IF(ERROR3.GT.0.0001)GO TO 500
      IF(ERROR4.GT.0.0001)GO TO 500
C   CLOSE ENOUGH
      ICLOSE=0
      RETURN
500   CONTINUE
C   RESET TEMPERATURES AND TRY AGAIN
      ICLOSE=1
      TFLUO(1)=(TFLUO(2)+TFLUO(1))/2.
      TBX(1)=(TBX(2)+TBX(1))/2.
      TTIPX(1)=(TTIPX(2)+TTIPX(1))/2.
      TTX(1)=(TTX(2)+TTX(1))/2.
      RETURN
      END
C END OF FILE FOR SUBROUTINE TEMPS
C------------------------------------------------------------
C PROP:  WRITTEN BY RICHARD J. PHILLIPS.  PROP COMPUTES THE
C        LIQUID COOLANT AND SUBSTRATE MATERIAL PROPERTIES.
C------------------------------------------------------------
C NAME           DESCRIPTION                                UNITS
C CPFF    ... COOLANT SPECIFIC HEAT DATA                    (J/KG DEG K)
C CPFLUL  ... COOLANT SPECIFIC HEAT AT CHANNEL EXIT         (J/KG DEG K)
C CPFLUX  ... COOLANT SPECIFIC HEAT AT POSITION X           (J/KG DEG K)
C FACTOR  ... INTERPOLATION PARAMETER                       (-)
C IRETUR  ... CONTROL VARIABLE FOR OUT OF RANGE DATA        (-)
C KFF     ... COOLANT THERMAL CONDUCTIVITY DATA             (W/M DEG K)
C KFINL   ... AVERAGE FIN THERMAL CONDUCTIVITY AT
C              CHANNEL EXIT                                 (W/M DEG K)
C KFINX   ... AVERAGE FIN THERMAL CONDUCTIVITY AT
C              POSITION X                                   (W/M DEG K)
C KFLUL   ... COOLANT THERMAL CONDUCTIVITY AT
C              CHANNEL EXIT                                 (W/M DEG K)
C KFLUX   ... COOLANT THERMAL CONDUCTIVITY AT
C              POSITION X                                   (W/M DEG K)
C KTBL    ... AVERAGE SUBSTRATE THERMAL CONDUCTIVITY
C              AT CHANNEL EXIT                              (W/M DEG K)
C KTBX    ... AVERAGE SUBSTRATE THERMAL CONDUCTIVITY
C              AT POSITION X                                (W/M DEG K)
C KWW     ... SUBSTRATE THERMAL CONDUCTIVITY DATA           (W/M DEG K)
C MUFF    ... COOLANT DYNAMIC VISCOSITY DATA                (KG/M S)
C MUFILA  ... AVERAGE COOLANT DYNAMIC VISCOSITY AT THE
```

```
C                      AVERAGE FIN TEMPERATURE BETWEEN THE
C                      CHANNEL ENTRANCE AND EXIT                      (KG/M S)
C MUFIXA ... AVERAGE COOLANT DYNAMIC VISCOSITY AT THE
C                      AVERAGE FIN TEMPERATURE BETWEEN THE
C                      CHANNEL ENTRANCE AND POSITION X                (KG/M S)
C MUFLLA ... AVERAGE COOLANT DYNAMIC VISCOSITY AT THE
C                      AVERAGE COOLANT TEMPERATURE BETWEEN THE
C                      CHANNEL ENTRANCE AND EXIT                      (KG/M S)
C MUFLXA ... AVERAGE COOLANT DYNAMIC VISCOSITY AT THE
C                      AVERAGE COOLANT TEMPERATURE BETWEEN THE
C                      CHANNEL ENTRANCE AND POSITION X                (KG/M S)
C MUFLUL ... COOLANT DYNAMIC VISCOSITY AT CHANNEL EXIT                (KG/M S)
C MUFLUX ... COOLANT DYNAMIC VISCOSITY AT POSITION X                  (KG/M S)
C NPROP  ... DUMMY VARIABLE                                           (-)
C NPROPF ... NUMBER OF COOLANT DATA ENTRIES                           (-)
C NPROPW ... NUMBER OF SUBSTRATE MATERIAL DATA ENTRIES                (-)
C PRFF   ... COOLANT PRANDTL NUMBER DATA                              (-)
C PRFLUL ... COOLANT PRANDTL NUMBER AT CHANNEL EXIT                   (-)
C PRFLUX ... COOLANT PRANDTL NUMBER AT POSITION X                     (-)
C RHOFF  ... COOLANT DENSITY DATA                                     (KG/M*3)
C RHOFLL ... COOLANT DENSITY AT CHANNEL EXIT                          (KG/M*3)
C RHOFLX ... COOLANT DENSITY AT POSITION X                            (KG/M*3)
C TFILAV ... AVERAGE FIN TEMPERATURE MIDWAY BETWEEN
C                      THE CHANNEL ENTRANCE AND CHANNEL EXIT          (DEG K)
C TFIXAV ... AVERAGE FIN TEMPERATURE MIDWAY BETWEEN
C                      THE CHANNEL ENTRANCE AND POSITION X            (DEG K)
C TFLLAV ... AVERAGE COOLANT TEMPERATURE MIDWAY BETWEEN
C                      THE CHANNEL ENTRANCE AND CHANNEL EXIT          (DEG K)
C TFLXAV ... AVERAGE COOLANT TEMPERATURE MIDWAY BETWEEN
C                      THE CHANNEL ENTRANCE AND POSITION X            (DEG K)
C TFINX  ... AVERAGE FIN TEMPERATURE AT POSITION X                    (DEG K)
C TFINL  ... AVERAGE FIN TEMPERATURE AT CHANNEL EXIT                  (DEG K)
C TFLUL  ... COOLANT MIXED MEAN TEMPERATURE AT
C                      CHANNEL EXIT                                   (DEG K)
C TFLUX  ... COOLANT MIXED MEAN TEMPERATURE AT
C                      POSITION X                                     (DEG K)
C TPROPF ... TEMPERATURES FOR FLUID PROPERTY DATA                     (DEG K)
C TPROPW ... TEMPERATURES FOR SUBSTRATE PROPERTY DATA                 (DEG K)
C TTBL   ... AVERAGE SUBSTRATE TEMPERATURE AT
C                      CHANNEL EXIT                                   (DEG K)
C TTBX   ... AVERAGE SUBSTRATE TEMPERATURE AT
C                      POSITION X                                     (DEG K)
C----------------------------------------------------------------------
      SUBROUTINE PROP(NPROPF,TPROPF,CPFF,KFF,MUFF,PRFF,RHOFF,
     1                NPROPW,TPROPW,KWW,
     1                TFLUX,CPFLUX,KFLUX,MUFLUX,PRFLUX,RHOFLX,
     1                TFINX,KFINX,TTBX,KTBX,
     1                TFLUL,CPFLUL,KFLUL,MUFLUL,PRFLUL,RHOFLL,
     1                TFINL,KFINL,TTBL,KTBL,
     1                TFLLAV,MUFLLA,TFLXAV,MUFLXA,
     1                TFILAV,MUFILA,TFIXAV,MUFIXA,IRETUR)
C INITIALIZE VARIABLE ARRAYS
      DIMENSION TPROPF(20),CPFF(20),KFF(20),MUFF(20),PRFF(20),RHOFF(20),
     1          TPROPW(20),KWW(20)
      REAL MUFF,KFF,KWW,KFLUX,MUFLUX,KFINX,KTBX,KFLUL,MUFLUL,KFINL,KTBL,
     1     MUFLLA,MUFLXA,MUFILA,MUFIXA
C OUT OF TEMPERATURE RANGE CONTROL
C      0 = WITHIN RANGE
C      1 = OUT OF RANGE
      IRETUR=0
C**********
C CONSTANT PROPERTY VALUES OBTAINED AT CHANNEL POSITION X
C**********
C COOLANT
      NPROP=NPROPF-1
      DO 100 I=1,NPROP
         IF((TFLUX.GE.TPROPF(I)).AND.(TFLUX.LT.TPROPF(I+1)))GO TO 150
100   CONTINUE
      WRITE(11,101)
101   FORMAT(' TFLUX IS OUT OF RANGE OF PROPERTY DATA ')
      IRETUR=1
      RETURN
150   CONTINUE
      FACTOR=(TFLUX-TPROPF(I))/(TPROPF(I+1)-TPROPF(I))
```

```
        CPFLUX=FACTOR*(CPFF(I+1)-CPFF(I))+CPFF(I)
        KFLUX=FACTOR*(KFF(I+1)-KFF(I))+KFF(I)
        MUFLUX=FACTOR*(MUFF(I+1)-MUFF(I))+MUFF(I)
        PRFLUX=FACTOR*(PRFF(I+1)-PRFF(I))+PRFF(I)
        RHOFLX=FACTOR*(RHOFF(I+1)-RHOFF(I))+RHOFF(I)
C FIN
        NPROP=NPROPW-1
        DO 200 I=1,NPROP,1
            IF((TFINX.GE.TPROPW(I)).AND.(TFINX.LT.TPROPW(I+1)))GO TO 250
200     CONTINUE
        WRITE(11,201)
201     FORMAT(' TFINX IS OUT OF RANGE FOR PROPERTY DATA ')
        IRETUR=1
        RETURN
250     CONTINUE
        FACTOR=(TFINX-TPROPW(I))/(TPROPW(I+1)-TPROPW(I))
        KFINX=FACTOR*(KWW(I+1)-KWW(I))+KWW(I)
C CAP (SOLID SUBSTRATE MATERIAL)
        NPROP=NPROPW-1
        DO 300 I=1,NPROP,1
            IF((TTBX.GE.TPROPW(I)).AND.(TTBX.LT.TPROPW(I+1)))GO TO 350
300     CONTINUE
        WRITE(11,301)
301     FORMAT(' TTBX IS OUT OF RANGE FOR PROPERTY DATA')
        IRETUR=1
        RETURN
350     CONTINUE
        FACTOR=(TTBX-TPROPW(I))/(TPROPW(I+1)-TPROPW(I))
        KTBX=FACTOR*(KWW(I+1)-KWW(I))+KWW(I)
C**********
C CONSTANT PROPERTY VALUES OBTAINED AT THE CHANNEL EXIT
C**********
C COOLANT
        NPROP=NPROPF-1
        DO 400 I=1,NPROP
            IF((TFLUL.GE.TPROPF(I)).AND.(TFLUL.LT.TPROPF(I+1)))GO TO 450
400     CONTINUE
        WRITE(11,401)
401     FORMAT(' TFLUL IS OUT OF RANGE OF PROPERTY DATA ')
        IRETUR=1
        RETURN
450     CONTINUE
        FACTOR=(TFLUL-TPROPF(I))/(TPROPF(I+1)-TPROPF(I))
        CPFLUL=FACTOR*(CPFF(I+1)-CPFF(I))+CPFF(I)
        KFLUL=FACTOR*(KFF(I+1)-KFF(I))+KFF(I)
        MUFLUL=FACTOR*(MUFF(I+1)-MUFF(I))+MUFF(I)
        PRFLUL=FACTOR*(PRFF(I+1)-PRFF(I))+PRFF(I)
        RHOFLL=FACTOR*(RHOFF(I+1)-RHOFF(I))+RHOFF(I)
C FIN
        NPROP=NPROPW-1
        DO 500 I=1,NPROP,1
            IF((TFINL.GE.TPROPW(I)).AND.(TFINL.LT.TPROPW(I+1)))GO TO 550
500     CONTINUE
        WRITE(11,501)
501     FORMAT(' TFINL IS OUT OF RANGE FOR PROPERTY DATA ')
        IRETUR=1
        RETURN
550     CONTINUE
        FACTOR=(TFINL-TPROPW(I))/(TPROPW(I+1)-TPROPW(I))
        KFINL=FACTOR*(KWW(I+1)-KWW(I))+KWW(I)
C CAP (SOLID SUBSTRATE MATERIAL)
        NPROP=NPROPW-1
        DO 600 I=1,NPROP,1
            IF((TTBL.GE.TPROPW(I)).AND.(TTBL.LT.TPROPW(I+1)))GO TO 650
600     CONTINUE
        WRITE(11,601)
601     FORMAT(' TTBL IS OUT OF RANGE FOR PROPERTY DATA')
        IRETUR=1
        RETURN
650     CONTINUE
        FACTOR=(TTBL-TPROPW(I))/(TPROPW(I+1)-TPROPW(I))
        KTBL=FACTOR*(KWW(I+1)-KWW(I))+KWW(I)
C**********
C VISCOSITY VALUE OBTAINED AT THE MIXED-MEAN COOLANT
C TEMPERATURE (BETWEEN THE CHANNEL ENTRANCE AND EXIT)
```

```
C**********
      NPROP=NPROPF-1
      DO 700 I=1,NPROP
         IF((TFLLAV.GE.TPROPF(I)).AND.(TFLLAV.LT.TPROPF(I+1)))
     &   GO TO 750
700   CONTINUE
      WRITE(11,701)
701   FORMAT(' TFLLAV IS OUT OF RANGE OF PROPERTY DATA ')
      IRETUR=1
      RETURN
750   CONTINUE
      FACTOR=(TFLLAV-TPROPF(I))/(TPROPF(I+1)-TPROPF(I))
      MUFLLA=FACTOR*(MUFF(I+1)-MUFF(I))+MUFF(I)
C**********
C VISCOSITY VALUE OBTAINED AT THE MIXED-MEAN COOLANT
C TEMPERATURE (BETWEEN THE CHANNEL ENTRANCE AND CHANNEL POSITION X)
C**********
      NPROP=NPROPF-1
      DO 800 I=1,NPROP
         IF((TFLXAV.GE.TPROPF(I)).AND.(TFLXAV.LT.TPROPF(I+1)))
     &   GO TO 850
800   CONTINUE
      WRITE(11,801)
801   FORMAT(' TFLXAV IS OUT OF RANGE OF PROPERTY DATA ')
      IRETUR=1
      RETURN
850   CONTINUE
      FACTOR=(TFLXAV-TPROPF(I))/(TPROPF(I+1)-TPROPF(I))
      MUFLXA=FACTOR*(MUFF(I+1)-MUFF(I))+MUFF(I)
C**********
C VISCOSITY VALUE OBTAINED AT THE AVERAGE FIN
C TEMPERATURE (BETWEEN THE CHANNEL ENTRANCE AND EXIT)
C**********
      NPROP=NPROPF-1
      DO 900 I=1,NPROP
         IF((TFILAV.GE.TPROPF(I)).AND.(TFILAV.LT.TPROPF(I+1)))
     &   GO TO 950
900   CONTINUE
      WRITE(11,901)
901   FORMAT(' TFILAV IS OUT OF RANGE OF PROPERTY DATA ')
      IRETUR=1
      RETURN
950   CONTINUE
      FACTOR=(TFILAV-TPROPF(I))/(TPROPF(I+1)-TPROPF(I))
      MUFILA=FACTOR*(MUFF(I+1)-MUFF(I))+MUFF(I)
C**********
C VISCOSITY VALUE OBTAINED AT THE AVERAGE FIN
C TEMPERATURE (BETWEEN THE CHANNEL ENTRANCE AND CHANNEL POSITION X)
C**********
      NPROP=NPROPF-1
      DO 1000 I=1,NPROP
         IF((TFIXAV.GE.TPROPF(I)).AND.(TFIXAV.LT.TPROPF(I+1)))
     &   GO TO 1050
1000  CONTINUE
      WRITE(11,1001)
1001  FORMAT(' TFIXAV IS OUT OF RANGE OF PROPERTY DATA ')
      IRETUR=1
      RETURN
1050  CONTINUE
      FACTOR=(TFIXAV-TPROPF(I))/(TPROPF(I+1)-TPROPF(I))
      MUFIXA=FACTOR*(MUFF(I+1)-MUFF(I))+MUFF(I)
      RETURN
      END
C END OF FILE FOR SUBROUTINE PROP
C----------------------------------------------------------------
C RESIST:  WRITTEN BY RICHARD J. PHILLIPS.  RESIST COMPUTES THE THERMAL-
C          HYDRAULIC PERFORMANCE.
C----------------------------------------------------------------
C NAME           DESCRIPTION                                UNITS
C ACBYAP ... RATIO OF FREE-FLOW TO FRONTAL CROSS-SECTIONAL
C                AREAS                                       (-)
C ASPEC  ... CHANNEL ASPECT RATIO FOR SMOOTH-CHANNEL
C                F AND NU CALCULATIONS                       (-)
C ASPECT ... CHANNEL ASPECT RATIO(FIN LENGTH/CHANNEL WIDTH)(-)
```

```
C ASPINV  ... INVERSE OF THE CHANNEL ASPECT RATIO              (-)
C CPFF    ... COOLANT SPECIFIC HEAT DATA                       (J/KG DEG K)
C CPFLUL  ... COOLANT SPECIFIC HEAT AT CHANNEL EXIT            (J/KG DEG K)
C CPFLUX  ... COOLANT SPECIFIC HEAT AT POSITION X              (J/KG DEG K)
C DE      ... HYDRAULIC DIAMETER                               (M)
C DELP    ... PRESSURE DROP                                    (N/M*2)
C DLE     ... LAMINAR EQUIVALENT DIAMETER                      (M)
C DTPUML  ... VISCOUS HEATING TEMPERATURE RISE AT CHANNEL
C                 EXIT                                         (DEG K)
C DTPUMX  ... VISCOUS HEATING TEMPERATURE RISE AT POSITION X   (DEG K)
C DUMPHI  ... FRICTION FACTOR CORRECTION FOR CHANNEL SHAPE     (-)
C EBYDE   ... RATIO OF RIB HEIGHT TO HYDRAULIC DIAMETER        (-)
C EFFL    ... FIN EFFICIENCY AT CHANNEL EXIT                   (-)
C EFFX    ... FIN EFFICIENCY AT CHANNEL POSITION X             (-)
C F1,F2   ... ONE-SIDE AND TWO-SIDE REPEATED-RIB ROUGHENED
C                 FRICTION FACTORS                             (-)
C FACT    ... VARIABLE PROPERTIES COMPENSATION FACTOR          (-)
C FACTX   ... THERMAL SPREADING FACTOR IN X-DIRECTION          (-)
C FACTY   ... THERMAL SPREADING FACTOR IN Y-DIRECTION          (-)
C FAPP    ... APPARENT FRICTION FACTOR                         (-)
C FINCRI  ... FIN CRITERION                                    (-)
C HL      ... HEAT TRANSFER COEFFICIENT AT CHANNEL EXIT        (W/M DEG K)
C HX      ... HEAT TRANSFER COEFFICIENT AT POSITION X          (W/M DEG K)
C ICASE   ... CASE SELECTION CONTROL VARIABLE                  (-)
C ICONS   ... COOLANT FLOW CONSTRAINT                          (-)
C ICLOSE  ... ITERATION CONTROL VARIABLE                       (-)
C IFLOW   ... FLOW REGIME INDICATOR                            (-)
C IKLOSS  ... CONTROL FOR INCLUDING K90, KC AND KE             (-)
C IRETUR  ... CONTROL VARIABLE FOR OUT OF RANGE PROP. DATA     (-)
C IX      ... CONTROL VARIABLE FOR IF X OR WC IS VARIED        (-)
C KC      ... ENTRANCE PRESSURE LOSS COEFFICIENT               (-)
C KE      ... EXIT PRESSURE LOSS COEFFICIENT                   (-)
C K90     ... NINETY DEGREE BEND PRESSURE LOSS COEFFICIENT     (-)
C KFF     ... COOLANT THERMAL CONDUCTIVITY DATA                (W/M DEG K)
C KFINL   ... AVERAGE FIN THERMAL CONDUCTIVITY AT
C                 CHANNEL EXIT                                 (W/M DEG K)
C KFINX   ... AVERAGE FIN THERMAL CONDUCTIVITY AT
C                 POSITION X                                   (W/M DEG K)
C KFLUL   ... COOLANT THERMAL CONDUCTIVITY AT
C                 CHANNEL EXIT                                 (W/M DEG K)
C KFLUX   ... COOLANT THERMAL CONDUCTIVITY AT
C                 POSITION X                                   (W/M DEG K)
C KTBL    ... AVERAGE SUBSTRATE THERMAL CONDUCTIVITY
C                 AT CHANNEL EXIT                              (W/M DEG K)
C KTBX    ... AVERAGE SUBSTRATE THERMAL CONDUCTIVITY
C                 AT POSITION X                                (W/M DEG K)
C KWW     ... SUBSTRATE THERMAL CONDUCTIVITY DATA              (W/M DEG K)
C L       ... CHANNEL LENGTH                                   (M)
C LPLUS   ... HYDRODYNAMIC ENTRY LENGTH                        (-)
C ML      ... FIN ANALYSIS PARAMETER AT CHANNEL EXIT           (1/M)
C MX      ... FIN ANALYSIS PARAMETER AT POSITION X             (1/M)
C MUFF    ... COOLANT DYNAMIC VISCOSITY DATA                   (KG/M S)
C MUFILA  ... AVERAGE COOLANT DYNAMIC VISCOSITY AT THE
C                 AVERAGE FIN TEMPERATURE BETWEEN THE
C                 CHANNEL ENTRANCE AND EXIT                    (KG/M S)
C MUFIXA  ... AVERAGE COOLANT DYNAMIC VISCOSITY AT THE
C                 AVERAGE FIN TEMPERATURE BETWEEN THE
C                 CHANNEL ENTRANCE AND POSITION X              (KG/M S)
C MUFLLA  ... AVERAGE COOLANT DYNAMIC VISCOSITY AT THE
C                 AVERAGE COOLANT TEMPERATURE BETWEEN THE
C                 CHANNEL ENTRANCE AND EXIT                    (KG/M S)
C MUFLUL  ... COOLANT DYNAMIC VISCOSITY AT CHANNEL EXIT        (KG/M S)
C MUFLUX  ... COOLANT DYNAMIC VISCOSITY AT POSITION X          (KG/M S)
C MUFLXA  ... AVERAGE COOLANT DYNAMIC VISCOSITY AT THE
C                 AVERAGE COOLANT TEMPERATURE BETWEEN THE
C                 CHANNEL ENTRANCE AND POSITION X              (KG/M S)
C MZL     ... FIN EFFICIENCY VARIABLE AT CHANNEL EXIT          (-)
C MZX     ... FIN EFFICIENCY VARIABLE AT POSITION X            (-)
C NCHAN   ... NUMBER OF CHANNELS PER CENTIMETER CHIP WIDTH     (-)
C NFLUID  ... COOLANT IDENTIFIER NUMBER                        (-)
C NPARAL  ... NUMBER OF CHANNELS IN SERIES PER CENTIMETER
C                 CHIP WIDTH                                   (-)
C NPROPF  ... NUMBER OF COOLANT DATA ENTRIES                   (-)
C NPROPW  ... NUMBER OF SUBSTRATE DATA ENTRIES                 (-)
```

```
C NSINK    ... SUBSTRATE MATERIAL INDENTIFIER NUMBER              (-)
C NUL      ... NUSSELT NUMBER AT CHANNEL EXIT                     (-)
C NUX      ... NUSSELT NUMBER AT CHANNEL POSITION X               (-)
C NUTL     ... NUSSELT NUMBER AT CHANNEL EXIT INCUDING
C              EFFECT OF NONUNIFORM COOLANT TEMPERATURE           (-)
C NUTX     ... NUSSELT NUMBER AT CHANNEL POSITION X INCUDING
C              EFFECT OF NONUNIFORM COOLANT TEMPERATURE           (-)
C PBYE     ... RATIO OF RIB SEPARATION TO RIB HEIGHT              (-)
C PHI      ... REPEATED-RIB FLOW ATTACK ANGLE                     (DEGREES)
C PPOWER   ... PUMPING POWER PER UNIT CIRCUIT SURFACE AREA        (W/CM*2)
C PRFF     ... COOLANT PRANDTL NUMBER DATA                        (-)
C PRFLUL   ... COOLANT PRANDTL NUMBER AT CHANNEL EXIT             (-)
C PRFLUX   ... COOLANT PRANDTL NUMBER AT POSITION X               (-)
C Q        ... INPUT HEAT FLUX FROM THE SURFACE                   (W/CM*2)
C RBFL     ... FIN AND CHANNEL BASE TO COOLANT THERMAL
C              RESISTANCE AT CHANNEL EXIT                         (DEG K/(W/M*2))
C RBFX     ... FIN AND CHANNEL BASE TO COOLANT THERMAL
C              RESISTANCE AT POSITION X                           (DEG K/(W/M*2))
C RCL      ... CONTRACTION THERMAL RESISTANCE AT
C              CHANNEL EXIT                                       (DEG K/(W/M*2))
C RCX      ... CONTRACTION THERMAL RESISTANCE AT POSITION X(DEG K/(W/M*2))
C REL      ... REYNOLDS NUMBER AT CHANNEL EXIT                    (-)
C REX      ... REYNOLDS NUMBER AT POSITION X                      (-)
C RESTAL   ... MODIFIED REYNOLDS NUMBER AT CHANNEL EXIT           (-)
C RESTAX   ... MODIFIED REYNOLDS NUMBER AT POSITION X             (-)
C RFFL     ... COOLANT BULK TEMPERATURE RISE THERMAL
C              RESISTANCE AT CHANNEL EXIT                         (DEG K/(W/M*2))
C RFFX     ... COOLANT BULK TEMPERATURE RISE THERMAL
C              RESISTANCE AT POSITION X                           (DEG K/(W/M*2))
C RHOFF    ... COOLANT DENSITY DATA                               (KG/M*3)
C RHOFLL   ... COOLANT DENSITY AT CHANNEL EXIT                    (KG/M*3)
C RHOFLX   ... COOLANT DENSITY AT POSITION X                      (KG/M*3)
C RTBL     ... CIRCUIT SIDE OF THE SUBSTRATE TO THE FIN
C              AND CHANNEL BASE THERMAL RESISTANCE
C              AT CHANNEL EXIT                                    (DEG K/(W/M*2))
C RTBX     ... CIRCUIT SIDE OF THE SUBSTRATE TO THE FIN
C              AND CHANNEL BASE THERMAL RESISTANCE
C              AT POSITION X                                      (DEG K/(W/M*2))
C RTOTL    ... TOTAL THERMAL RESISTANCE AT CHANNEL EXIT           (DEG K/(W/M*2))
C RTOTX    ... TOTAL THERMAL RESISTANCE AT POSITION X             (DEG K/(W/M*2))
C T        ... SUBSTRATE THICKNESS                                (M)
C TBL      ... FIN BASE TEMPERATURE AT CHANNEL EXIT               (DEG K)
C TBX      ... FIN BASE TEMPERATURE AT POSITION X                 (DEG K)
C TFINL    ... AVERAGE FIN TEMPERATURE AT CHANNEL EXIT            (DEG K)
C TFINX    ... AVERAGE FIN TEMPERATURE AT POSITION X              (DEG K)
C TFILAV   ... AVERAGE FIN TEMPERATURE MIDWAY BETWEEN
C              THE CHANNEL ENTRANCE AND CHANNEL EXIT              (DEG K)
C TFIXAV   ... AVERAGE FIN TEMPERATURE MIDWAY BETWEEN
C              THE CHANNEL ENTRANCE AND POSITION X                (DEG K)
C TFLLAV   ... AVERAGE COOLANT TEMPERATURE MIDWAY BETWEEN
C              THE CHANNEL ENTRANCE AND CHANNEL EXIT              (DEG K)
C TFLUIN   ... COOLANT INLET TEMPERATURE                          (DEG K)
C TFLUL    ... COOLANT MIXED MEAN TEMPERATURE AT
C              CHANNEL EXIT                                       (DEG K)
C TFLUO    ... OUTLET COOLANT TEMPERATURE                         (DEG K)
C TFLUX    ... COOLANT MIXED MEAN TEMPERATURE AT
C              POSITION X                                         (DEG K)
C TFLXAV   ... AVERAGE COOLANT TEMPERATURE MIDWAY BETWEEN
C              THE CHANNEL ENTRANCE AND POSITION X                (DEG K)
C TPROPF   ... TEMPERATURES FOR FLUID PROPERTY DATA               (DEG K)
C TPROPW   ... TEMPERATURES FOR SUBSTRATE PROPERTY DATA           (DEG K)
C TRANS    ... TRANSITION REYNOLDS NUMBER                         (-)
C TTBL     ... AVERAGE SUBSTRATE TEMPERATURE AT
C              CHANNEL EXIT                                       (DEG K)
C TTBX     ... AVERAGE SUBSTRATE TEMPERATURE AT
C              POSITION X                                         (DEG K)
C TTIPX    ... FIN TIP TEMPERATURE AT POSITION X                  (DEG K)
C TTL      ... TOP SURFACE (CIRCUIT SIDE) TEMPERATURE
C              AT CHANNEL EXIT                                    (DEG K)
C TTX      ... TOP SURFACE (CIRCUIT SIDE) TEMPERATURE
C              AT POSITION X                                      (DEG K)
C VOLUME   ... COOLANT FLOW RATE PER CHANNEL                      ((M*3/S)/CM*2)
C V1CL     ... COOLANT FLOW VELOCITY AT CHANNEL EXIT              (M/S)
C V1CX     ... COOLANT FLOW VELOCITY AT POSITION X                (M/S)
C W        ... WIDTH OF HEATER TRANSVERSE TO FLOW DIRECTION       (M)
```

```
C WC      ... CHANNEL WIDTH                                    (M)
C WW      ... FIN WIDTH                                        (M)
C WWBYWC  ... RATIO OF FIN WIDTH TO THE CHANNEL WIDTH          (-)
C X       ... POSITION FROM CHANNEL ENTRANCE                   (M)
C XSTARL  ... THERMAL ENTRY LENGTH AT CHANNEL EXIT             (-)
C XSTARX  ... THERMAL ENTRY LENGTH AT POSITION X               (-)
C Y       ... DISTANCE FROM ONE TRANSVERSE SIDE OF HEATER      (M)
C Z       ... FIN HEIGHT                                       (M)
C ZI      ... REPEATED-RIB SHAPE ANGLE                         (DEGREES)
C-----------------------------------------------------------------------
      SUBROUTINE RESIST(NCURVE,ICASE,IFLOW,IX,
     & Q,WC,WW,X,L,T,ASPECT,ASPINV,Z,DE,DLE,ACBYAP,
     & IKLOSS,ICONS,DELP,VOLUME,PPOWER,
     & EBYDE,PBYE,PHI,ZI,
     & TFLUIN,NPROPF,TPROPF,CPFF,KFF,MUFF,PRFF,RHOFF,
     & NPROPW,TPROPW,KWW,
     & IRETUR,TTX,TBX,TTIPX,TFLUO,DTPUML,DTPUMX,
     & TFINL,TFLUL,TTBL,TFINX,TFLUX,TTBX,TFLLAV,TFLXAV,TFILAV,TFIXAV,
     & CPFLUL,KFLUL,MUFLUL,PRFLUL,RHOFLL,MUFLLA,MUFILA,KFINL,KTBL,
     & CPFLUX,KFLUX,MUFLUX,PRFLUX,RHOFLX,MUFLXA,MUFIXA,KFINX,KTBX,
     & NUX,NUTX,V1CX,K90,KC,KE,FAPP,FINCRI,EFFX,
     & TRANS,REX,RESTAX,XSTARX,LPLUS,
     & RTBX,RCX,RBFX,RFFX,RTOTX)
C INITIALIZE VARIABLE ARRAYS
      DIMENSION TTX(2),TBX(2),TTIPX(2),TFLUO(2),
     &          TPROPF(20),CPFF(20),KFF(20),MUFF(20),PRFF(20),RHOFF(20),
     &          TPROPW(20),KWW(20)
      REAL L,K90,KC,KE,KWW,KFF,MUFF,NUL,NUX,NUTL,NUTX,ML,MX,MZL,MZX,
     &     LPLUS,NCHAN,NPARAL,
     &     KFINL,KFLUL,KTBL,KFINX,KFLUX,KTBX,
     &     MUFLUL,MUFLUX,MUFLLA,MUFLXA,MUFILA,MUFIXA
C INITIALIZE TEMPERATURES TO EQUAL INLET COOLANT TEMP. - FIRST ITERATION
      DO 15 I=1,2,1
        TTX(I)=TFLUIN
        TBX(I)=TFLUIN
        TTIPX(I)=TFLUIN
        TFLUO(I)=TFLUIN
15    CONTINUE
      TFLUX=TFLUIN
      TFINX=TFLUIN
      TTBX=TFLUIN
      TFLUL=TFLUIN
      TFINL=TFLUIN
      TTBL=TFLUIN
      TFLLAV=TFLUIN
      TFILAV=TFLUIN
      TFLXAV=TFLUIN
      TFIXAV=TFLUIN
      IITER=0
100   CONTINUE
      IITER=IITER+1
C DETERMINE COOLANT AND SUBSTRATE PROPERTIES
      CALL PROP(NPROPF,TPROPF,CPFF,KFF,MUFF,PRFF,RHOFF,
     &          NPROPW,TPROPW,KWW,
     &          TFLUX,CPFLUX,KFLUX,MUFLUX,PRFLUX,RHOFLX,
     &          TFINX,KFINX,TTBX,KTBX,
     &          TFLUL,CPFLUL,KFLUL,MUFLUL,PRFLUL,RHOFLL,
     &          TFINL,KFINL,TTBL,KTBL,
     &          TFLLAV,MUFLLA,TFLXAV,MUFLXA,
     &          TFILAV,MUFILA,TFIXAV,MUFIXA,IRETUR)
      IF(IRETUR.EQ.1)RETURN
C
C COMPUTE FRICTION FACTOR AND COOLANT VELOCITY
C
C
C     IF THE CHANNEL ASPECT RATIO IS LESS THAN 1.0, FAKE OUT THE
C     SMOOTH SURFACE F AND NU CALCULATION ROUTINES BY USING ASPINV
C     AS THE CHANNEL ASPECT RATIO.
C
      IF(ASPECT.GE.1.0)ASPEC=ASPECT
      IF(ASPECT.LT.1.0)ASPEC=ASPINV
C
      IF(ICASE.EQ.1)
     &CALL SFFD(IFLOW,WW,WC,Z,L,X,DE,ASPEC,ACBYAP,
     &          RHOFLL,RHOFLX,MUFLUL,MUFLUX,MUFLLA,MUFILA,
```

```
     &            PRFLUL,PRFLUX,IKLOSS,ICONS,DELP,VOLUME,PPOWER,
     &            REL,REX,V1CL,V1CX,LPLUS,FAPP,XSTARL,XSTARX)
      IF((ICASE.EQ.2).AND.(IFLOW.EQ.1))
     &CALL SLAMF(IFLOW,WW,WC,Z,L,X,DE,ASPEC,ACBYAP,
     &           RHOFLL,RHOFLX,MUFLUL,MUFLUX,MUFLLA,MUFILA,
     &           PRFLUL,PRFLUX,IKLOSS,ICONS,DELP,VOLUME,PPOWER,
     &           REL,REX,V1CL,V1CX,LPLUS,FAPP,XSTARL,XSTARX)
      IF((ICASE.EQ.2).AND.(IFLOW.EQ.2))
     &CALL STURF(IFLOW,WW,WC,Z,L,X,DE,DLE,ASPEC,ACBYAP,
     &           RHOFLL,RHOFLX,MUFLUL,MUFLUX,MUFLLA,MUFILA,
     &           PRFLUL,PRFLUX,IKLOSS,ICONS,DELP,VOLUME,PPOWER,
     &           REL,REX,RESTAL,RESTAX,V1CL,V1CX,LPLUS,FAPP,
     &           XSTARL,XSTARX)
      IF(ICASE.EQ.3)
     &CALL RTURF(IFLOW,WW,WC,Z,L,X,DE,DLE,ASPECT,ACBYAP,
     &           RHOFLL,RHOFLX,MUFLUL,MUFLUX,MUFLLA,MUFILA,
     &           PRFLUL,PRFLUX,IKLOSS,ICONS,DELP,VOLUME,PPOWER,
     &           REL,REX,V1CL,V1CX,RESTAL,RESTAX,LPLUS,F1,F2,FAPP,
     &           XSTARL,XSTARX,IRETUR,EBYDE,PBYE,ZI,PHI)
      IF(IRETUR.EQ.1)RETURN
C
C COMPUTE TRANSITION REYNOLDS NUMBER - SEE TABLE 2.1
C
      IF(ASPECT.LE.0.2)TRANS=2500.
      IF((ASPECT.GT.0.2).AND.(ASPECT.LT.1.0))
     &                TRANS=((ASPECT-0.2)/(1.0-0.2))*(2200.-2500.)+2500.
      IF((ASPECT.GT.1.0).AND.(ASPECT.LT.5.0))
     &                TRANS=((ASPECT-1.0)/(5.0-1.0))*(2500.-2200.)+2200.
      IF(ASPECT.GE.5.0)TRANS=2500.
C
C COMPUTE NUSSELT NUMBER
C
      IF(ICASE.EQ.1)
     &CALL SNUFD(ASPEC,NUL,NUX,NUTL,NUTX,
     &           MUFILA,MUFIXA,MUFLLA,MUFLXA,IRETUR)
      IF((ICASE.EQ.2).AND.(IFLOW.EQ.1))
     &CALL SLAMNU(ASPEC,MUFLLA,MUFILA,XSTARL,NUL,NUTL,
     &            MUFLXA,MUFIXA,XSTARX,NUX,NUTX)
      IF((ICASE.EQ.2).AND.(IFLOW.EQ.2))
     &CALL STURNU(MUFLLA,MUFILA,PRFLUL,REL,NUL,NUTL,
     &            MUFLXA,MUFIXA,PRFLUX,REX,NUX,NUTX,DE,L,X)
      IF(ICASE.EQ.3)
     &CALL RTURNU(ASPECT,EBYDE,ZI,MUFLLA,MUFILA,PRFLUL,REL,F2,
     &            NUL,NUTL,NUX,NUTX)
C
C COMPUTE HEAT TRANSFER COEFFICIENT
      HL=NUTL*KFLUL/DE
      HX=NUTX*KFLUX/DE
      IF(ASPECT.LT.0.1)GO TO 1010
C COMPUTE FIN CRITERION - EQN. 3.7
      FINCRI=2.*KFINX/(HX*WW)
      IF(FINCRI.LE.6.0)RETURN
C COMPUTE FIN EFFICIENCY - SEE EQN. 3.13
      ML=SQRT((HL*2.)/(KFINL*WW))
      MX=SQRT((HX*2.)/(KFINX*WW))
      MZL=ML*Z
      MZX=MX*Z
      EFFL=(TANH(MZL))/(MZL)
      EFFX=(TANH(MZX))/(MZX)
1010  CONTINUE
C COMPUTE THERMAL RESISTANCES
C     IF(ICASE.EQ.1)GO TO 1100
      IF(ASPECT.GE.10.)GO TO 1100
      IF((ASPECT.GE.0.1).AND.(ASPECT.LT.10.))GO TO 1200
      IF(ASPECT.LE.0.1)GO TO 1300
1100  CONTINUE
C     LARGE ASPECT RATIO CHANNELS EQN. 4.11
      RTBL=T/KTBL
      RCL=(WW+WC)/(3.14159*KTBL)*
     &   ALOG(1./SIN(3.14159*(WW/2.)/(WW+WC)))
      RBFL=(WW+WC)/(2.*HL*Z*EFFL)
      RFFL=(L*(WW+WC))/(RHOFLL*CPFLUL*Z*WC*V1CL)
      RTOTL=RTBL+RCL+RBFL+RFFL
C
```

```
      RTBX=T/KTBX
      RCX=(WW+WC)/(3.14159*KTBX)*
     1    ALOG(1./SIN(3.14159*(WW/2.)/(WW+WC)))
      RBFX=(WW+WC)/(2.*HX*Z*EFFX)
      RFFX=(X*(WW+WC))/(RHOFLX*CPFLUX*WC*Z*V1CX)
      RTOTX=RTBX+RCX+RBFX+RFFX
      GO TO 1400
1200  CONTINUE
C     MODERATE ASPECT RATIO CHANNELS - EQN. 4.12
      RTBL=T/KTBL
      RCL=(WW+WC)/(3.14159*KTBL)*
     1    ALOG(1./SIN(3.14159*(WW/2.)/(WW+WC)))
      RBFL=(WW+WC)/((HL*WC)+(2.*HL*Z*EFFL))
      RFFL=(L*(WW+WC))/(RHOFLL*CPFLUL*WC*Z*V1CL)
      RTOTL=RTBL+RCL+RBFL+RFFL
C
      RTBX=T/KTBX
      RCX=(WW+WC)/(3.14159*KTBX)*
     1    ALOG(1./SIN(3.14159*(WW/2.)/(WW+WC)))
      RBFX=(WW+WC)/((HX*WC)+(2.*HX*Z*EFFX))
      RFFX=(X*(WW+WC))/(RHOFLX*CPFLUX*WC*Z*V1CX)
C DIVIDE BY TUCKERMANS CONVERSION FOR NON-UNIFORM HEAT TRANSFER COEFF.
C     RFFX=RFFX/EFFX
      RTOTX=RTBX+RCX+RBFX+RFFX
      GO TO 1400
1300  CONTINUE
C     SMALL ASPECT RATIO CHANNELS - EQN. 4.13
      RTBL=T/KTBL
      RCL=0.
      RBFL=1./HL
      RFFL=L/(RHOFLL*CPFLUL*Z*V1CL)
      RTOTL=RTBL+RCL+RBFL+RFFL
C
      RTBX=T/KTBX
      RCX=0.
      RBFX=1./HX
      RFFX=X/(RHOFLX*CPFLUX*Z*V1CX)
      RTOTX=RTBX+RCX+RBFX+RFFX
1400  CONTINUE
C
C SEE IF THERMAL SPREADING IS TO BE INCLUDED
      IF(IX.EQ.1)GO TO 1450
C
C NOTE THAT THERMAL SPREADING CALCS. ARE VALID FOR CONSTANT PROPERTIES.
C AND CONSTANT H, BUT THEY ARE DONE AT EACH INDIVIDUAL CHANNEL LOCATION
C BASED ON THE LOCAL VALUES AND NOT THE AVERAGE VALUES.  THE USER MAY
C FIND IT PREFERABLE TO RUN THE PROGRAM ONCE, COMPUTE AN AVERAGE
C NUSSELT NUMBER ALONG THE CHANNEL (USE DATA FROM FILE MICROHEX.OUTPUT2)
C AND TO USE THIS AVERAGE VALUE FOR ALL THERMAL SPREADING CALCULATIONS.
C NOTE THAT ONLY 0.5 TIMES THE BRACKETED TERMS OF EQN.S 3.19 AND 3.20
C ARE USED TO COMPUTE THE DIMENSIONLESS TEMPERATURE CHANGE.  SINCE
C THE THERMAL SPREADING DIFFUSION LENGTH GETS SMALLER WITH INCREASING
C NUSSELT NUMBER, THE 'APPARENT' THERMAL RESISTANCE GOES UP!  THIS IS
C BECAUSE THE OTHER TERMS IN EQN.S 3.19 AND 3.20 WERE NOT USED.
C
C NOTE ALSO THAT THE PROPERTIES AND TEMPERATURES AT THE CHANNEL EXIT
C LISTED IN MICROHEX.OUTPUT4 DO NOT ACCOUNT FOR THERMAL SPREADING,
C  BUT THE LOCAL VALUES DO
      FACTX=1.
      FACTY=1.
C THERMAL SPREADING FOR CALCULATIONS TRANSVERSE TO THE CHANNEL LENGTH
C     HEFF=T+(WW*Z/(WW+WC))
      HEFF=T
      DLT=SQRT((DE*KTBX*HEFF*(WW+WC))/(NUX*KFLUX*(WC+Z+Z)))
C   - FINITE WIDTH OF COOLING PERIPHERY (NOT DISCUSSED IN TEXT OF THESIS)
C     WCOMP=1.0000
C     WRES=0.0025
C     YRES=0.00125
C     TML1=TANH(WRES/DLT)
C     TML2=TANH(WCOMP/DLT)
C     C4=(1./TML2)*(1./(1.+(TML1/TML2)))
C     FACTY=(1.+C4*(SINH(YRES/DLT)-(TML1*COSH(YRES/DLT))))
C    1     *(1.+C4*(SINH(YRES/DLT)-(TML1*COSH(YRES/DLT))))
C   - INFINITE WIDTH OF THE COOLING PERIPHERY
C
```

```
C     THE NEXT TWO VARIABLES SHOULD HAVE BEEN INCLUDED IN THE MICROHEX
C     DATA STATEMENTS, W IS THE TRANSVERSE HEATER WIDTH, AND Y IS THE
C     TRANSVERSE DISTANCE FROM THE HEATER EDGE FOR THE CALCULATION.
      W=0.010
      Y=0.005
      FACTY=(1.-(0.5/EXP(Y/DLT)))*(1.-(0.5/EXP((W-Y)/DLT)))
C THERMAL SPREADING FOR CALCULATIONS ALONG THE CHANNEL LENGTH
      HEFF=T+(WW*Z/(WW+WC))
      DLS=SQRT((DE*KTBX*HEFF*(WW+WC))/(NUX*KFLUX*(WC+Z+Z)))
C   - FINITE WIDTH OF COOLING PERIPHERY (NOT DISCUSSED IN THESIS)
C     WCOMP=1.0000
C     WRES=L
C     XRES=X
C     TML1=TANH(WRES/DLS)
C     TML2=TANH(WCOMP/DLS)
C     C4=(1./TML2)*(1./(1.+(TML1/TML2)))
C     FACTX=(1.+C4*(SINH(XRES/DLS)-(TML1*COSH(XRES/DLS))))
C    *         *(1.+C4*(SINH((L-XRES)/DLS)-(TML1*COSH((L-XRES)/DLS))))
C   - INFINITE WIDTH OF THE COOLING PERIPHERY
      FACTX=(1.-(0.5/EXP(X/DLS)))*(1.-(0.5/EXP((L-X)/DLS)))
C CHANGE THE THERMAL RESISTANCE VALUES TO ACCOUNT FOR THERMAL SPREADING
      RTBX=FACTX*FACTY*RTBX
      RCX=FACTX*FACTY*RCX
      RBFX=FACTX*FACTY*RBFX
      RFFX=RFFX
      RTOTX=RTBX+RBFX+RCX+RFFX
1450  CONTINUE
C
C VISCOUS HEATING COOLANT TEMPERATURE RISE
C     DETERMINE ENTRANCE AND EXIT PRESSURE LOSS COEFFICIENTS
      IF(ICASE.EQ.1)
     *CALL ABRUPT(ACBYAP,ASPECT,IFLOW,IKLOSS,KC,KE,K90,9999.)
      IF(ICASE.NE.1)
     *CALL ABRUPT(ACBYAP,ASPECT,IFLOW,IKLOSS,KC,KE,K90,LPLUS)
      IF(IFLOW.EQ.1)FACT=(MUFILA/MUFLLA)**0.58
      IF(IFLOW.EQ.2)FACT=(MUFILA/MUFLLA)**0.25
      DELPL=(RHOFLL*V1CL*V1CL/2.)*((ACBYAP*ACBYAP*1.*K90)+
     *                             (KC+KE)+(4.*FAPP*FACT*L/DE))
C COMPUTE TEMPERATURE RISE - EQN. 2.22
      DTPUML=DELPL/(RHOFLL*CPFLUL)
      IF(IFLOW.EQ.1)FACT=(MUFIXA/MUFLXA)**0.58
      IF(IFLOW.EQ.2)FACT=(MUFIXA/MUFLXA)**0.25
      DELPX=(RHOFLX*V1CX*V1CX/2.)*((ACBYAP*ACBYAP*1.*K90)+
     *                             (KC+KE)+(4.*FAPP*FACT*X/DE))
C COMPUTE TEMPERATURE RISE - EQN. 2.22
      DTPUMX=DELPX/(RHOFLX*CPFLUX).
C COMPUTE NEW TEMPERATURES
      CALL TEMPS(TTX,TBX,TTIPX,TFLUIN,TFLUO,
     *           TFLUL,TFLUX,TFINL,TFINX,TTBL,TTBX,
     *           TFLLAV,TFLXAV,TFILAV,TFIXAV,
     *           RTBL,RBFL,RFFL,RTOTL,RTBX,RBFX,RFFX,RTOTX,
     *           Q,DTPUML,DTPUMX,HZL,EFFL,HZX,EFFX,ICLOSE)
C CHECK IF ANOTHER ITERATION IS NEEDED
      IF(ICLOSE.EQ.1)GO TO 100
C CHECK IF REYNOLDS NUMBER IS OUT OF RANGE
      IF(ICASE.EQ.1)IRETUR=0
      IF((IFLOW.EQ.1).AND.(REX.GT.TRANS))IRETUR=1
      IF((IFLOW.EQ.2).AND.(REX.LE.TRANS))IRETUR=1
      IF((IFLOW.EQ.3).AND.((REX.LT.3000.).OR.(REX.GT.10000.)))IRETUR=1
C CHECK IF THERMAL ENTRY LENGTH IS OUT OF RANGE
C     IF((REX.LT.TRANS).AND.(XSTARX.LT.0.0025))IRETUR=1
C     IF((REX.GT.TRANS).AND.(XSTARX.LT.0.001))IRETUR=1
C CHECK IF FIN CRITERION IS NOT SATISFIED
      IF((ASPECT.GT.0.1).AND.(FINCRI.LE.6.0))IRETUR=1
      RETURN
      END
C END OF FILE FOR SUBROUTINE RESIST
C--------------------------------------------------------------------
      FILE: MHEX     EXEC

FILEDEF 11 DISK MICROHEX OUTPUT1 (RECFM FB LRECL 132 BLOCK 1320
   FILEDEF 13 DISK MICROHEX OUTPUT2 (RECFM FB LRECL 132 BLOCK 1320
   FILEDEF 15 DISK MICROHEX OUTPUT3 (RECFM FB LRECL 132 BLOCK 1320
```

```
FILEDEF 17 DISK MICROHEX OUTPUT4 (RECFM FB LRECL 132 BLOCK 1320
FILEDEF 20 DISK DISSPLA MESSAG D(RECFM FB LRECL 132 BLOCK 1320
EXEC DISSPLA MICROHEX
* THE LINE ABOVE CAN BE REPLACED WITH 'RUN MICROHEX' IF THE
* DISSPLA GRAPHICS PACKAGE IS NOT USED (FILDEF 20 ... WILL NOT BE
* NEEDED IF DISSPLA IS NOT USED).
```

We claim:

1. A method of using a microchannel heat sink to cool a high power device such as an integrated circuit, said method comprising the steps of:
    forcing a fluid into an input port of said microchannel heat sink;
    passing said fluid through a plurality of channels in said microchannel heat sink to create a turbulent flow through said channels, said channels having a width between 125 and 300 micrometers, and being in thermal contact with said high power device to thereby transfer heat from said high power device to said fluid; and
    discharging said fluid from said microchannel heat sink to thereby dissipate said heat.

2. The method of claim 1 wherein said turbulent flow is fully developed.

3. The method of claim 1 wherein said turbulent flow is developing.

4. The method of claim 1 wherein said liquid is water.

5. The method of claim 1 wherein said heat sink is formed from indium phosphide.

6. A method of using a microchannel heat sink to cool a high power device such as an integrated circuit, said method comprising the steps of:
    forcing a fluid into an input port of said microchannel heat sink;
    passing said fluid through a plurality of channels in said microchannel heat sink to create a developing laminar flow through said channels, said channels having a width between 125 and 300 micrometers, and being in thermal contact with said high power device to thereby transfer heat from said high power device to said fluid; and
    discharging said fluid from said microchannel heat sink to thereby dissipate said heat.

7. The method of claim 6 wherein said liquid is water.

8. The method of claim 6 wherein said heat sink is formed from indium phosphide.

9. The method of claim 1 wherein said channels are substantially parallel channels.

10. The method of claim 6 wherein said channels are substantially parallel channels.

* * * * *